(12) United States Patent
Kim et al.

(10) Patent No.: US 11,803,278 B2
(45) Date of Patent: Oct. 31, 2023

(54) DISPLAY DEVICE HAVING ELECTRODES HAVING SENSOR AND AUXILIARY SENSOR PARTS

(71) Applicant: Samsung Display Co., Ltd., Yongin-Si (KR)

(72) Inventors: Hwa-Jeong Kim, Hwaseong-si (KR); Nayun Kwak, Cheonan-si (KR); Sanghyun Jun, Suwon-si (KR); Changyong Jung, Seoul (KR)

(73) Assignee: Samsung Display Co., Ltd., Yongin-Si (KR)

( * ) Notice: Subject to any disclaimer, the term of this patent is extended or adjusted under 35 U.S.C. 154(b) by 0 days.

(21) Appl. No.: 17/963,786

(22) Filed: Oct. 11, 2022

(65) Prior Publication Data

US 2023/0031525 A1    Feb. 2, 2023

Related U.S. Application Data

(60) Continuation of application No. 17/313,048, filed on May 6, 2021, now Pat. No. 11,487,392, which is a
(Continued)

(30) Foreign Application Priority Data

Nov. 10, 2016 (KR) .......................... 10-2016-0149800
Dec. 23, 2016 (KR) .......................... 10-2016-0178116

(51) Int. Cl.
*G06F 3/041* (2006.01)
*H01L 27/32* (2006.01)
(Continued)

(52) U.S. Cl.
CPC .......... *G06F 3/0443* (2019.05); *G06F 3/0412* (2013.01); *G06F 3/0418* (2013.01);
(Continued)

(58) Field of Classification Search
CPC ...... G06F 3/0418; G06F 3/0412; G06F 3/044; G06F 2203/04107; G06F 2203/04111;
(Continued)

(56) References Cited

U.S. PATENT DOCUMENTS 7,936,121 B2    5/2011   Kim
9,122,358 B2    9/2015   Liu
(Continued)

FOREIGN PATENT DOCUMENTS

CN    103941903 A    7/2014
CN    104978080 A    10/2015
(Continued)

*Primary Examiner* — Stephen G Sherman
(74) *Attorney, Agent, or Firm* — Innovation Counsel LLP

(57) ABSTRACT

Provided is a display device including a display panel and an input sensing unit. The input sensing unit includes at least one insulation layer, an electrode, and an auxiliary electrode. The electrode includes sensor parts including a metal and having a mesh shape and connection parts connecting adjacent sensor parts of the sensor parts to each other. The auxiliary electrode overlaps the sensor parts, is connected to the sensor parts, and includes transparent conductive oxide.

16 Claims, 51 Drawing Sheets

Related U.S. Application Data continuation of application No. 16/595,115, filed on Oct. 7, 2019, now Pat. No. 11,003,292, which is a division of application No. 15/804,758, filed on Nov. 6, 2017, now Pat. No. 10,474,295.

(51) Int. Cl.
  *G06F 3/044* (2006.01)
  *H10K 59/40* (2023.01)
  *H10K 59/12* (2023.01)

(52) U.S. Cl.
  CPC ........... *G06F 3/0446* (2019.05); *H10K 59/40* (2023.02); *G06F 3/04164* (2019.05); *G06F 2203/04107* (2013.01); *G06F 2203/04111* (2013.01); *G06F 2203/04112* (2013.01); *H10K 59/12* (2023.02)

(58) Field of Classification Search
  CPC ... G06F 2203/04112; G06F 3/041–047; H01L 27/323; H01L 27/3244
  See application file for complete search history.

(56) References Cited

U.S. PATENT DOCUMENTS

| | | | |
|---|---|---|---|
| 9,189,112 B2 | 11/2015 | Imamura et al. | |
| 9,239,654 B2 | 1/2016 | Jang | |
| 9,292,118 B2 | 3/2016 | Lee et al. | |
| 9,323,400 B2 | 4/2016 | Kim et al. | |
| 9,367,162 B2 | 6/2016 | Lee | |
| 9,423,899 B2 | 8/2016 | Park et al. | |
| 9,798,426 B2 | 10/2017 | Kim et al. | |
| 10,474,295 B2 | 11/2019 | Kim et al. | |
| 11,487,392 B2 * | 11/2022 | Kim | H10K 59/40 |
| 2009/0207150 A1 | 8/2009 | Obi et al. | |
| 2010/0220071 A1 | 9/2010 | Nishihara et al. | |
| 2011/0032193 A1 | 2/2011 | Szalkowski | |
| 2011/0090175 A1 | 4/2011 | Mamba et al. | |
| 2011/0216033 A1 | 9/2011 | Mamba et al. | |
| 2011/0256307 A1 | 10/2011 | Kim et al. | |
| 2014/0016044 A1 | 1/2014 | Tung et al. | |
| 2014/0028626 A1 | 1/2014 | Maeda et al. | |
| 2015/0054803 A1 | 2/2015 | Yashiro et al. | |
| 2015/0185903 A1 | 7/2015 | Park | |
| 2015/0287752 A1 | 10/2015 | Yeo et al. | |
| 2016/0274699 A1 | 9/2016 | Shishido et al. | |
| 2018/0018034 A1 | 1/2018 | Choi et al. | |

FOREIGN PATENT DOCUMENTS

| | | |
|---|---|---|
| JP | 5954427 B2 | 7/2016 |
| KR | 1020080039121 A | 5/2008 |
| KR | 1020110120121 A | 11/2011 |
| KR | 1020130118072 A | 10/2013 |
| KR | 10-20150080332 A | 7/2015 |
| KR | 1020160031294 A | 3/2016 |
| WO | 2014065001 A1 | 5/2014 |

* cited by examiner

DISPLAY DEVICE HAVING ELECTRODES HAVING SENSOR AND AUXILIARY SENSOR PARTS

CROSS-REFERENCE TO RELATED APPLICATIONS

This application is a continuation application of U.S. patent application Ser. No. 17/313,048 filed on May 6, 2021, which is a continuation application of U.S. patent application Ser. No. 16/595,115 filed on Oct. 7, 2019 (now U.S. Pat. No. 11,003,292), which is a divisional application of U.S. patent application Ser. No. 15/804,758 filed on Nov. 6, 2017 (now U.S. Pat. No. 10,474,295), which claims priority under 35 USC § 119 to Korean Patent Application Nos. 10-2016-0149800 filed on Nov. 10, 2016, and 10-2016-0178116 filed on Dec. 23, 2016, the entire contents of which are hereby incorporated by reference.

BACKGROUND

The present disclosure herein relates to a display device, and more particularly, to a display device in which at least a portion of an input sensing unit is directly disposed on a display panel.

Various display devices used in multimedia devices such as televisions, mobile phones, table computers, navigation devices, and game consoles are being developed. Such a display device includes a keyboard or a mouse as an input unit. Also, in recent years, such a display device includes a touch panel as an input unit.

SUMMARY

The present disclosure provides an input sensing unit-integrated display device having improved sensitivity.

An embodiment of the inventive concept provides a display device including a display panel configured to provide a base surface and an input sensing unit directly disposed on the base surface. The input sensing unit includes at least one insulation layer, a first electrode, and a second electrode.

The first electrode includes first sensor parts having a metal and a mesh shape, first connection parts configured to connect first sensor parts, which are adjacent to each other, of the first sensor parts, and first auxiliary sensor parts connected to the first sensor parts and including a transparent conductive oxide.

The second electrode includes second sensor parts having a metal and a mesh shape, second connection parts configured to connect second sensor parts, which are adjacent to each other, of the second sensor parts and crossing the first connection parts with the insulation layer therebetween, and second auxiliary sensor parts connected to the second sensor parts and including a transparent conductive oxide.

In an embodiment, the display panel may include a plurality of emission areas spaced apart from each other and a non-emission area disposed between the plurality of emission areas. The first sensor parts may overlap the non-emission area and include a plurality of mesh holes corresponding to the plurality of emission areas, and the first auxiliary sensor parts may overlap the plurality of emission areas and the non-emission area.

In an embodiment, a first sensor part of the first sensor parts and a first auxiliary sensor part of the first auxiliary sensor parts, which correspond to each other, overlap each other with the insulation layer therebetween, and the first sensor part of the first sensor parts and the first auxiliary sensor part of the first auxiliary sensor parts, which correspond to each other, may be connected to each other through a first contact hole passing through the insulation layer.

In an embodiment, the first connection parts may be disposed on one side of the insulation layer, and the first sensor parts, the second sensor parts, and the second connection parts may be disposed on an other side of the insulation layer.

In an embodiment, a first sensor part of the first sensor parts and a second connection part of the second connection parts, which correspond to each other, may be connected to each other through a second contact hole passing through the insulation layer. The second sensor parts and the second connection parts may have an integrated shape.

In an embodiment, the first connection parts may be disposed more adjacent to the display panel than the first sensor parts, the second sensor parts, and the second connection parts.

In an embodiment, the first auxiliary sensor parts may be disposed on a same layer as the first connection parts.

In an embodiment, the first connection parts may contact the first auxiliary sensor parts.

In an embodiment, the first electrode may further include auxiliary connection parts configured to connect first auxiliary sensor parts, which are adjacent to each other, of the first auxiliary sensor parts. The first connection parts may overlap the auxiliary connection parts.

In an embodiment, the display device may further include a signal line connected to the first electrode. The signal line may include at least one of a first line part connected to a first auxiliary sensor part of the first auxiliary sensor parts and a second line part connected to a first sensor part of the first sensor parts.

In an embodiment, the first line part and the second line part may be disposed with the insulation layer therebetween. The first line part and the second line part may be connected to each other through contact holes passing through the insulation layer.

In an embodiment, the first auxiliary sensor parts and the second auxiliary sensor parts may be disposed on the other side of the insulation layer.

In an embodiment, the first sensor parts may contact the first auxiliary sensor parts, and the second sensor parts may contact the second auxiliary sensor parts.

In an embodiment, the first auxiliary sensor parts may contact the insulation layer and be disposed between the insulation layer and the first sensor parts.

In an embodiment, the first sensor parts may contact the insulation layer and be disposed between the insulation layer and the first auxiliary sensor parts.

In an embodiment, the second electrode may further include second auxiliary connection parts configured to connect second auxiliary sensor parts, which are adjacent to each other, of the second auxiliary sensor parts.

In an embodiment, the second connection parts may be disposed inside the second auxiliary connection parts, in a plan view.

In an embodiment of the inventive concept, a display device includes a display panel and an input sensing unit disposed on the display panel. The input sensing unit includes at least one insulation layer, a first electrode, a second electrode, and auxiliary electrodes. The first electrode includes first sensor parts having a metal and a mesh shape and first connection parts configured to connect first sensor parts, which are adjacent to each other, of the first sensor parts. The second electrode includes second sensor parts having a metal and a mesh shape and second connection parts configured to connect second sensor parts, which are adjacent to each other, of the second sensor parts and crossing the first connection parts with the insulation layer therebetween. The auxiliary electrodes are connected to overlap corresponding sensor parts of the first sensor parts and second sensor parts and include transparent conductive oxide.

In an embodiment of the inventive concept, a display device includes a display panel including a plurality of emission areas spaced apart from each other and a non-emission area disposed between the plurality of emission areas and an input sensing unit including a plurality of electrodes disposed on the display panel.

The plurality of electrodes includes sensor parts disposed to be spaced apart from each other, each of which includes a metal, and having a mesh shape, auxiliary sensor parts connected to overlap corresponding sensor parts of the sensor parts and including transparent conductive oxide. The sensor parts include a plurality of mesh holes corresponding to the plurality of emission areas and overlapping the non-emission area. The auxiliary sensor parts overlap the plurality of emission areas and the non-emission area.

In an embodiment of the inventive concept, an input sensing unit includes a noise shield electrode directly disposed on the base surface and includes a transparent conductive oxide, a first electrode disposed on the noise shield electrode and having a mesh shape, and a second electrode disposed on the noise shield electrode and crossing the first electrode. The first electrode and the second electrode overlap the noise shield electrode on the base surface in a plan view.

In an embodiment of the inventive concept, an input sensing unit includes a plurality of first electrodes directly disposed on the base surface and having a mesh shape, a dummy electrode directly disposed on the base surface between the plurality of first electrodes, a plurality of second electrodes crossing the first electrodes on the base surface, an insulation layer between the plurality of first electrodes and the plurality of second electrodes, and an input sensing circuit. The input sensing circuit is electrically connected to the plurality of first electrodes, the dummy electrodes, and the plurality of second input electrodes and detects noises and an external input, which are generated in the dummy electrode by the display panel.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION

Figure 1A:
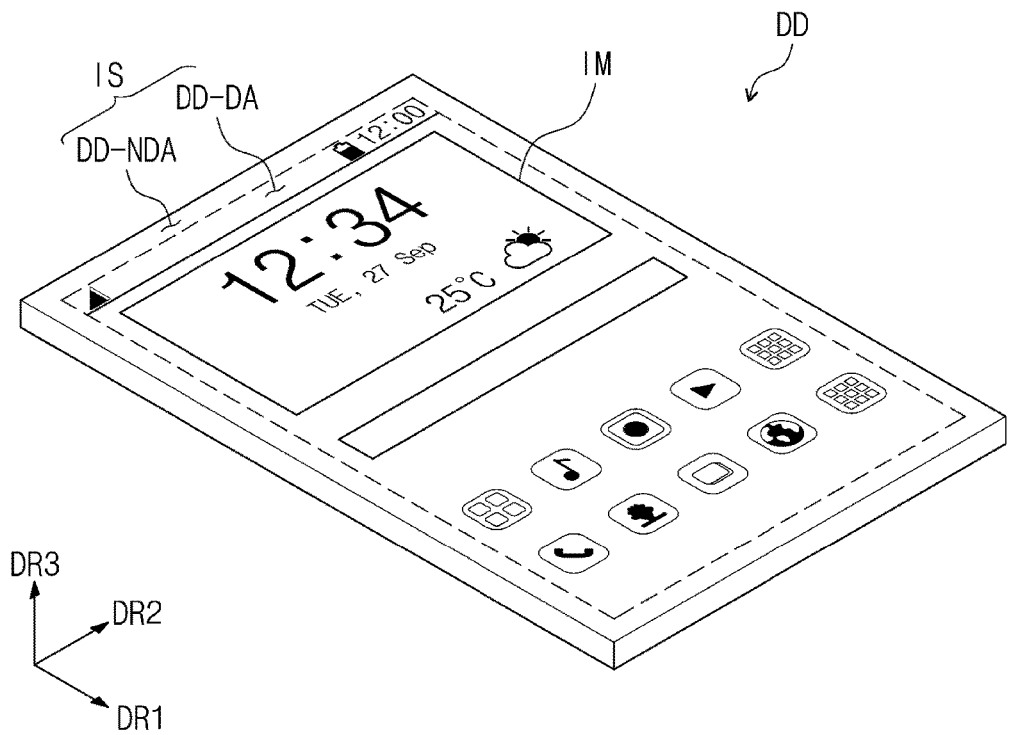
FIG. 1A is a perspective view of a display device according to an embodiment of the inventive concept.

Hereinafter, embodiments of the inventive concept will be described with reference to the accompanying drawings. In this specification, it will also be understood that when one component (or region, layer, portion) is referred to as being 'on', 'connected to', or 'coupled to' another component, it can be directly connected/coupled on/to the one component, or an intervening third component may also be present.

Like reference numerals refer to like elements throughout. Also, in the figures, the thickness, ratio, and dimensions of components are exaggerated for clarity of illustration. The term "and/or" includes any and all combinations of one or more of the associated listed items.

It will be understood that although the terms of first and second are used herein to describe various elements, these elements should not be limited by these terms. These terms are generally only used to distinguish one element from another. For example, a first element referred to as a first element in one embodiment can be referred to as a second element in another embodiment. A singular representation may include a plural representation unless it represents a definitely different meaning from the context.

Also, ""under", "below", "above', "upper", and the like are used for explaining relation association of components illustrated in the drawings. The terms may be a relative concept and described based on directions expressed in the drawings.

The meaning of 'include' or 'comprise' specifies a property, a fixed number, a step, an operation, an element, a component or a combination thereof, but does not exclude other properties, fixed numbers, steps, operations, elements, components or combinations thereof.

Figure 1B:
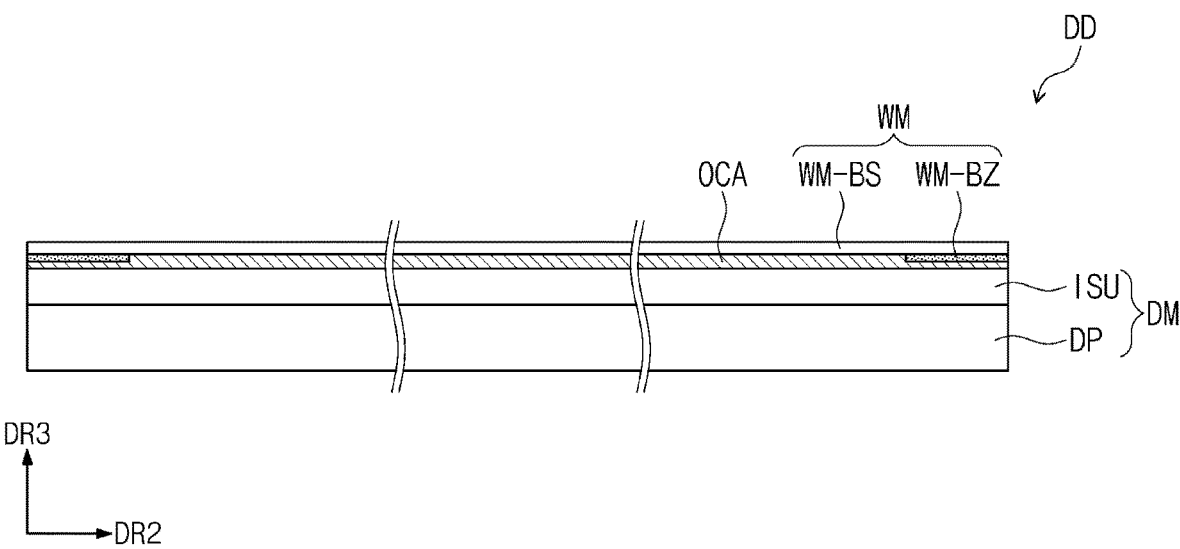
FIG. 1B is a cross-sectional view of the display device according to an embodiment of the inventive concept.
Figure 2:
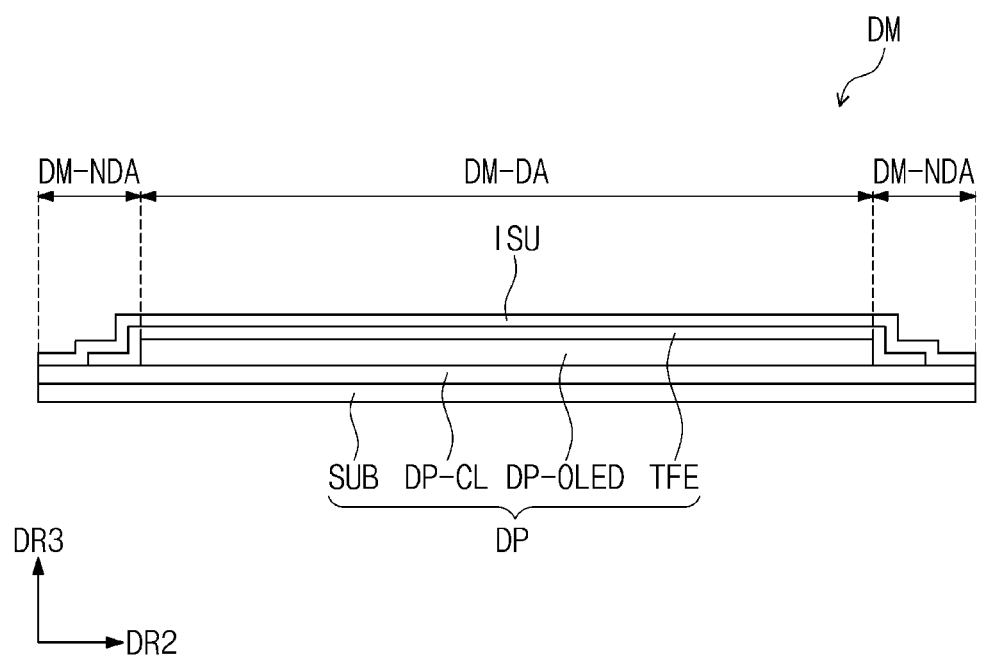
FIG. 2 is a cross-sectional view of a display module according to an embodiment of the inventive concept.

FIG. 1A is a perspective view of a display device DD according to an embodiment of the inventive concept. FIG. 1B is a cross-sectional view of the display device DD according to an embodiment of the inventive concept. FIG. 2 is a cross-sectional view of a display module DM according to an embodiment of the inventive concept. FIGS. 1B and 2 illustrate cross-sections defined by a second directional axis DR2 and a third directional axis DR3.

As illustrated in FIGS. 1A and 1B, a display surface IS on which an image IM is displayed is parallel to a surface that is defined by a first directional axis DR1 and the second directional axis DR2. A normal direction of the display surface IS, i.e., a thickness direction of the display device DD is indicated as the third directional axis DR3. A front surface (or top surface) and a rear surface (or bottom surface) of each of members is distinguished by the third directional axis DR3. However, directions indicated as the first to third directional axes DR1, DR2, and DR3 may be a relative concept and thus changed into different directions. Hereinafter, the first to third directions may be directions indicated by the first to third directional axes DR1, DR2, and DR3 and designated by the same reference numerals, respectively.

Although the display device DD having a planar display surface is illustrated in an embodiment of the inventive concept, the embodiment of the inventive concept is not limited thereto. The display device DD may include a curved display surface or an integrated display surface (a polygonal pillar-type display surface) including a plurality of display areas that indicate directions different from each other.

The display device DD according to this embodiment may be a flat rigid display device. However, the embodiment of the inventive concept is not limited thereto. For example, the display device according to an embodiment of the inventive concept may be a flexible display device DD. The display device DD according to an embodiment of the inventive concept may be applied for large-sized electronic devices such as televisions and monitors and small and middle-sized electronic devices such as mobile phones, tablet PC, navigation units for vehicles, game consoles, and smart watches.

As illustrated in FIG. 1A, the display surface IS includes a display area DD-DA on which the image IM is displayed and a non-display area DD-NDA that is adjacent to the display area DD-DA. The non-display area DD-NDA may be an area on which an image is not displayed. FIG. 1A illustrates icon images as an example of the image IM. For example, the display area DD-DA may have a rectangular shape. The non-display area DD-NDA may surround the display area DD-DA. However, the embodiment of the inventive concept is not limited thereto. For example, the display area DD-DA and the non-display area DD-NDA may be relatively designed in shape.

As illustrated in FIG. 1B, the display device DD includes a window unit WM and the display module DM. The display module DM and the window unit WM may be coupled to each other by using an optical transparent adhesion member OCA. In an embodiment of the inventive concept, the optical transparent adhesion member OCA may be omitted, and the window unit WM may be directly disposed on the display module DM.

The window unit WM includes a base film WM-BS and a light blocking pattern WM-BZ. The base film WM-BS may include a thin film glass substrate and/or a plastic film. The light blocking pattern WM-BZ partially overlaps the base film WM-BS. The light blocking pattern WM-BZ may be disposed on a rear surface of the base film WM-BS to define a bezel area, i.e., the non-display area DD-NDA (see FIG. 1A) of the display device DD.

The light blocking pattern WM-BZ may be a colored organic layer and, for example, be formed in a coating manner. Although not separately shown, the window unit WM may further include a functional coating layer disposed on a front surface of the base film WM-BS. The functional coating layer may include a fingerprint prevention layer, a reflection prevention layer, and a hard coating layer.

As illustrated in FIG. 2, the display module DM includes a display panel DP and an input sensing unit ISU (or an input sensing layer). The display panel DP generates an image, and the input sensing unit ISU acquires coordinate information of an external input (a touch event). Although not separately shown, the display module DM according to an embodiment of the inventive concept may further include a protection member disposed on a bottom surface of the display panel DP and an antireflection member disposed on a top surface of the input sensing unit ISU.

The display panel DP may be an emission-type display panel. That is, the embodiment of the inventive concept is not limited to a kind of display panels. For example, the display panel DP may be an organic light emitting display panel and a quantum-dot light emitting display panel. The organic light emitting display panel includes a light emitting layer made of an organic light emitting material. In the quantum-dot light emitting display panel, a light emitting layer includes a quantum dot and a quantum rod. Hereinafter, the organic light emitting display panel will be described as an example of the display panel DP.

The display panel DP includes a base layer SUB, a circuit device layer DP-CL disposed on the base layer SUB, a display device layer DP-OLED, and a thin film encapsulation layer TFE. Although not separately shown, the display panel DP may further include functional layers such as the antireflection layer, a reflective index adjusting layer, and the like.

The base layer SUB may include a flexible film. The base layer SUB may include a plastic substrate, a glass substrate, a metal substrate, and an organic/inorganic composite substrate. The display area DD-DA and the non-display area DD-NDA, which are described with reference to FIG. 1A, may be defined in the same manner on the base layer SUB.

The circuit device layer DP-CL includes at least one intermediate insulation layer and a circuit device. The intermediate insulation layer includes at least one intermediate inorganic film and at least one intermediate organic film. The circuit device includes signal lines, a driving circuit of the pixel, and the like. The circuit device layer DP-CL may be formed through an insulation formation process using deposition and a patterning process of a conductive layer and/or a semiconductor layer through a photolithograph process.

The display device layer DP-OLED may include at least one organic light emitting diode. The display device layer DP-OLED may further include an organic film such as a pixel defining layer.

The thin film encapsulation layer TFE seals the display device layer DP-OLED. The thin film encapsulation layer TFE includes at least one inorganic film (hereinafter, referred to as an encapsulation inorganic film). The thin film encapsulation layer TFE may further include at least one organic film (hereinafter, referred to as an encapsulation organic film). The encapsulation inorganic film protects the display device layer DP-OLED against moisture/oxygen, and the encapsulation organic film protects the display device layer DP-OLED against foreign substances such as dust particles. The encapsulation inorganic film may include a silicon nitride layer, a silicon oxynitride layer, and a silicon oxide layer, a titanium oxide layer, or an aluminum oxide layer. The encapsulation organic film may include an acrylic-based organic layer, but the embodiment of the inventive concept is not limited thereto.

In an embodiment of the inventive concept, the thin film encapsulation layer TFE may be replaced with an encapsulation substrate. The encapsulation substrate seals the display device layer DP-OLED.

The input sensing unit ISU may be directly disposed on a base surface provided on the display panel DP. In this specification, the term "directly disposed" means that a component is formed through the continuous process except that the component adheres by using a separate adhesion layer. The base surface may be a top surface of the thin film encapsulation layer TFE, i.e., a top surface of the encapsulation substrate. The base surface is not particularly limited, and thus, may be the uppermost top surface of the display panel DP, which is formed by a continuous process.

That is to say, the sentence "a component A of the input sensing unit ISU is directly disposed on the base surface" represents that "an adhesion layer/adhesion member is not disposed between the base surface and the component A on the cross-section of the display device". Here, the base surface may be a top surface of the thin film encapsulation layer TFE, i.e., a top surface of the encapsulation substrate. The base surface is not particularly limited and may be the uppermost top surface of the display panel DP, which is formed by a continuous process.

In an embodiment of the inventive concept, the input sensing unit ISU may be separately formed as a panel shape and then coupled to the display panel DP through the adhesion layer. Since the input sensing unit ISU is directly disposed on the base surface provided on the display panel DP, the base substrate of the input sensing unit may be omitted to reduce a thickness of the display device DD.

The input sensing unit ISU may have a multilayer structure. The input sensing unit ISU may include a conductive layer having a single layer or multilayer structure. The input sensing unit ISU may include at least one insulation layer.

For example, the input sensing unit ISU may sense an external input in a capacitive manner. The embodiment of the inventive concept is not specifically limited to the operation manner of the input sensing unit ISU. In an embodiment of the inventive concept, the input sensing unit ISU may sense an external input in an electromagnetic inductive coupling or pressure sensitive manner.

Figure 3:
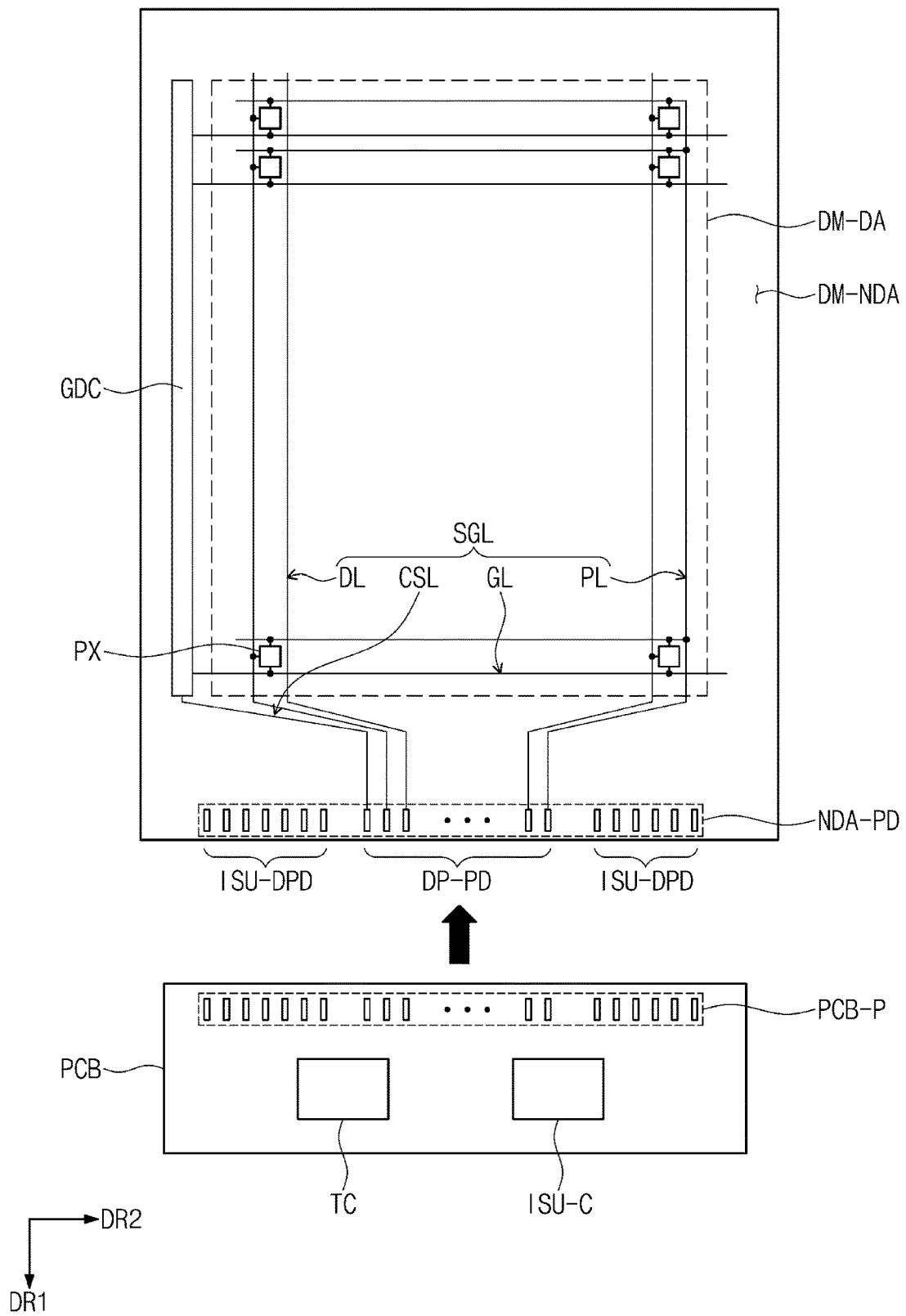
FIG. 3 is a plan view of a display panel according to an embodiment of the inventive concept.
Figure 4:
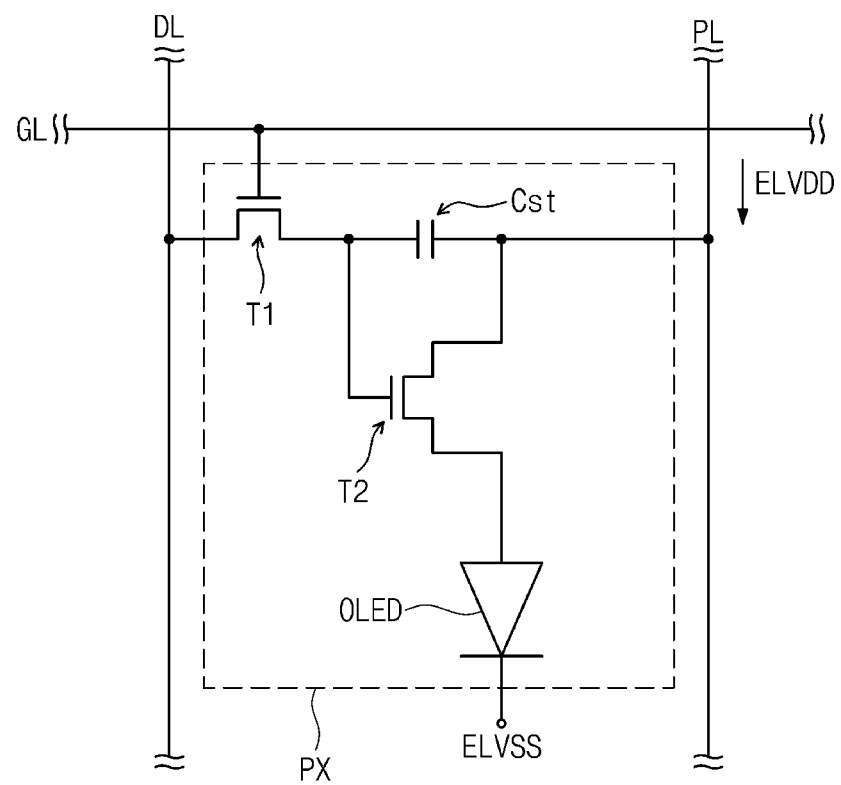
FIG. 4 is an equivalent circuit diagram of a pixel according to an embodiment of the inventive concept.
Figure 5:
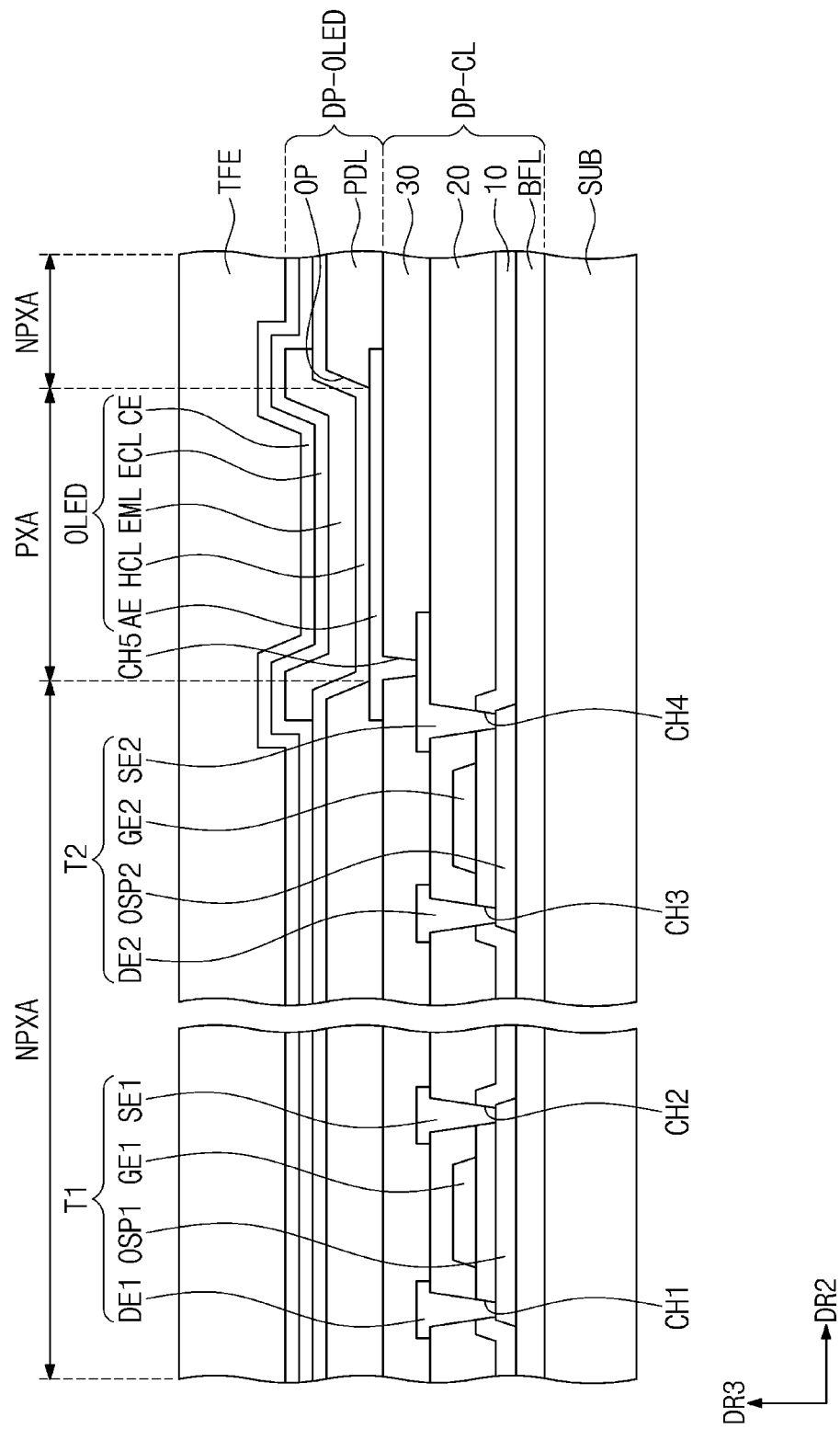
FIG. 5 is an enlarged cross-sectional view of the display panel according to an embodiment of the inventive concept.

FIG. 3 is a plan view of the display panel DP according to an embodiment of the inventive concept. FIG. 4 is an equivalent circuit diagram of a pixel PX according to an embodiment of the inventive concept. FIG. 5 is an enlarged cross-sectional view of the display panel DP according to an embodiment of the inventive concept.

FIG. 3 additionally illustrates a circuit board PCB electrically connected to the display panel DP. The circuit board PCB may be a rigid substrate or a flexible circuit board. The circuit board PCB may be directly coupled to the display panel DP or connected to the display panel DP through another circuit board.

A timing control circuit TC controlling an operation of the display panel DP may be disposed on the circuit board PCB. Also, an input sensing circuit ISU-C controlling the input sensing unit ISU may be disposed on the circuit board PCB. Each of the timing control circuit TC and the input sensing circuit ISU-C may be mounted on the circuit board PCB in the form of an integrated chip.

The circuit board PCB includes circuit board pads PCB-P electrically connected to the display panel DP. Although not shown, the circuit board PCB further includes signal lines connecting the circuit board pads PCB-P to the timing control circuit TC and/or the input sensing circuit ISU-C.

As illustrated in FIG. 3, the display panel DP includes a display area DM-DA and a non-display area DM-NDA on a plane. In the current embodiment, the non-display area DM-NDA may be defined along an edge of the display area DM-DA. The display area DM-DA and the non-display area DM-NDA of the display panel DP may correspond to the display area DD-DA and the non-display area DD-NDA of the display module DM of FIG. 1A, respectively. It is unnecessary that the display area DM-DA and the non-display area DM-NDA of the organic light emitting display panel DP respectively correspond to the display area DD-DA and the non-display area DD-NDA of the display apparatus DD. For example, the display area DM-DA and the non-display area DM-NDA of the organic light emitting display panel DP may be changed according to a structure/ design of the organic light emitting display panel DP.

The display panel DP may include a driving circuit GDC, a plurality of signal lines SGL, and a plurality of pixels PX. The plurality of pixels PX are disposed on the display area DM-DA. Each of the pixels PX includes an organic light emitting diode and a pixel driving circuit connected to the organic light emitting diode. The driving circuit GDC, the plurality of signal lines SGL, and the pixel driving circuit may be provided in the circuit device layer DP-CL of FIG. 2.

The driving circuit GDC, sometimes called the scan driving circuit GDC, may include a scan driving circuit. The scan driving circuit GDC generates a plurality of scan signals, and the plurality of scan signals are successively outputted to a plurality of scan lines GL. The scan driving circuit GDC may further output other control signals to the driving circuit of each of the pixels PX.

The scan driving circuit GDC may include a plurality of thin film transistors that are manufactured through the same process as the driving circuit of the pixel PX, e.g., a low temperature polycrystalline silicon (LTPS) process or a low temperature polycrystalline oxide (LTPO) process.

The plurality of signal lines SGL includes the scan lines GL, data lines DL, a power line PL, and a control signal line CSL. The scan lines GL are respectively connected to corresponding pixels of the plurality of pixels PX, and the data lines DL are respectively connected to corresponding pixels PX of the plurality of pixels PX. The power line PL is connected to the plurality of pixels PX. The control signal line CSL may provide control signals to the scan driving circuit GDC.

The display panel DP includes signal pads DP-PD connected to ends of the signal lines SGL. The signal pads DP-PD may be a kind of circuit device. An area of the non-display area DM-NDA, on which the signal pads DP-PD are disposed, is defined as a pad area NDA-PD. Dummy pads ISU-DPD connected to signal lines SL1-1 to SL1-5 and SL2-1 to SL2-4, which will be described later may be further disposed on the pad area NDA-PD. The signal pads DP-PD and the Dummy pads ISU-DPD may be disposed on the same layer through the same process as a scan line GL (see FIG. 5) and a data line DL (see FIG. 5), which will be described later.

FIG. 4 illustrates an example of the pixel PX connected to one scan line GL, one data line DL, and the power line PL. However, the embodiment of the inventive concept is not limited to the configuration of the pixel PX. For example, the pixel PX may be variously formed in configuration.

The organic light emitting diode OLED may be a top emission-type diode or a bottom emission-type diode. The pixel PX includes a first transistor T1 (or a switching transistor), a second transistor T2 (or a driving transistor), and a capacitor Cst as the pixel driving circuit driving the organic light emitting diode OLED. A first power voltage ELVDD is provided to the second transistor T2, and a second power voltage ELVSS is provided to the organic light emitting diode OLED. The second power voltage ELVSS may be less than the first power voltage ELVDD.

The first transistor T1 outputs a scan signal applied to the data line DL in response to a scanning signal applied to the scan line GL, sometimes called the gate line GL. The capacitor Cst charges a voltage to correspond to the data signal received from the first transistor T1.

The second transistor T2 is connected to the organic light emitting diode OLED. The second transistor T2 controls driving current flowing through the organic light emitting diode OLED to correspond to an amount of charges stored in the capacitor Cst. The organic light emitting diode OLED emits light during a turn-on period of the second transistor T2.

FIG. 5 illustrates a partial cross-sectional view of the display panel DP corresponding to the equivalent circuit of FIG. 4. The circuit device layer DP-CL, the display device layer DP-OLED, and the thin film encapsulation layer TFE are successively disposed on the base layer SUB.

The circuit device layer DP-CL includes at least one inorganic film, at least one organic film, and a circuit device. The circuit device layer DP-CL may include a buffer layer BFL, a first intermediate inorganic film 10, and a second intermediate inorganic film 20, which are inorganic layers, and an intermediate organic film 30 that is an organic layer.

The inorganic films may include silicon nitride, silicon oxynitride, silicon oxide, and the like. The organic film may include at least one of an acrylic-based resin, a methacrylic-based resin, a polyisoprene-based resin, a vinyl-based resin, an epoxy-based resin, a urethane-based resin, a cellulose-based resin, a siloxane-based resin, a polyimide-based resin, a polyamide-based resin, or a perylene-based resin. The circuit device includes conductive patterns and/or semiconductor patterns.

The buffer layer BFL improves coupling force between conductive patterns or semiconductor patterns. Although not separately shown, a barrier layer for preventing foreign substances from being introduced may be further disposed on a top surface of the base layer SUB. The buffer layer BFL and the barrier layer may be selectively disposed/omitted.

A semiconductor pattern OSP1 (hereinafter, referred to as a first semiconductor pattern) of the first transistor T1 and a semiconductor pattern OSP2 (hereinafter, referred to as a second semiconductor pattern) of the second transistor T2 are disposed on the buffer layer BFL. Each of the first and second semiconductor patterns OSP1 and OSP2 may be selected from amorphous silicon, polysilicon, and a metal oxide semiconductor.

The first intermediate inorganic film 10 is disposed on the first semiconductor pattern OSP1 and the second semiconductor pattern OSP2. A control electrode GE1 (hereinafter, referred to as a first control electrode) of the first transistor T1 and a control electrode GE2 (hereinafter, referred to as a second control electrode) of the second transistor T2 are disposed on the first intermediate inorganic film 10. The first and second control electrodes GE1 and GE2 may be manufactured by the same photolithography process as the scan lines GL (see FIG. 4).

The second intermediate inorganic film 20 covering the first and second control electrodes GE1 and GE2 is disposed on the first intermediate layer 10. An input electrode DE1

(hereinafter, referred to as a first input electrode) and an output electrode SE1 (hereinafter, referred to as a first output electrode) of the first transistor T1 and an input electrode DE2 (hereinafter, referred to as a second input electrode), and an output electrode SE2 (hereinafter, referred to as a second output electrode) of the second transistor T2 are disposed on the second intermediate inorganic film 20.

The first input electrode DE1 and the first output electrode SE1 are connected to the first semiconductor pattern OSP1 through first and second through-holes CH1 and CH2, which pass through the first and second intermediate inorganic films 10 and 20, respectively. The second input electrode SE2 and the second output electrode DE2 are connected to the second semiconductor pattern OSP2 through third and fourth through-holes CH3 and CH4, which pass through the first and second intermediate inorganic films 10 and 20, respectively. According to another embodiment of the inventive concept, portions of the first and second transistors T1 and T2 may be formed into a bottom gate structure.

The intermediate organic film 30 covering the first input electrode DE1, the second input electrode DE2, the first output electrode SE1, and the second output electrode SE2 is disposed on the second intermediate inorganic film 20. The intermediate organic film 30 may provide a planation surface.

The display device layer DP-OLED is disposed on the intermediate organic film 30. The display device layer DP-OLED may include a pixel defining layer PDL and the organic light emitting diode OLED. The pixel defining layer PDL may include an organic material, like the intermediate organic film 30. A first electrode AE is disposed on the intermediate organic film 30. The first electrode AE is connected to the second output electrode SE2 through the fifth through-hole CH5 passing through the intermediate organic film 30. An opening OP is defined in the pixel defining layer PDL. The opening OP of the pixel defining layer PDL extends to and exposes at least a portion of the first electrode AE.

The pixel PX may be disposed on a pixel area on a plane. The pixel area may include an emission area PXA and a non-emission area NPXA that is adjacent to the emission area PXA. The non-emission area NPXA may surround the emission area PXA. In the current embodiment, the emission area PXA may be defined to correspond to a portion of the first electrode AE exposed by the opening OP.

A hole control layer HCL may be commonly disposed on the emission area PXA and the non-emission area NPXA. Although not particularly shown, a common layer such as the hole control layer HCL may be commonly disposed on the plurality of pixels PX (see FIG. 3).

An emission layer EML is disposed on the hole control layer HCL. The emission layer EML may be disposed on an area corresponding to the opening OP. That is, the emission layer EML may be formed to be separated from each of the plurality of pixels PX. Also, the emission layer EML may include an organic material and/or an inorganic material. Although the patterned emission layer EML is illustrated as an example in the current embodiment, the emission layer EML may be commonly disposed on the plurality of pixels PX. Here, the emission layer EML may emit white light. Also, the emission layer EML may have a multilayer structure.

An electronic control layer ECL is disposed on the emission layer EML. Although not particularly shown, the electronic control layer ECL may be commonly disposed on the plurality of pixels PX (see FIG. 3).

A second electrode CE is disposed on the electronic control layer ECL. The second electrode CE is commonly disposed on the plurality of pixels PX.

The thin film encapsulation layer TFE is disposed on the second electrode CE. The thin film encapsulation layer TFE is commonly disposed on the plurality of pixels PX. In the current embodiment, the thin film encapsulation layer TFE directly covers the second electrode CE. In an embodiment of the inventive concept, a capping layer covering the second electrode CE may be further disposed between the thin film encapsulation layer TFE and the second electrode CE. Here, the thin film encapsulation layer TFE may directly cover the capping layer.

Figure 6A:
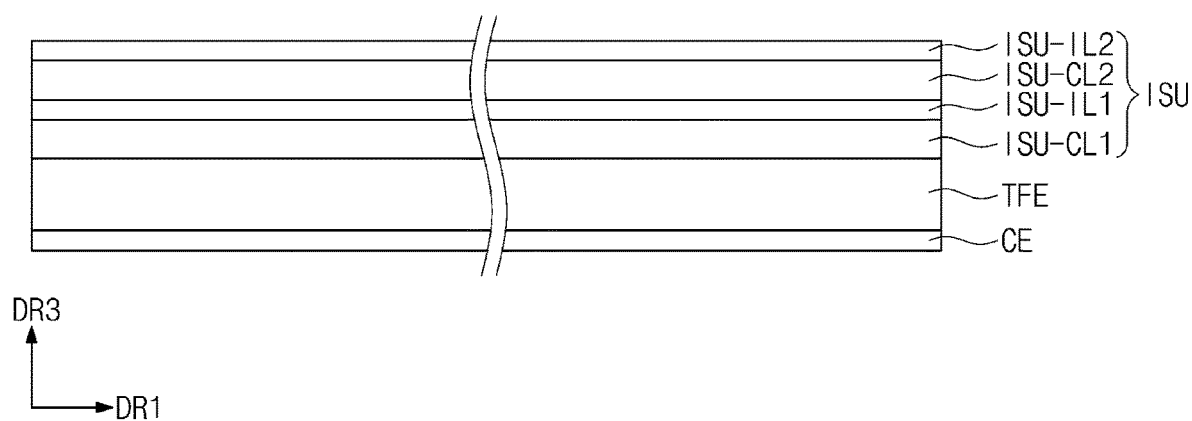
FIG. 6A is a cross-sectional view of an input sensing unit according to an embodiment of the inventive concept.
Figure 6B:
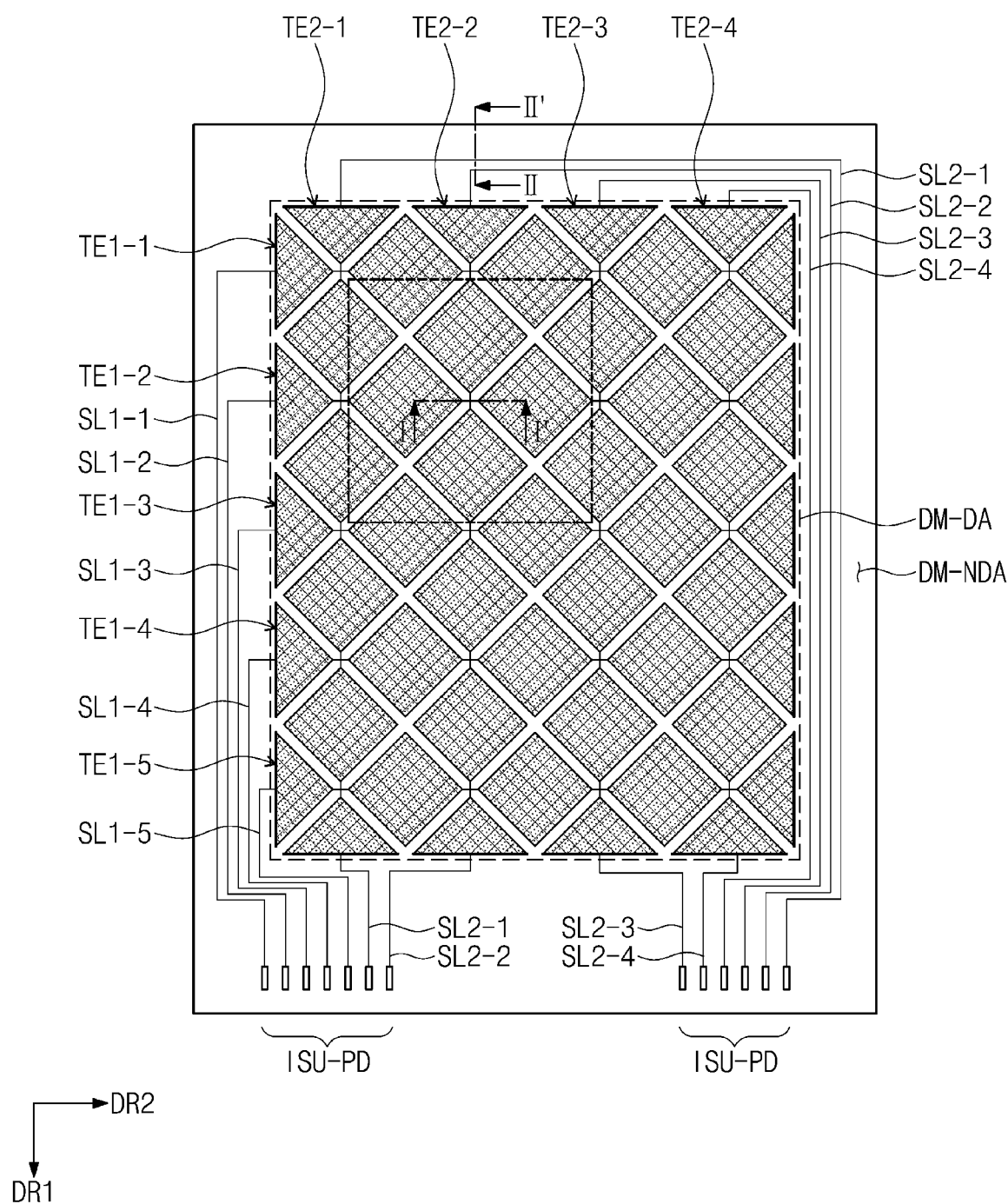
FIG. 6B is a plan view of the input sensing unit according to an embodiment of the inventive concept.

FIG. 6A is a cross-sectional view of the input sensing unit ISU according to an embodiment of the inventive concept. FIG. 6B is a plan view of the input sensing unit ISU according to an embodiment of the inventive concept. FIG. 6A illustrates the second electrode CE and the thin film encapsulation layer TFE as the constitutions of the display panel DP (see FIG. 5).

As illustrated in FIG. 6A, the input sensing unit ISU include a first conductive layer ISU-CL1, a first insulation layer ISU-IL1 (hereinafter, referred to as a first insulation layer), a second conductive layer ISU-CL2, and a second insulation layer ISU-IL2 (hereinafter, referred to as a second insulation layer). In the current embodiment, the first conductive layer ISU-CL1 may be directly disposed on the thin film encapsulation layer TFE. The embodiment of the inventive concept is not limited thereto. For example, another inorganic layer or organic layer may be further disposed between the first conductive layer ISU-CL1 and the thin film encapsulation layer TFE. In the current embodiment, the second insulation layer ISU-IL2 may be omitted, and an optical member or an adhesion layer may be substituted for the protection function of the second insulation layer ISU-IL2.

Each of the first conductive layer ISU-CL1 and the second conductive layer ISU-CL2 may have a single-layer structure or a multi-layer structure in which a plurality of layers are stacked in the third directional axis DR3. The conductive layer having the single-layer structure may include a metal layer or a transparent conductive layer. The metal layer may be formed of molybdenum, silver, titanium, copper, aluminum, and an alloy thereof.

The transparent conductive layer may include transparent conductive oxide such as indium tin oxide (ITO), indium zinc oxide (IZO), zinc oxide (ZnO), and indium tin zinc oxide (ITZO). In addition, the transparent conductive layer may include PEDOT, a metal nano wire, and graphene.

The conductive layer having the multilayer structure may include multilayer metal layers. The multilayer metal layers may have a 3-layer structure of titanium/aluminum/titanium. The conductive layer having the multilayer structure may include a metal layer or a transparent conductive layer. The conductive layer having the multilayer structure may include a multilayer metal layer or a transparent conductive layer.

Each of the first and second conductive layers ISU-CL1 and ISU-CL2 may include a plurality of patterns. Hereinafter, an example in which the first conductive layer ISU-CL1 includes first conductive patterns, and the second conducive layer ISU-CL2 includes second conductive patterns will be described. Each of the first and second conductive patterns may include electrodes and signal lines.

Each of the first and second insulation layers ISU-IL1 and ISU-IL2 may be formed of inorganic or organic material. At least one of the first or second insulation layer ISU-IL1 or ISU-IL2 may include an inorganic film. The inorganic film may include at least one of oxide, titanium oxide, silicon oxide, silicon oxide nitride, zirconium oxide, or hafnium oxide.

At least one of the first or second insulation layer ISU-IL1 or ISU-IL2 may include an organic film. The organic film may include at least one of an acrylic-based resin, a methacrylic-based resin, a polyisoprene-based resin, a vinyl-based resin, an epoxy-based resin, a urethane-based resin, a cellulose-based resin, a siloxane-based resin, a polyimide-based resin, a polyamide-based resin, or a perylene-based resin.

As illustrated in FIG. 6B, the input sensing unit ISU may include first electrodes TE1-1 to TE1-5, first signal lines SL1-1 to SL1-5 connected to the first electrodes TE1-1 to TE1-1, second electrodes TE2-1 to TE2-4, second signal lines SL2-1 to SL2-4 connected to the second electrodes TE2-1 to TE2-4, and sensing signal pads ISU-PD connecting the first signal lines SL1-1 to SL1-5 to the second signal lines SL2-1 to SL2-4. The first electrode TE1-1 to TE1-5 and the second electrode TE2-1 to TE2-4 cross each other. The first electrodes TE1-1 to TE1-5 are arranged in the first direction DR1 and extend in the second direction DR2. The external input may be detected in a mutual capacitance manner or a self-capacitance manner. Although not shown in FIG. 6B, the input sensing unit ISU may include at least one insulation layer.

The first signal lines SL1-1 to SL1-5 are connected to ends of the first electrodes TE1-1 to TE1-5, respectively. The second signal lines SL2-1 to SL2-4 are connected to both ends of the second electrodes TE2-1 to TE2-4, respectively. In an embodiment of the inventive concept, the first signal lines SL1-1 to SL1-5 may also be connected to both ends of the first electrodes TE1-1 to TE1-5, respectively. In an embodiment of the inventive concept, each of the second signal lines SL2-1 to SL2-4 may be connected to only one end of each of the second electrodes TE2-1 to TE2-4.

In an embodiment of the inventive concept, the first signal lines SL1-1 to SL1-5, the second signal lines SL2-1 to SL2-4, and the sensing signal pads ISU-PD may be replaced with a circuit board that is separately manufactured and then coupled. In an embodiment of the inventive concept, the sensing signal pads ISU-PD may be omitted, and the first signal lines SL1-1 to SL1-5 and the second signal lines SL2-1 to SL2-4 may be connected to the dummy pads ISU-DPD of FIG. 3.

The first signal lines SL1-1 to SL1-5 and the second signal lines SL2-1 to SL2-4 may have a two-layer structure as described later. The first signal lines SL1-1 to SL1-5 comprise first line portions SL1-11 to SL1-51 (see FIG. 7A) formed from the first conductive layer (ISU-CL1, see FIG. 6A) and second line portions SL1-12 to SL1-52 (see FIG. 7C) formed from a second conductive layer (ISU-CL2, see FIG. 6A). The second signal lines SL2-1 to SL2-4 comprise first line portions SL2-11 to SL2-41 (see FIG. 7A) formed from the first conductive layer (ISU-CL1, see FIG. 6A) and second line portions SL2-22 to SL2-42 (see FIG. 7C) formed from a second conductive layer ISU-CL2 (see FIG. 6A).

Figure 7A:
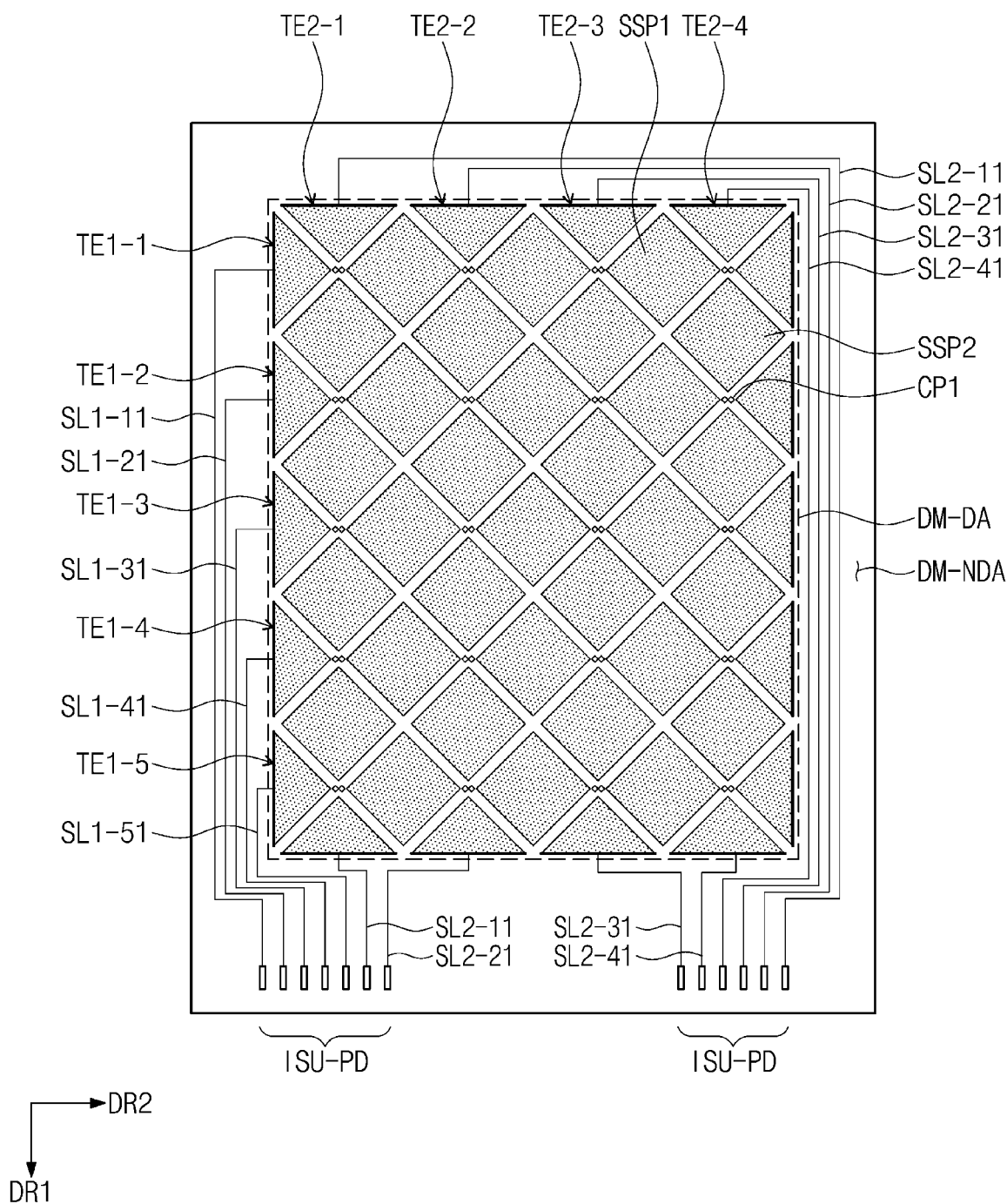
FIG. 7A is a plan view illustrating a first conductive layer of the input sensing unit according to an embodiment of the inventive concept.
Figure 7B:
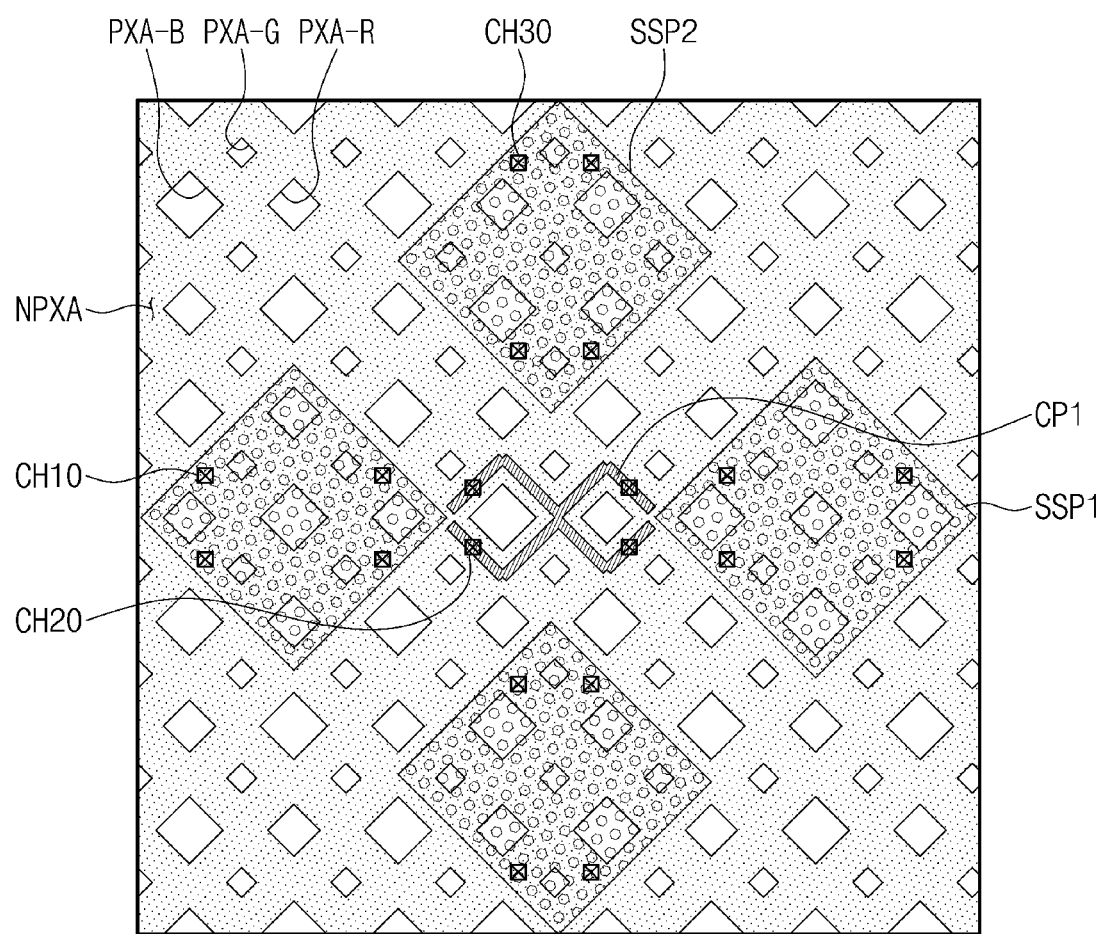
FIG. 7B is a partial plan view of the input sensing unit according to an embodiment of the inventive concept.
Figure 7C:
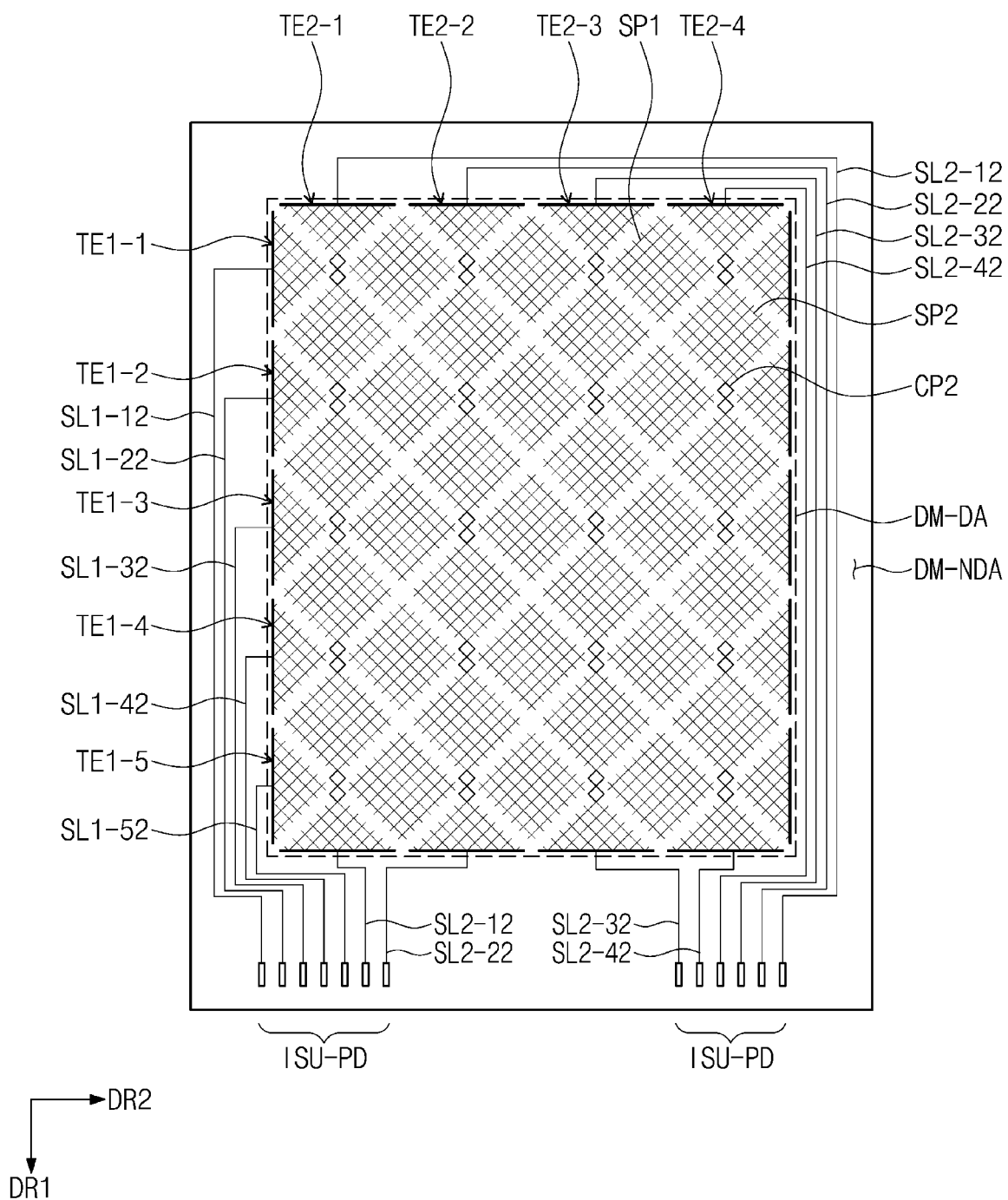
FIG. 7C is a plan view illustrating a second conductive layer of the input sensing unit according to an embodiment of the inventive concept.
Figure 7D:
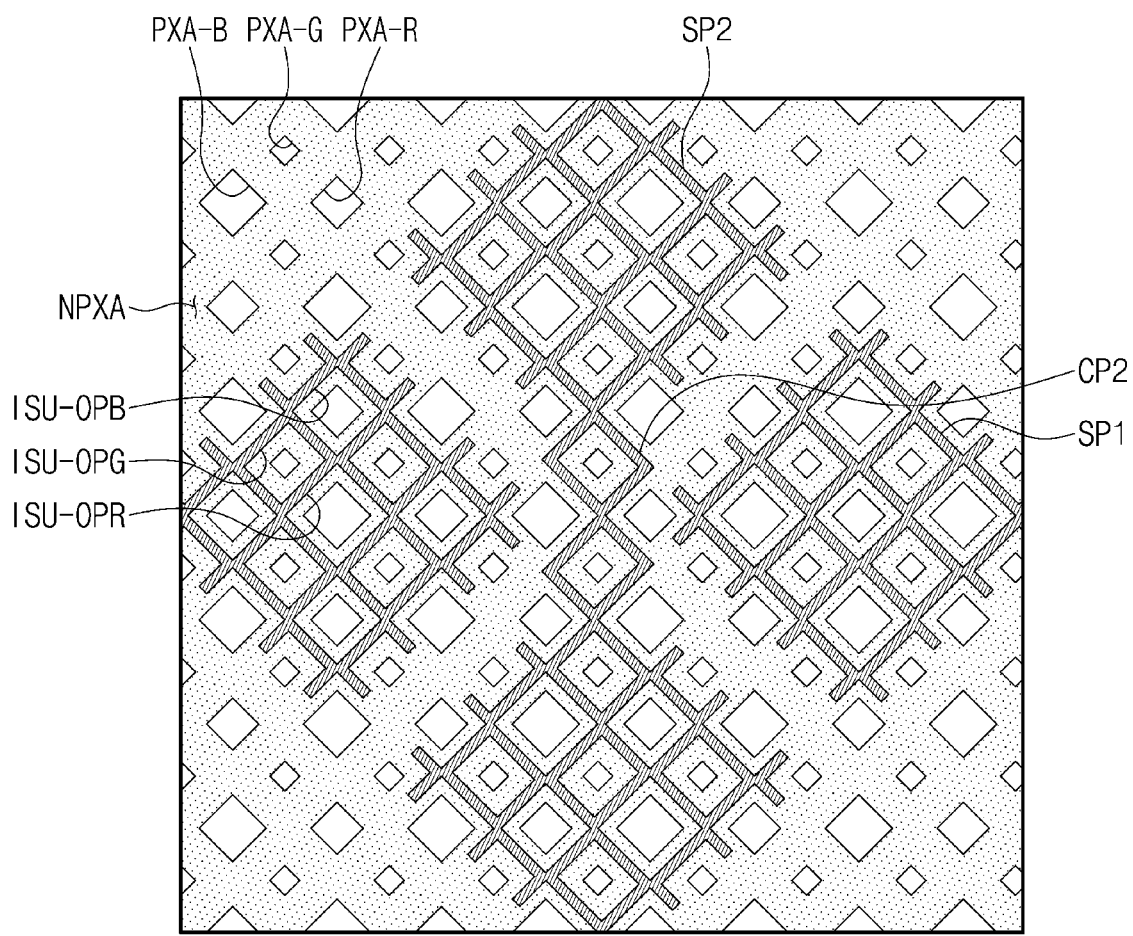
FIG. 7D is a partial plan view of the input sensing unit according to an embodiment of the inventive concept.
Figure 7E:
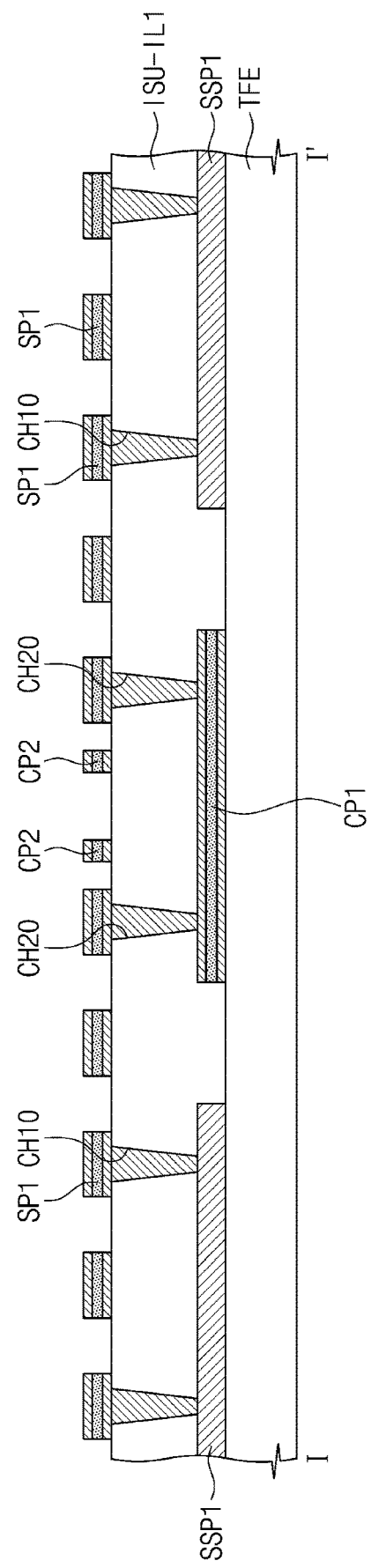
FIGS. 7E and 7F are cross-sectional views of the input sensing unit according to an embodiment of the inventive concept.
Figure 7F:
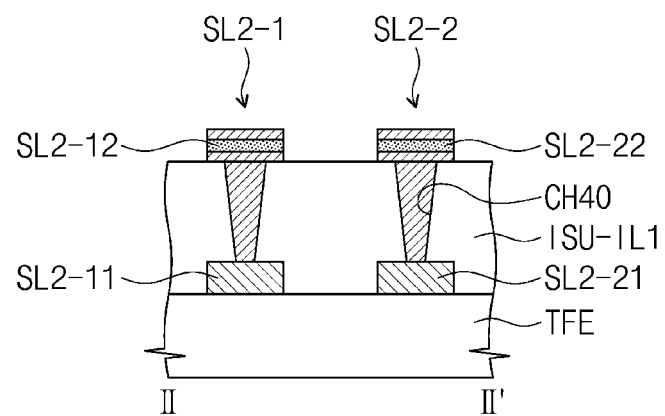

FIG. 7A is a plan view illustrating the first conductive layer ISU-CL1 (see FIG. 6A) of the input sensing unit ISU according to an embodiment of the inventive concept. FIG. 7B is a partial plan view of the input sensing unit ISU according to an embodiment of the inventive concept, and FIG. 7C is a plan view illustrating the second conductive layer ISU-CL2 (see FIG. 6A) of the input sensing unit ISU according to an embodiment of the inventive concept. FIG. 7D is a partial plan view of the input sensing unit ISU according to an embodiment of the inventive concept. FIGS. 7E to 7F are cross-sectional views of the input sensing unit ISU according to an embodiment of the inventive concept. FIGS. 7B and 7D are enlarged views of areas corresponding to two first sensor parts SP1 and two second sensor parts SP2. FIGS. 7E to 7F are cross-sectional views taken along lines I-I' and II-II' of FIG. 6B.

According to an embodiment of the inventive concept, each of the first electrodes TE1-1 to TE1-5 includes first sensor parts SP1, first connection parts CP1, and first auxiliary sensor parts SSP1. Each of the second electrodes TE2-1 to TE2-4 includes second sensor parts SP2, second connection parts CP2, and second auxiliary sensor parts SSP2.

The first sensor parts SP1 are arranged in the second direction DR2, and the second sensor parts SP2 are arranged in the first direction DR1. Each of the first connection parts CP1 connects the first sensor parts SP1 adjacent to each other, and each of the second connection parts CP2 connects the second sensor parts SP2 adjacent to each other.

The first and second sensor parts SP1 and SP2 may include metals and have mesh shapes. The first and second connection parts CP1 and CP2 may also include metals and have mesh shapes. The first and second auxiliary sensor parts SSP1 and SSP2 may be respectively connected to the first and second sensor parts SP1 and SP2 and include transparent conductive oxide. Hereinafter, the input sensing unit ISU according to an embodiment of the inventive concept will be described in more detail with reference to the accompanying drawings.

As illustrated in FIGS. 7A, 7B, and 7E, the first and second auxiliary sensor parts SSP1 and SSP2 are disposed on the thin film encapsulation layer TFE. Also, the first connection parts CP1 are disposed on the thin film encapsulation layer TFE. The first connection parts CP1 are disposed between the first auxiliary sensor parts SSP1. In an embodiment of the inventive concept, the second connection parts CP2 instead of the first connection parts CP1 may be disposed on the thin film encapsulation layer TFE.

The first and second auxiliary sensor parts SSP1 and SSP2 may be formed through a process different from that for forming the first connection parts CP1. The first and second auxiliary sensor parts SSP1 and SSP2 may be formed by patterning a transparent conductive oxide layers through the photolithograph process after the transparent conductive oxide layer is formed. The first connection parts CP1 may be formed by patterning multilayer metal layers through the photolithograph process after the multilayer metal layers is formed. An order of forming the first connection parts CP1 and the auxiliary sensor parts SSP1 and SSP2 is not specifically limited.

Referring to FIG. 7B, first contact holes CH10 through which the first auxiliary sensor parts SSP1 are exposed, second contact holes CH20 through which the first connection parts CP1 are exposed, and third contact holes CH30 through which the second auxiliary sensor parts SSP2 are exposed are defined in the first insulation layer ISU-ILL FIG. 7B illustrates a plurality of emission areas PXA-R, PXA-G, and PXA-B spaced apart from each other and a non-emission area NPXA disposed on the plurality of emission areas PXA-R, PXA-G, and PXA-B, sometimes called red, green, and blue emission areas, respectively. The plurality of emission areas PXA-R, PXA-G, and PXA-B may correspond to the emission area PXA described with reference to FIG. 5. An organic light emitting diode generating red light may be disposed on the red emission area RXA-R, an organic light emitting diode generating green light may be disposed on the green emission area RXA-G, and an organic light emitting diode generating blue light may be disposed on the blue emission area PXA-B. An area of the emission area may be determined according to the color of the generated light.

The first and second auxiliary sensor parts SSP1 and SSP2 overlap the plurality of emission areas PXA-R, PXA-G, and PXA-B and the non-emission area NPXA. The first connection part CP1 and the contact holes CH10, CH20, and CH30 overlap the non-emission area NPXA.

As illustrated in FIGS. 7C, 7D, and 7E, the first and second sensor parts SP1 and SP2 overlapping the non-emission area NPXA are disposed on the first insulation layer ISU-IL1 Also, the second connection parts CP2 are disposed on the first insulation layer ISU-IL1 The second sensor parts SP2 and the second connection parts CP2, which are formed through the same photolithograph process may have an integrated shape. A plurality of mesh holes ISU-OPR, ISU-OPG, and ISU-OPB are defined in the first and second sensor parts SP1 and SP2. The plurality of mesh holes ISU-OPR, ISU-OPG, and ISU-OPB may one-to-one correspond to the emission areas PXA-R, PXA-G, and PXA-B.

The first sensor part SP1 and the first auxiliary sensor part SSP1, which overlap each other, are connected to each other through the first contact holes CH10, and the second sensor part SP2 and the second auxiliary sensor part SSP2, which overlap each other, are connected to each other through the third contact holes CH30. The first sensor part SP1 and the first connection part CP1 are connected to each other through the second contact holes CH20.

Although the mesh holes ISU-OPR, ISU-OPG, and ISU-OPB one-to-one correspond to the emission areas PXA-R, PXA-G, and PXA-B in the current embodiment, the embodiment of the inventive concept is not limited thereto. One mesh hole ISU-OPR, ISU-OPG, or ISU-OPB may correspond to at least two emission areas PXA-R, PXA-G, and PXA-B.

Although the emission areas PXA-R, PXA-G, and PXA-B have various surface areas, the embodiment of the inventive concept is not limited thereto. The emission areas PXA-R, PXA-G, and PXA-B may have the same size, and also, the mesh holes ISU-OPR, ISU-OPG, and ISU-OPB may have the same size.

In an embodiment of the inventive concept, the constitutions of the first conductive layer ISU-CL1 may be exchanged with those of the second conductive layer ISU-CL2. For example, the first sensor parts SP1, the second sensor parts SP2, and the second connection parts CP2 may be disposed below the first insulation layer ISU-IL1, and the first auxiliary sensor parts SSP1, the second auxiliary sensor parts SSP2, and the first connection parts CP1 may be disposed above the insulation layer ISU-IL1

As illustrated in FIG. 7F, signal lines SL2-1 and SL2-2 include first line parts SL2-11 and SL2-21 connected to the auxiliary sensor parts corresponding to the signal lines SL2-1 and SL2-2 and second line parts SL2-12 and SL2-22 connected to the corresponding sensor parts. Two second signal lines SL2-1 and SL2-2 are exemplarily illustrated in FIG. 7F. Hereinafter, the descriptions with respect to the second signal lines SL2-1 and SL2-2 may be equally applied to first signal lines SL1-1 to SL1-5 (not shown).

The first line parts SL2-11 and SL2-21 and the second line parts SL2-12 and SL2-22 may be connected to each other through a fourth contact hole CH40 passing through the first insulation layer ISU-IL1 Since the first line parts SL2-11 and SL2-21 and the second line parts SL2-12 and SL2-22 are connected to each other, the signal lines SL2-1 and SL2-2 may be reduced in resistance.

The first line parts SL2-11 and SL2-21 may be formed through the same process as that for forming the second auxiliary sensor parts SSP2 (see FIG. 7B). Thus, the first line parts SL2-11 and SL2-21 and the second auxiliary sensor parts SSP2 (see FIG. 7B) may have an integrated shape, include the same material, and have the same stacked structure. The second line parts SL2-12 and SL2-22 may be formed through the same process as that for forming the second sensor parts SP2 (see FIG. 7D). Thus, the second line parts SL2-12 and SL2-22 and the second sensor parts SP2 (see FIG. 7D) may have an integrated shape, include the same material, and have the same stacked structure.

However, the signal lines SL2-1 and SL2-2 according to an embodiment of the inventive concept are not limited to the structure of FIG. 7F. The signal lines SL2-1 and SL2-2 have only to include at least one of the first line parts SL2-11 and SL2-21 or the second line parts SL2-12 and SL2-22. In an embodiment of the inventive concept, the first insulation layer ISU-IL1 may not overlap the non-display area NDA (see FIG. 6B), and the first line parts SL2-11 and SL2-21 and the second line parts SL2-12 and SL2-22 may not directly contact each other.

In the input sensing unit ISU described with reference to FIGS. 7A to 7F according to an embodiment of the inventive concept, each of the electrodes may include the auxiliary sensor parts connected to the sensor parts to increase a variation in capacitance. The variation in capacitance may be a difference in capacitance before and after the sensing event occurs. Since the variation in capacitance increases, the input sensing unit ISU may even detect the fine sensing event.

In an embodiment of the inventive concept, one of the first and second auxiliary sensor parts SSP1 and SSP2 may be omitted. Also, although the first and second auxiliary sensor parts SSP1 and SSP2 are included in the corresponding electrode, the first and second auxiliary sensor parts SSP1 and SSP2 may be defined as a separate electrode (for example, an auxiliary electrode) that is distinguished from the electrode.

Figure 8A:
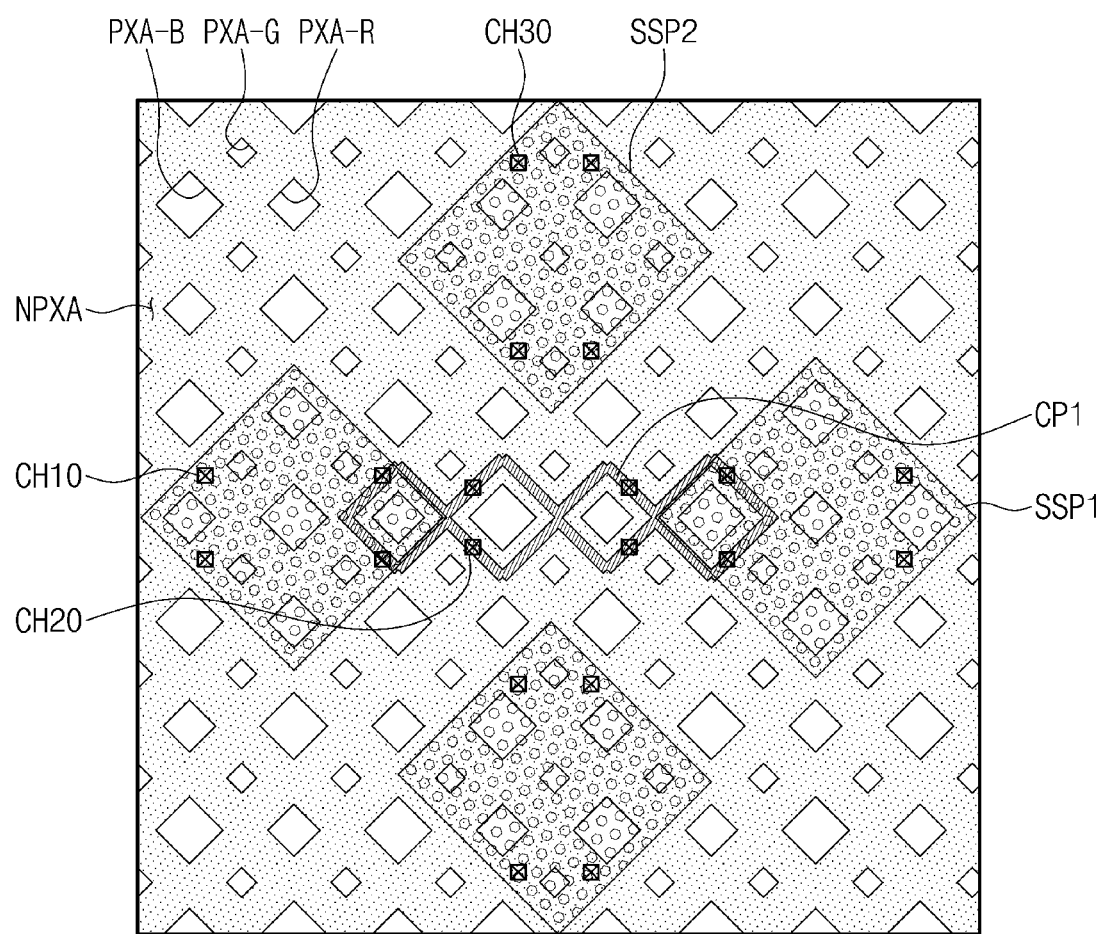
FIGS. 8A and 8B are plan views illustrating the first conductive layer of the input sensing unit according to an embodiment of the inventive concept.
Figure 8B:
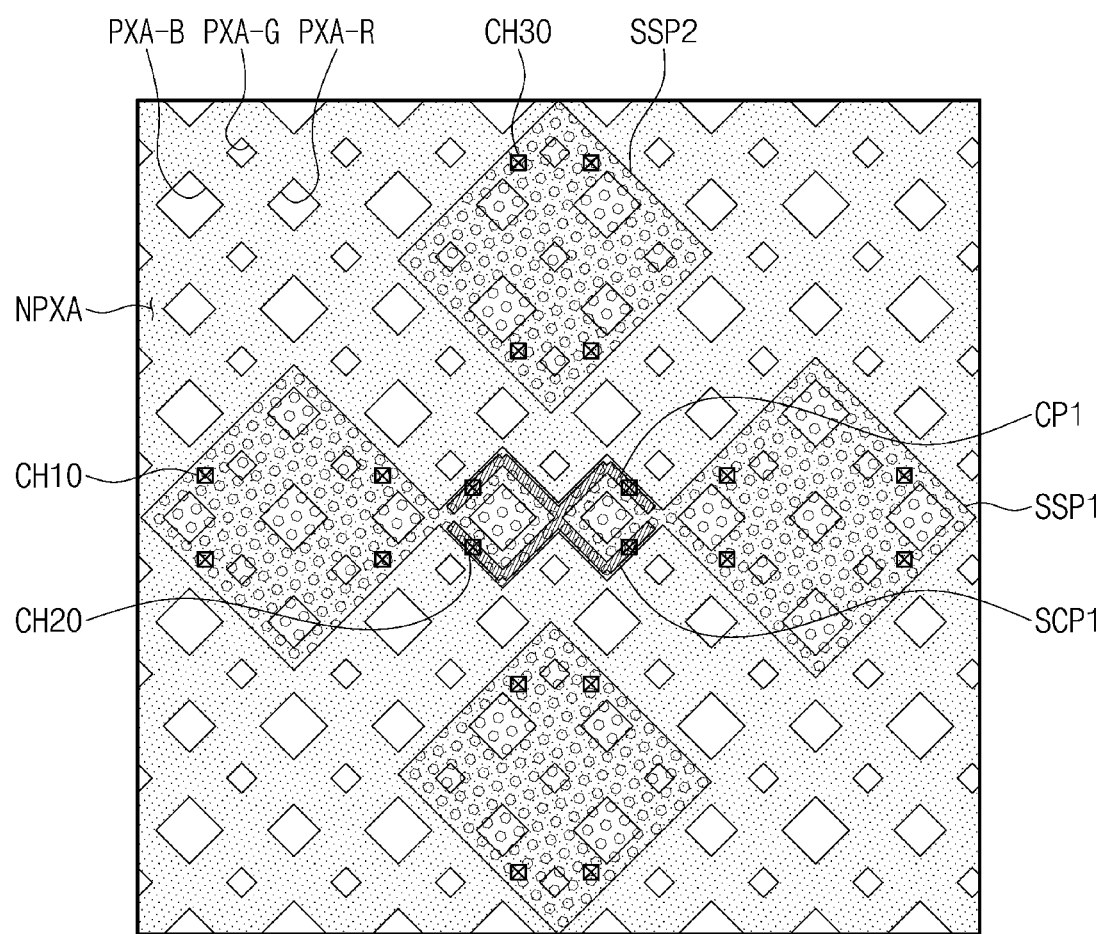

FIGS. 8A and 8B are plan views illustrating the first conductive layer of the input sensing unit ISU according to an embodiment of the inventive concept. Hereinafter, differences of the input sensing unit ISU will be mainly described with reference to FIGS. 7A to 7F. FIGS. 8A and 8B are plan views of a plane corresponding to FIG. 7B.

As illustrated in FIG. 8A, the connection part CP1 may contact the first auxiliary sensor parts SSP1. Thus, the first electrode may be reduced in resistance. An order of stacking the first connection part CP1 and the first auxiliary sensor parts SSP1 is not specifically limited.

As illustrated in FIG. 8B, the first electrode may further include an auxiliary connection part SCP1 connecting the first auxiliary sensor parts SSP1 to each other. Also, the auxiliary connection part SCP1 may overlap the emission area PXA and the non-emission area NPXA. The first auxiliary sensor parts SSP1 and the auxiliary connection part SCP1 may be formed through the same process and have an integrated shape.

The first connection part CP1 overlaps the auxiliary connection part SCP1. The first connection part CP1 may be disposed inside the auxiliary connection part SCP1.

Figure 9A:
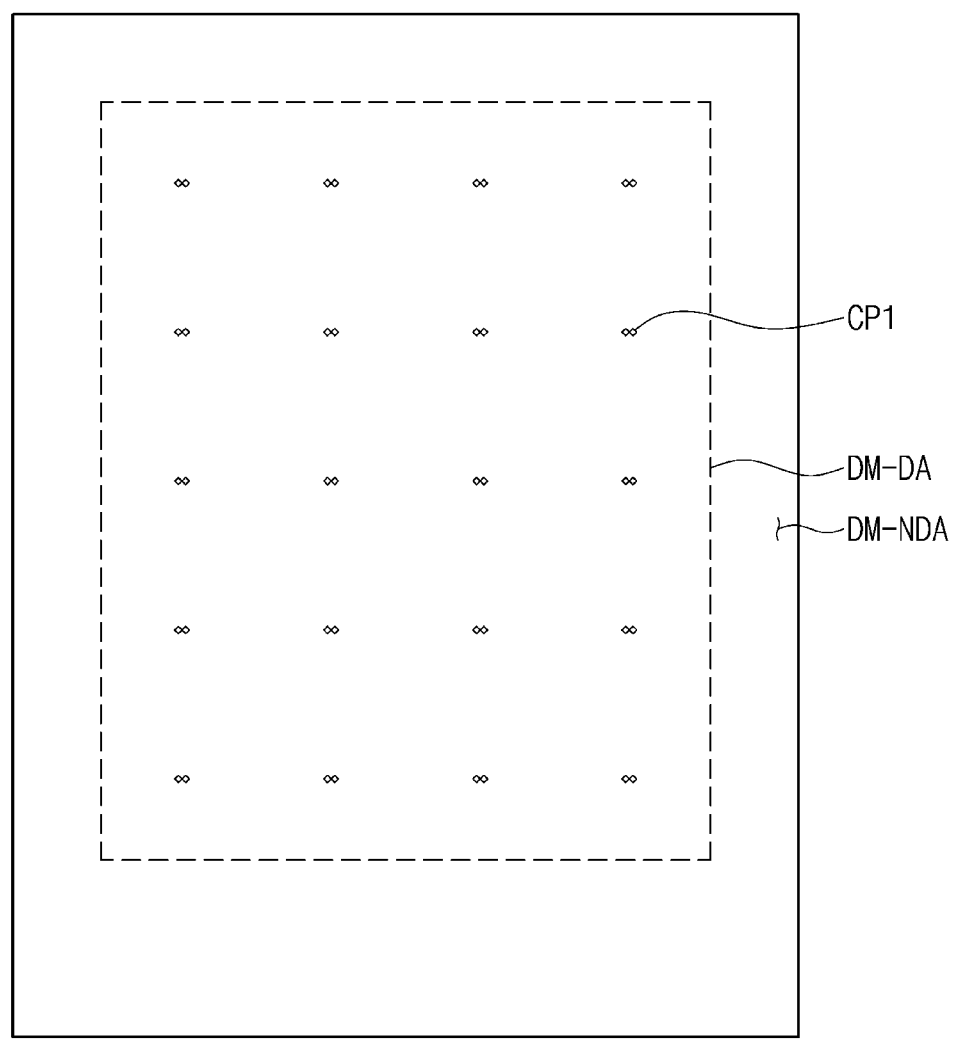
FIG. 9A is a plan view illustrating the first conductive layer of the input sensing unit according to an embodiment of the inventive concept.
Figure 9B:
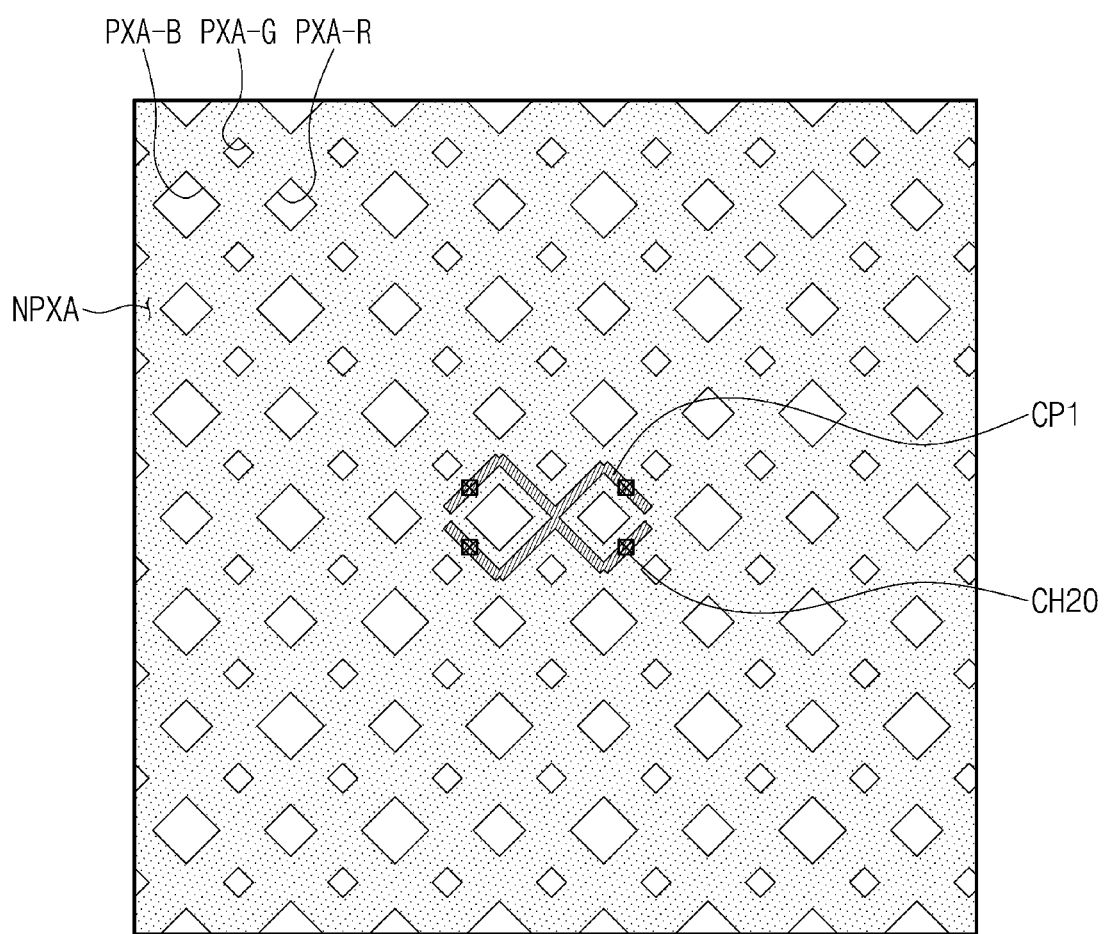
FIG. 9B is a partial plan view of the input sensing unit according to an embodiment of the inventive concept.
Figure 9C:
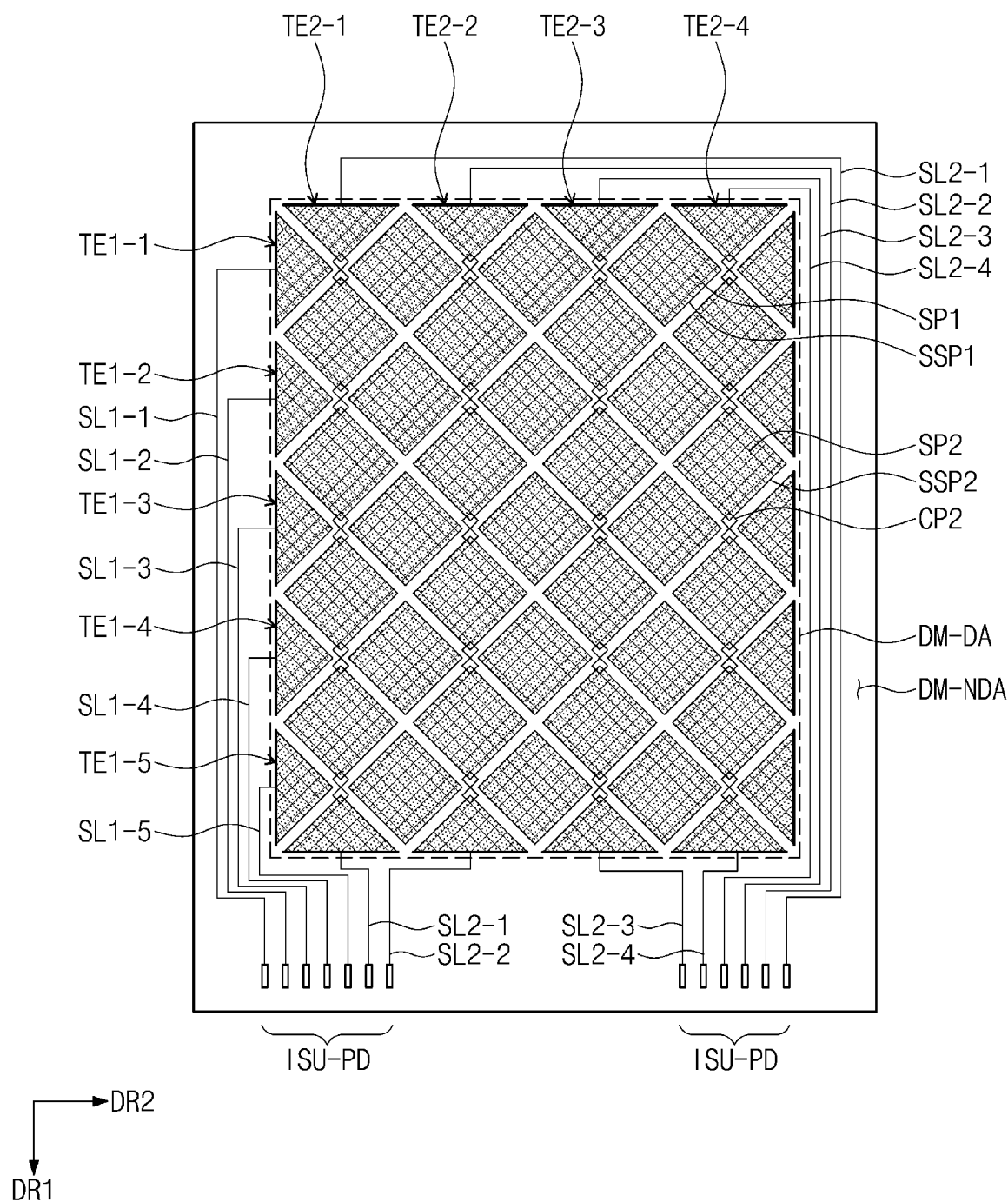
FIG. 9C is a plan view illustrating the second conductive layer of the input sensing unit according to an embodiment of the inventive concept.
Figure 9D:
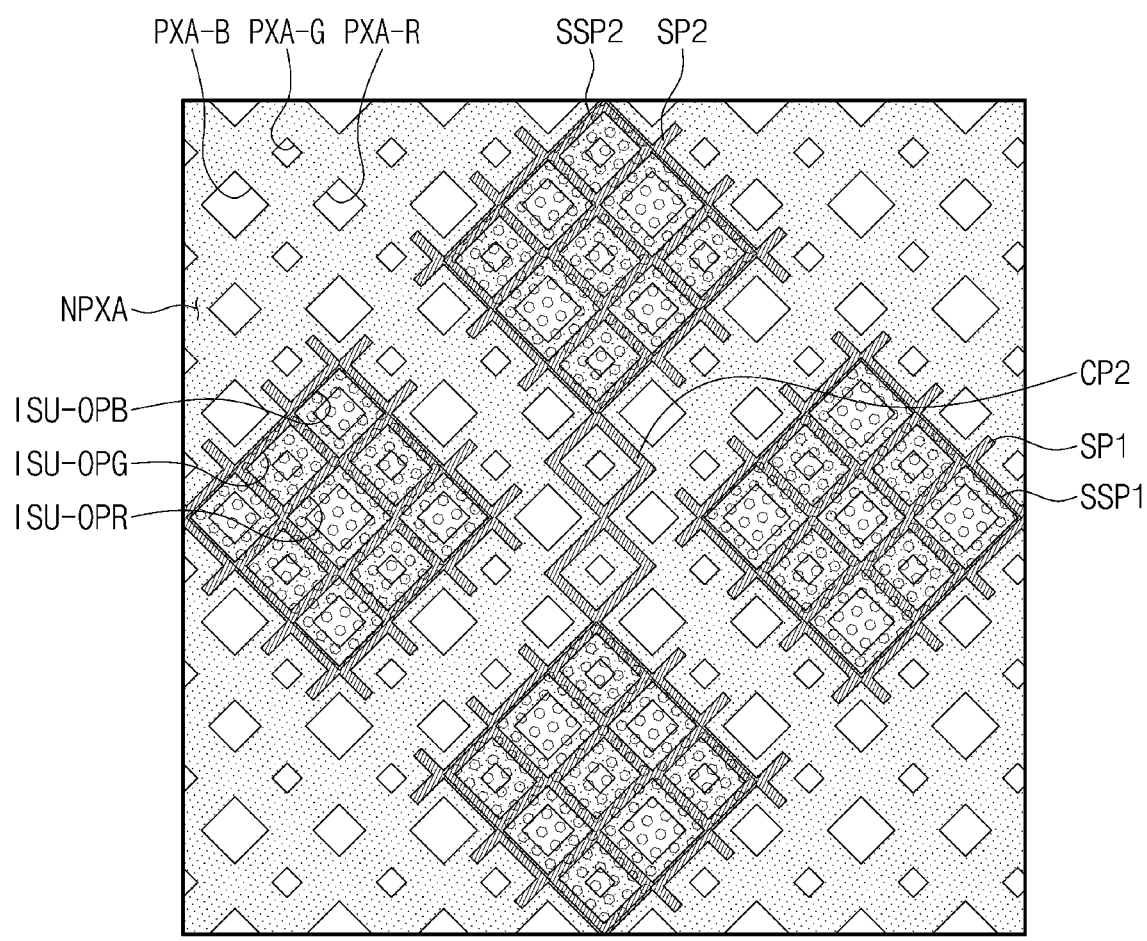
FIG. 9D is a partial plan view of the input sensing unit according to an embodiment of the inventive concept.
Figure 9E:
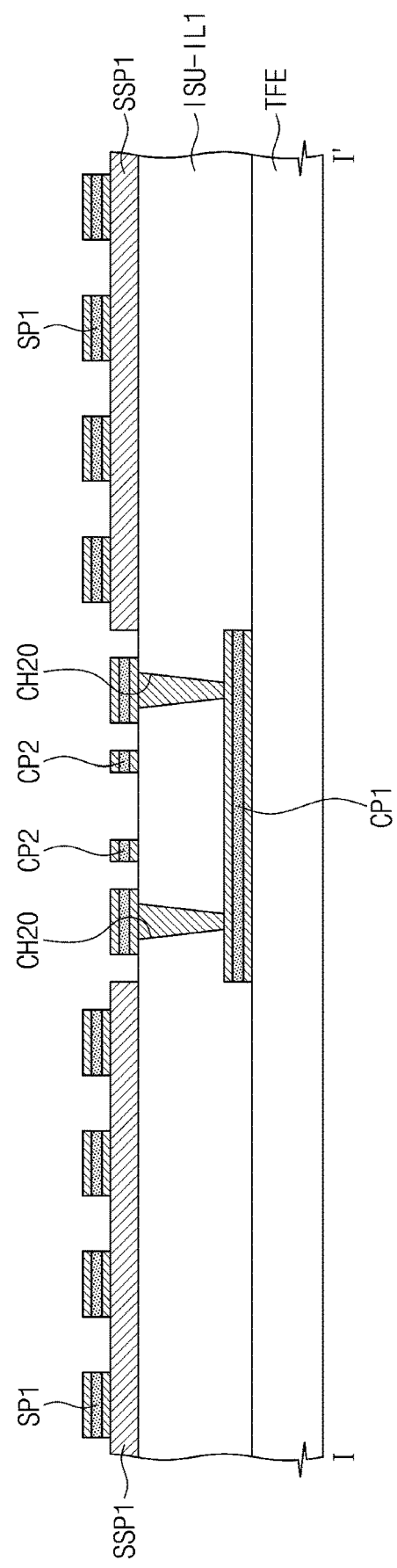
FIGS. 9E and 9F are cross-sectional views of the input sensing unit according to an embodiment of the inventive concept.
Figure 9F:
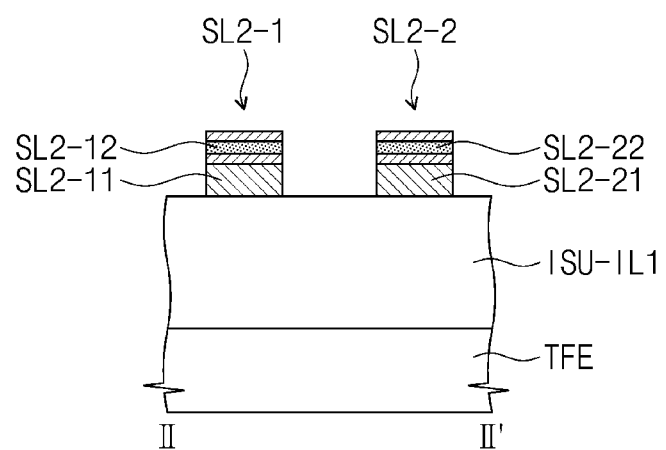

FIG. 9A is a plan view illustrating the first conductive layer of the input sensing unit ISU according to an embodiment of the inventive concept. FIG. 9B is a partial plan view of the input sensing unit ISU according to an embodiment of the inventive concept. FIG. 9C is a plan view illustrating the second conductive layer of the input sensing unit ISU according to an embodiment of the inventive concept. FIG. 9D is a partial plan view of the input sensing unit ISU according to an embodiment of the inventive concept. FIGS. 9E to 9F are cross-sectional views of the input sensing unit ISU according to an embodiment of the inventive concept. Hereinafter, differences of the input sensing unit ISU will be mainly described with reference to FIGS. 7A to 7F.

As illustrated in FIGS. 9A, 9B, and 9E, the first connection parts CP1 are disposed on the thin film encapsulation layer TFE. The first connection parts CP1 overlap the non-emission area NPXA. The first connection parts CP1 do not overlap the emission areas PXA-R, PXA-G, and PXA-B. The second contact holes CH20 through which the first connection pats CP1 are exposed are defined in the first insulation layer ISU-IL1.

As illustrated in FIGS. 9C, 9D, and 9E, the first sensor parts SP1, the second sensor parts SP2, and the connection parts CP2, which overlap the non-emission area NPXA, are disposed on the first insulation layer ISU-ILL Also, the first auxiliary sensor parts SSP1 and the second auxiliary sensor parts SSP2 are disposed on the first insulation layer ISU-ILL In an embodiment of the inventive concept, the first auxiliary sensor parts SSP1 and the second auxiliary sensor parts SSP2 may be directly disposed on the thin film encapsulation layer TFE. The first sensor parts SP1 and the second sensor parts SP2 are disposed on the first auxiliary sensor parts SSP1 and the second auxiliary sensor parts SSP2, respectively. The first sensor parts SP1 may contact the first auxiliary sensor parts SSP1, and the second sensor parts SP2 may contact the second auxiliary sensor parts SSP2. The first and second auxiliary sensor parts SSP1 and SSP2 may contact the first insulation layer ISU-IL1 and be disposed between the first insulation layer ISU-IL1 and the first sensor parts SP1 and between the first insulation layer ISU-IL1 and the second sensor parts SP2.

Each of outer edges of the first and second auxiliary sensor parts SSP1 and SSP2 is disposed inside the corresponding sensor part. A portion of the first and second sensor parts SP1 and SP2 may not overlap the corresponding auxiliary sensor part.

As illustrated in FIG. 9F, signal lines SL2-1 and SL2-2 include first line parts SL2-11 and SL2-21 connected to the auxiliary sensor parts corresponding to the signal lines SL2-1 and SL2-2 and second line parts SL2-12 and SL2-22 connected to the corresponding sensor parts. The first line parts SL2-11 and SL2-21 are disposed on the first insulation layer ISU-IL, and the second line parts SL2-12 and SL2-22 are directly disposed on the first line parts SL2-11 and SL2-21.

Figure 10:
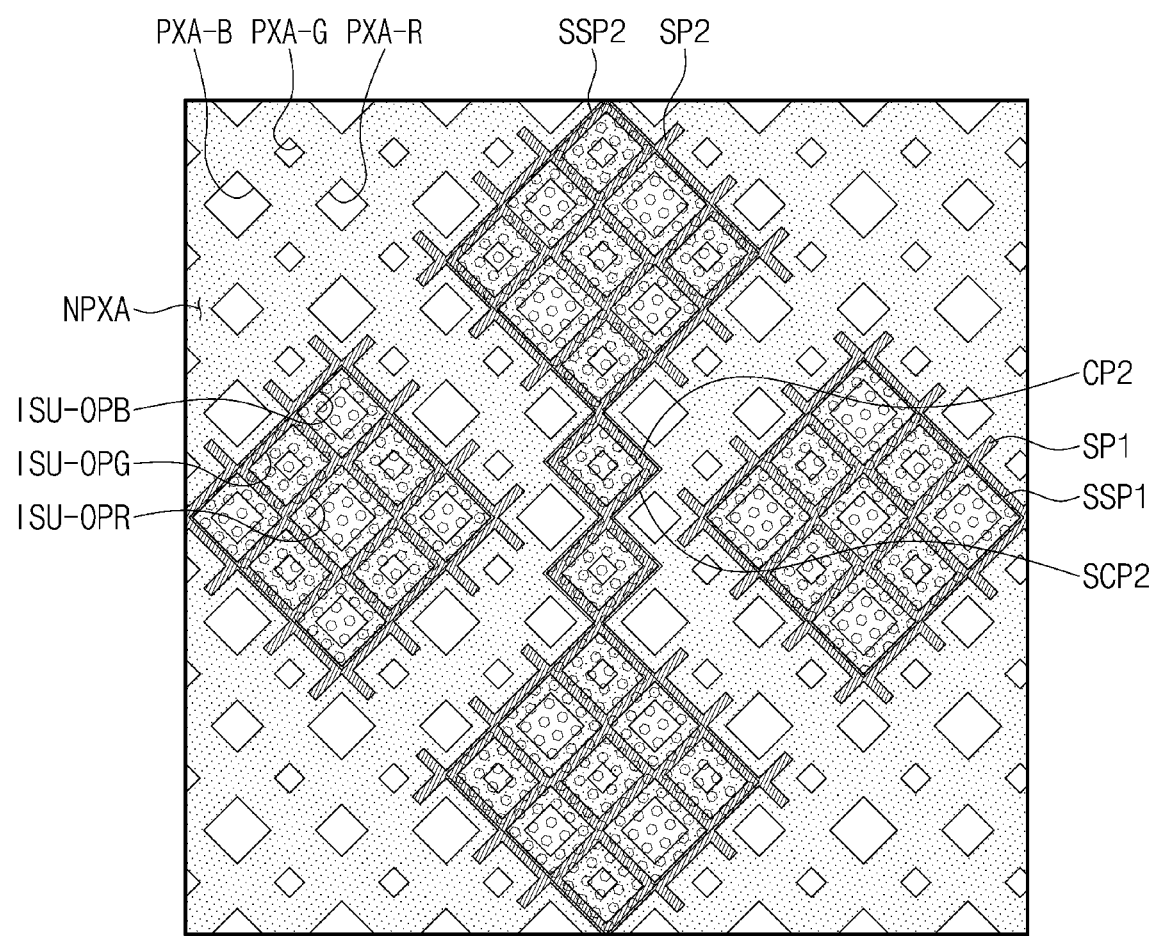
FIG. 10 is a partial plan view of the input sensing unit according to an embodiment of the inventive concept.
Figure 11:
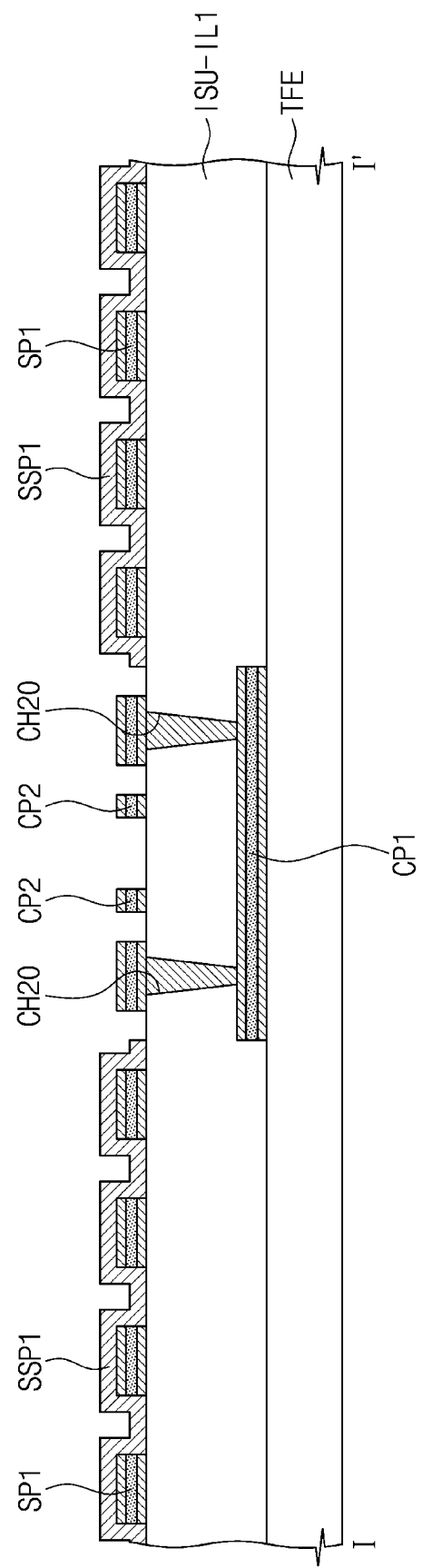
FIG. 11 is a cross-sectional view of the input sensing unit according to an embodiment of the inventive concept.

FIG. 10 is a partial plan view of the input sensing unit ISU according to an embodiment of the inventive concept. FIG. 11 is a cross-sectional view of the input sensing unit ISU according to an embodiment of the inventive concept. Hereinafter, differences of the input sensing unit ISU will be mainly described with reference to FIGS. 9A to 9F. FIG. 10 illustrates a plan view corresponding to FIG. 9D, and FIG. 11 illustrates a cross-sectional view corresponding to FIG. 9E.

As illustrated in FIG. 10, the second electrode may further include an auxiliary connection part SCP2 connecting the second auxiliary sensor parts SSP2 to each other. Also, the auxiliary connection part SCP2 may overlap the emission area PXA and the non-emission area NPXA. The second auxiliary sensor parts SSP2 and the auxiliary connection part SCP2 may be formed through the same process and have an integrated shape.

The second connection part CP2 overlaps the auxiliary connection part SCP2. The second connection part CP2 may be disposed inside the auxiliary connection part SCP2.

As illustrated in FIG. 11, the first sensor parts SP1 may be directly disposed on the first insulation layer ISU-ILL The first auxiliary sensor parts SSP1 are disposed on the first sensor parts SP1. The first auxiliary sensor parts SSP1 may contact the first sensor parts SP1. The first sensor parts SP1 are disposed between the first insulation layer ISU-IL1 and the first auxiliary sensor parts SSP1.

Although not shown, the second sensor parts SP2 may also be directly disposed on the thin film encapsulation layer TFE, like the first sensor parts SP1. The second auxiliary sensor parts SSP2 are disposed on the second sensor parts SP2. The second auxiliary sensor parts SSP2 may contact the second sensor parts SP2. The second sensor parts SP2 are disposed between the thin film encapsulation layer TFE and the second auxiliary sensor parts SSP2.

The first auxiliary sensor parts SSP1 and the second auxiliary sensor parts SSP2 may completely cover or partially expose the first sensor parts SP1 and the second sensor parts SP2. Since the first auxiliary sensor parts SSP1 and the second auxiliary sensor parts SSP2 are formed later than the first sensor part SP1 and the second sensor parts SP2, damage of the auxiliary sensor parts, which may occur during the formation process of the sensor parts, may be prevented from occurring.

Figure 12A:
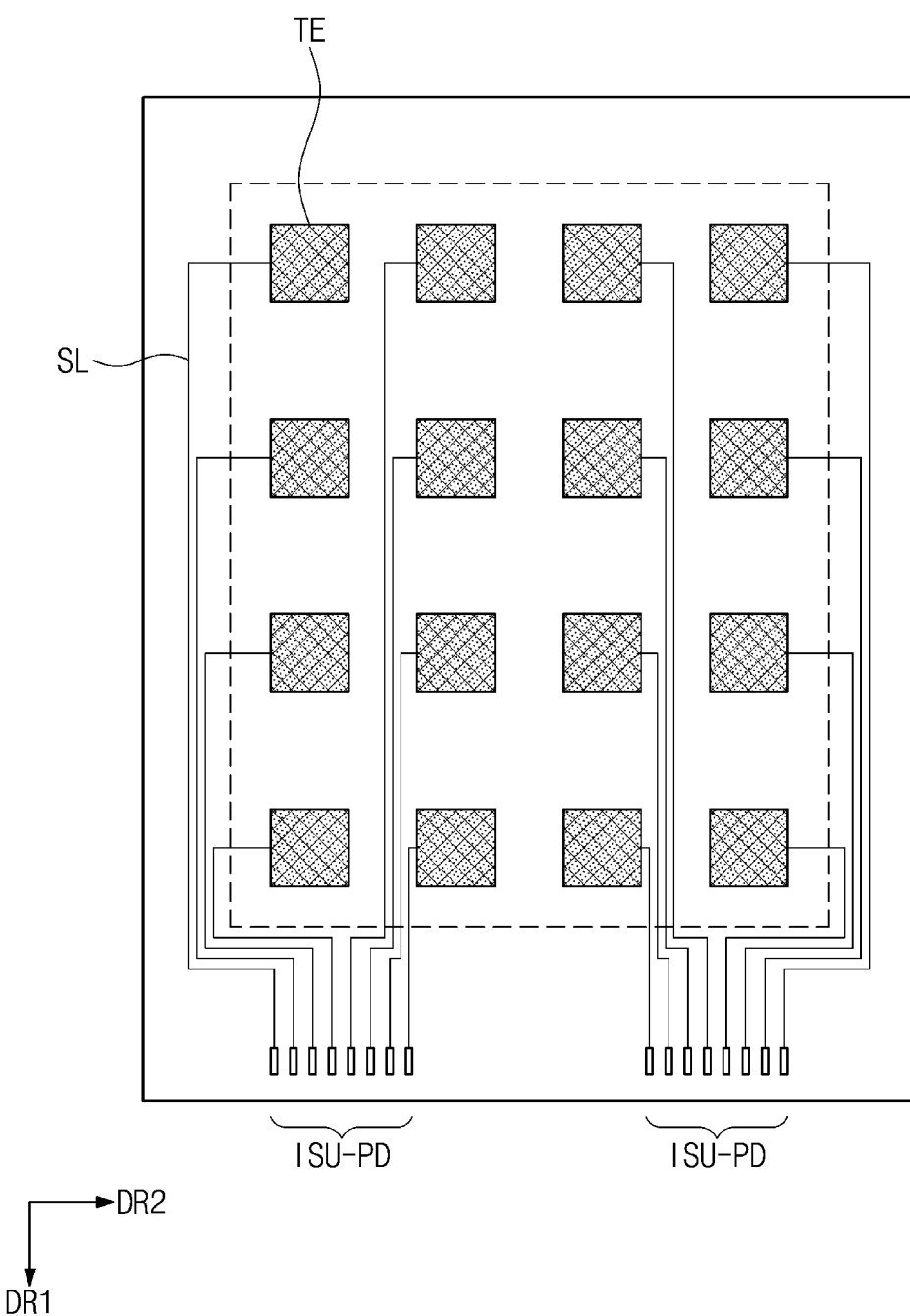
FIG. 12A is a plan view of the input sensing unit according to an embodiment of the inventive concept.
Figure 12B:
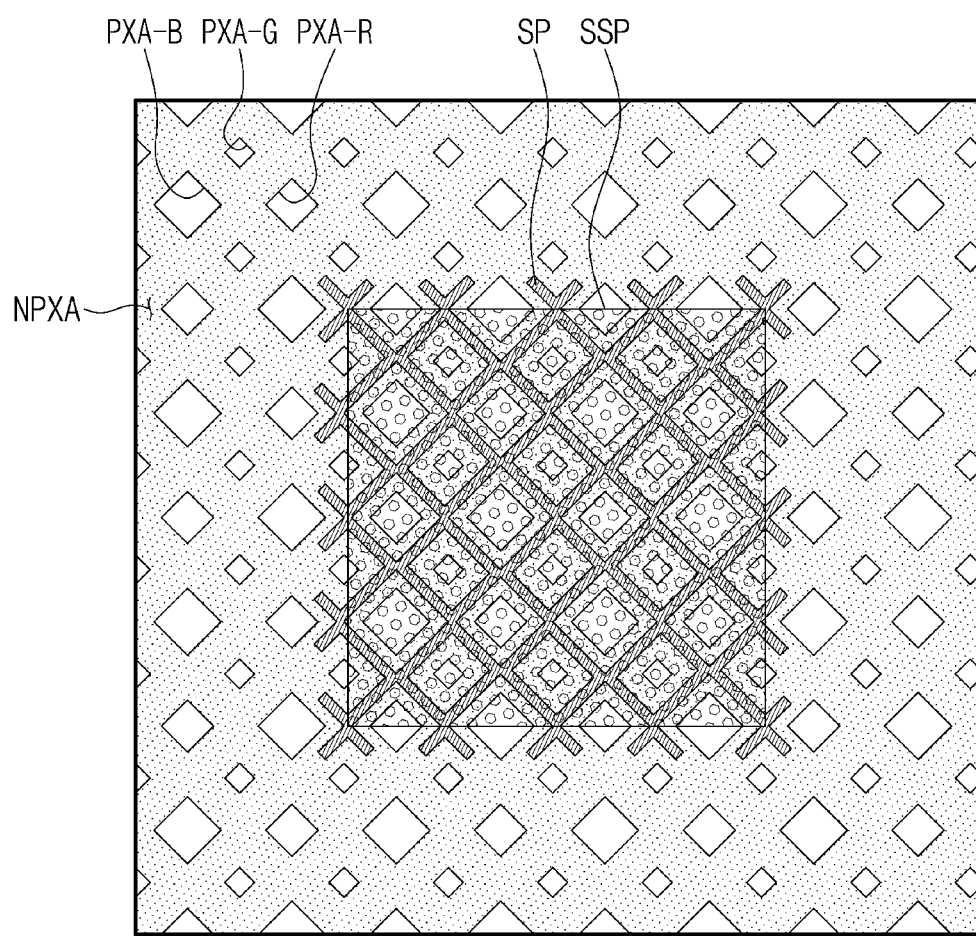
FIG. 12B is a partial enlarged plan view of the input sensing unit according to an embodiment of the inventive concept.
Figure 12C:
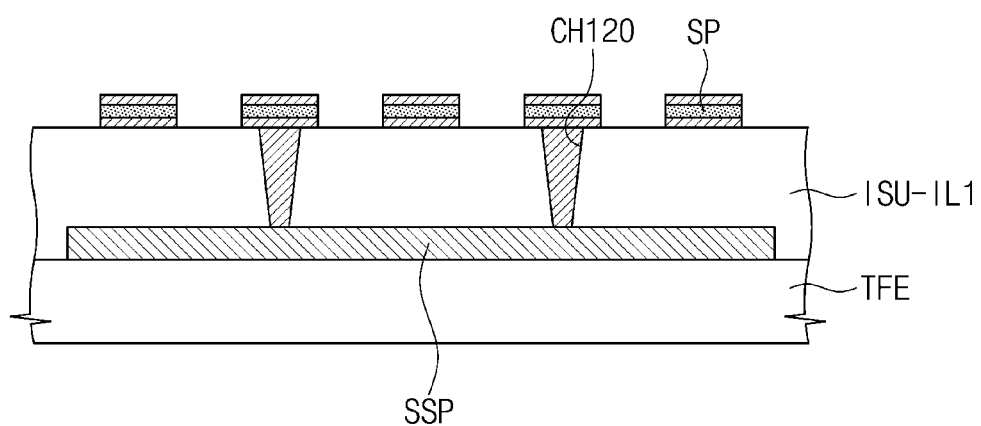
FIGS. 12C, 12D, and 12E are partial cross-sectional views of the input sensing unit according to an embodiment of the inventive concept.
Figure 12D:
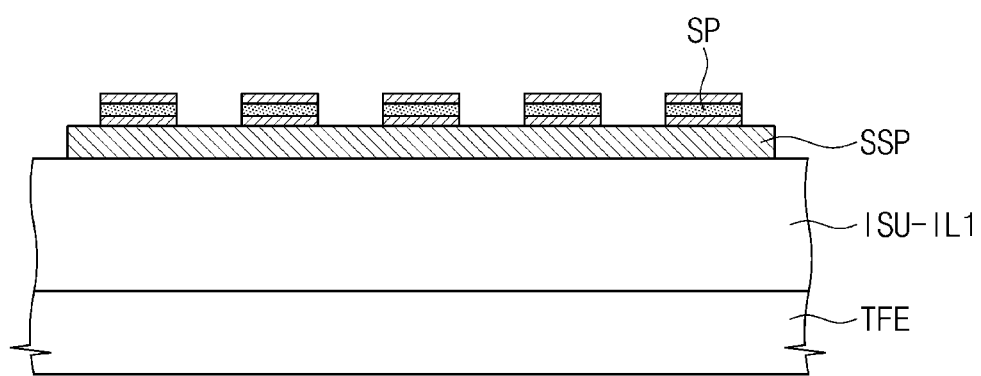
Figure 12E:
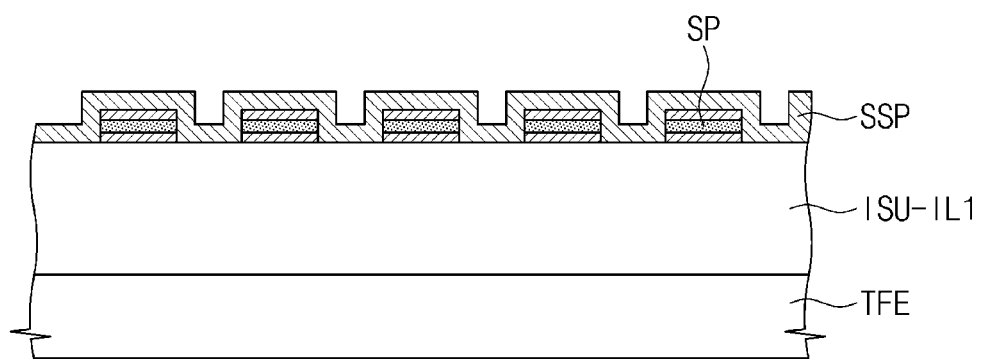

FIG. 12A is a plan view of the input sensing unit ISU according to an embodiment of the inventive concept. FIG. 12B is a partial enlarged plan view of the input sensing unit ISU according to an embodiment of the inventive concept. FIGS. 12C to 12E are partial cross-sectional views of the input sensing unit ISU according to an embodiment of the inventive concept. Hereinafter, detailed descriptions with respect to the same constituent as that described with reference to FIGS. 1 to 11 will be omitted.

As illustrated in FIG. 12A, the input sensing unit ISU may include a plurality of electrodes TE and a plurality of signal lines SL. Each of the plurality of electrodes TE has proper coordinate information. For example, the electrodes TE may be arranged in the form of a matrix and respectively connected to the signal lines SL. The embodiment of the inventive concept is not particularly limited to the shape and arrangement of the electrodes TE. A portion of the signal lines SL may be disposed on the display area DM-DA, and a portion of the signal lines SL may be disposed on the non-display area DM-NDA. The input sensing unit ISU may acquire coordinate information in a self-capacitance manner.

As illustrated in FIG. 12B, the input sensing unit ISU may include auxiliary sensor parts SSP respectively overlapping a plurality of emission areas PXA-R, PXA-G, and PXA-B. Each of the auxiliary sensor parts SSP includes transparent conductive oxide. Each of the auxiliary sensor parts SSP are connected to the corresponding sensor part of the sensor parts SP.

The sensor parts SP overlap the non-emission area NPXA. The auxiliary sensor parts SSP overlap the non-emission area NPXA and the emission areas PXA-R, PXA-G, and PXA-B.

As illustrated in FIG. 12C, the auxiliary sensor parts SSP may be disposed on the thin film encapsulation layer TFE, and the sensor parts SP may be disposed on the first insulation layer ISU-IL1. The auxiliary sensor parts SSP and the sensor parts SP may be connected to each other through contact holes CH120 passing through the first insulation layer ISU-ILL Although not particularly shown, the signal lines SL of FIG. 12A may include first line parts SL2-11 and SL2-21 and second lines parts SL2-12 and SL2-22 as illustrated in FIG. 7F. The embodiment of the inventive concept is not limited thereto. For example, the signal lines SL have only to include at least one of the first line parts SL2-11 and SL2-21 or the second line parts SL2-12 and SL2-22. The signal lines SL disposed on the display area DM-DA may overlap the non-emission area NPXA and have a mesh shape.

As illustrated in FIG. 12D, the auxiliary sensor parts SSP may be disposed on the first insulation layer ISU-ILL The sensor parts SP may be directly disposed on the auxiliary sensor parts SSP. The sensor parts SP may be disposed inside the auxiliary sensor parts SSP, and a portion of the sensor parts SP may be disposed outside the auxiliary sensor parts SSP. Although not particularly shown, the signal lines SL may include first line parts SL2-11 and SL2-21 and second lines parts SL2-12 and SL2-22 as illustrated in FIG. 7F.

As illustrated in FIG. 12E, the sensor parts SP may be disposed on the first insulation layer ISU-IL1. The auxiliary sensor parts SSP may be directly disposed on the sensor parts SP. The auxiliary sensor parts SSP may completely cover the sensor parts SP or expose a portion of the sensor parts SP. Although not particularly shown, the signal lines SL may include first line parts SL2-11 and SL2-21 and second lines parts SL2-12 and SL2-22, which are illustrated in FIG. 9F, but the stacked order may be contrary thereto.

Figure 13A:
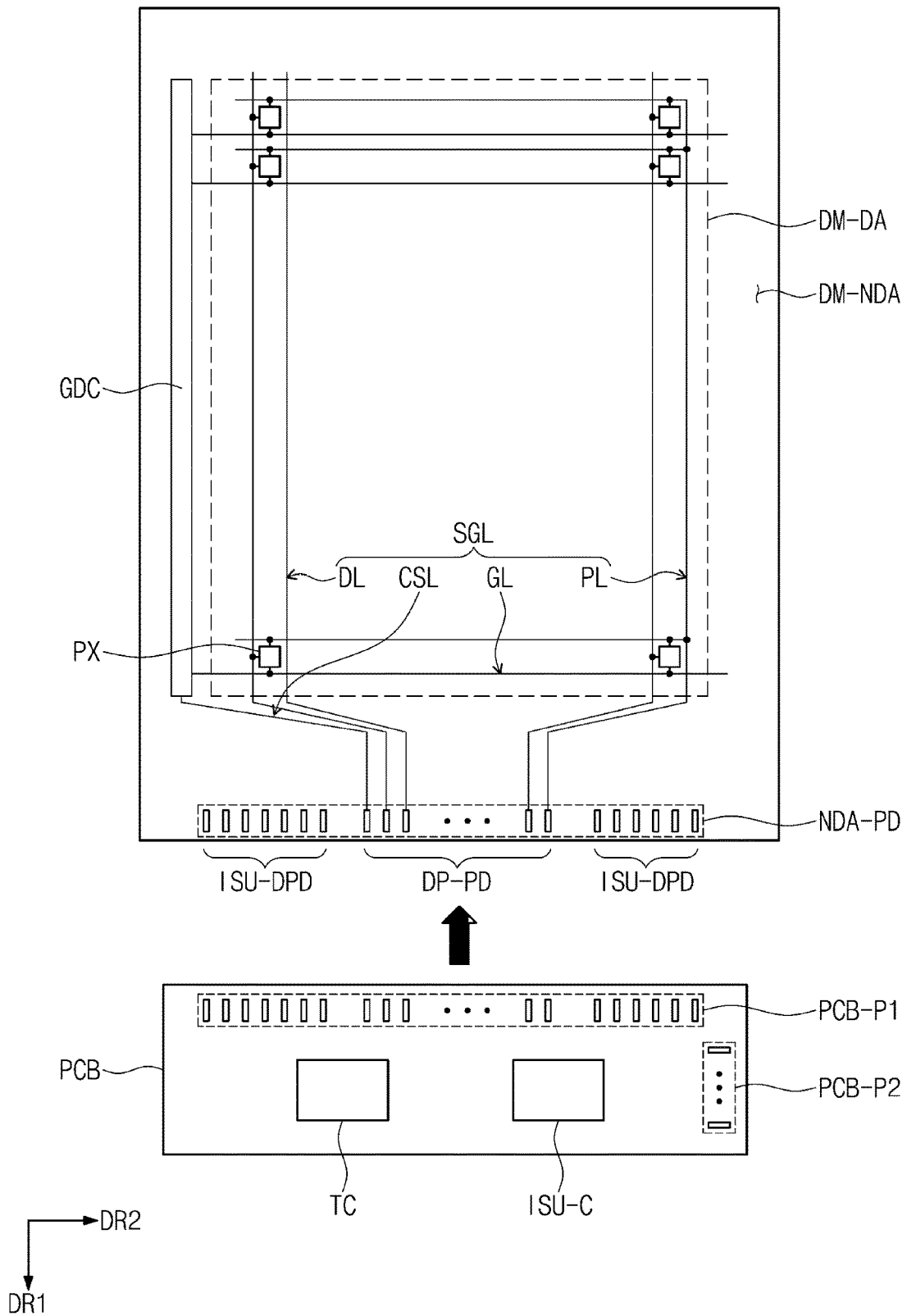
FIG. 13A is a plan view of the display panel according to an embodiment of the inventive concept.
Figure 13B:
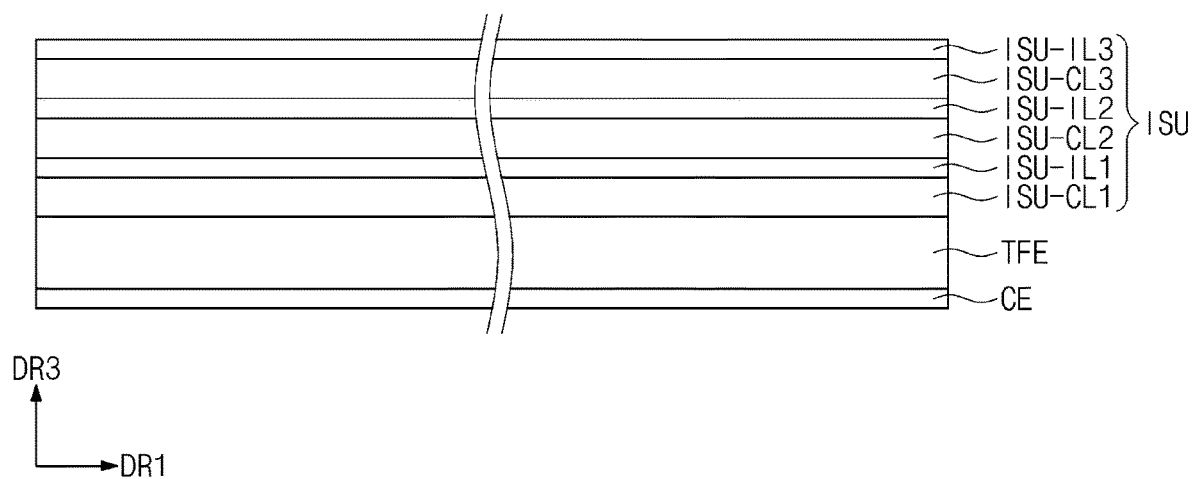
FIG. 13B is a cross-sectional view illustrating the input sensing unit according to an embodiment of the inventive concept.
Figure 13C:
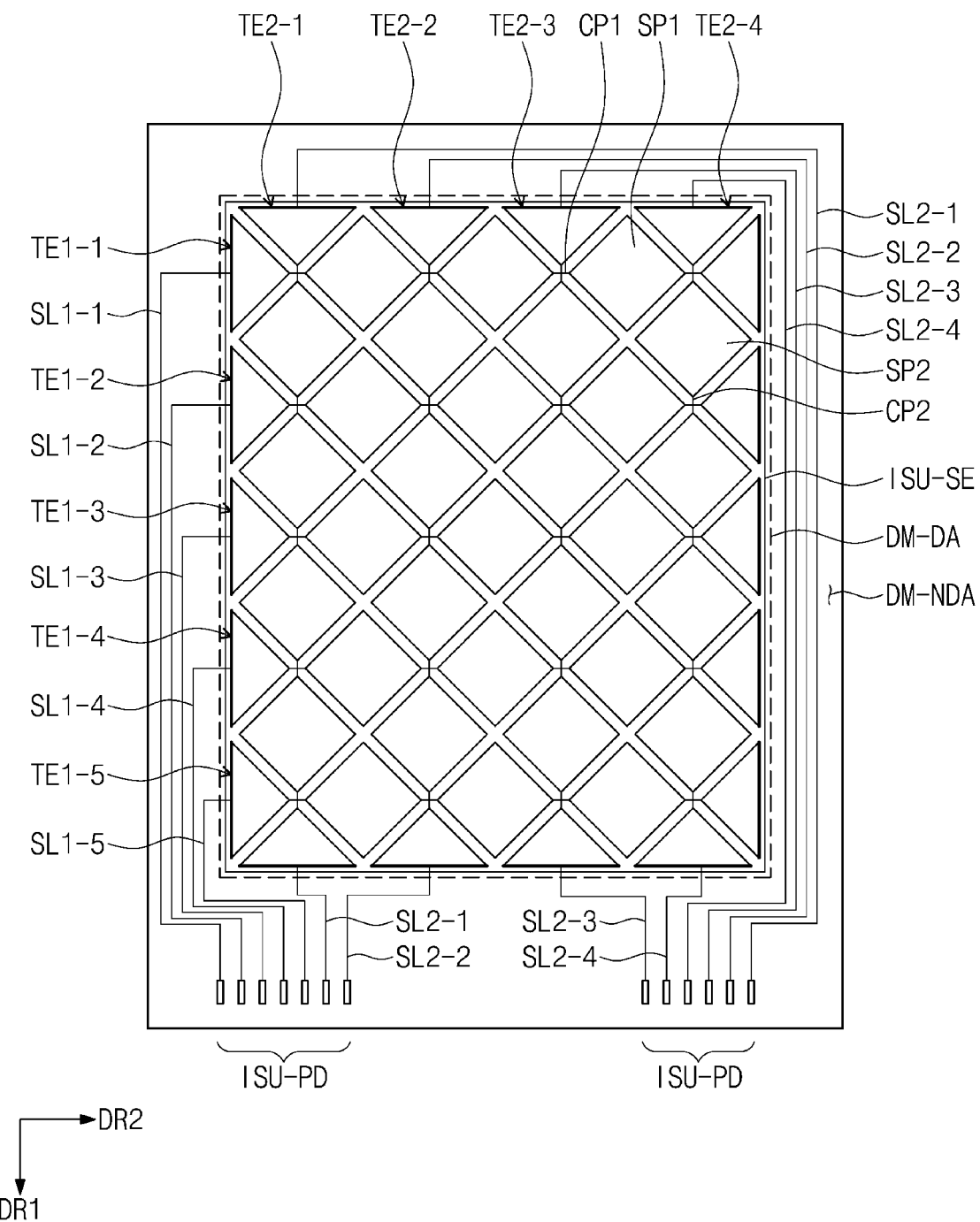
FIG. 13C is a plan view of the input sensing unit according to an embodiment of the inventive concept.

FIG. 13A is a plan view of the display panel DP according to an embodiment of the inventive concept. FIG. 13B is a cross-sectional view illustrating the input sensing unit ISU according to an embodiment of the inventive concept. FIG. 13C is a plan view of the input sensing unit ISU according to an embodiment of the inventive concept. FIG. 13B illustrates the second electrode CE and the thin film encapsulation layer TFE as the constitutions of the display panel DP (see FIG. 5). Hereinafter, detailed descriptions with respect to the same constituent as that described with reference to FIGS. 1 to 12E will be omitted.

Referring to FIG. 13A, the circuit board PCB may include a first circuit board pads PCB-P1 electrically connected to the display panel DP and a second circuit board pads PCB-P2 electrically connected to the input sensing unit ISU. Although not shown, the circuit board PCB further includes first signal lines connecting the first circuit board pads PCB-P1 to the timing control circuit and/or the input sensing circuit ISU-C and second signal lines connecting the second circuit board pads PCB-P2 to the input sensing circuit ISU-C.

In this embodiment, a portion of the first circuit board pads PCB-P1 may be connected to one of first conductive patterns of the second conductive layer ISU-CL2 and second conductive patterns of a third conductive layer ISU-CL3 of the input sensing unit ISU, which will be described below. The second circuit board pads PCB-P2 may be connected to the other of the first conductive patterns of the second conductive layer ISU-CL2 and the second conductive patterns of the third conductive layer ISU-CL3 of the input sensing unit ISU.

As illustrated in FIG. 13B, the input sensing unit ISU includes a first conductive layer ISU-CL1, a first insulation layer ISU-IL1, a second conductive layer ISU-CL2, the second insulation layer ISU-IL2, and a third insulation layer ISU-IL3. In this embodiment, the first conductive layer ISU-CL1 may be directly disposed on the thin film encapsulation layer TFE. The embodiment of the inventive concept is not limited thereto. For example, another inorganic layer or organic layer of the display panel DP may be further disposed between the first conductive layer ISU-CL1 and the thin film encapsulation layer TFE. In this embodiment, the third insulation layer ISU-IL3 may be omitted, and an optical member or an adhesion layer may be substituted for the protection function of the third insulation layer ISU-IL3.

The second conductive layer ISU-CL2 and the third conductive layer ISU-CL3 of FIG. 13B may correspond to the first conductive layer ISU-CL1 and the second conductive layer ISU-CL2 of FIG. 6A, respectively. Each of the first conductive layer ISU-CL1 and the third conductive layer ISU-CL3 may have a single layer structure or a multi-layer structure in which a plurality of layers are stacked in the third directional axis DR3. The conductive layer having the single layer structure may include a metal layer or a transparent conductive layer. The metal layer may include molybdenum, silver, titanium, copper, aluminum, and an alloy thereof. The transparent conductive layer may include transparent conductive oxide such as indium tin oxide (ITO), indium zinc oxide (IZO), zinc oxide (ZnO), and indium tin zinc oxide (ITZO). In addition, the transparent conductive layer may include PEDOT, a metal nano wire, and graphene.

The conductive layer having the multilayer structure may include multilayer metal layers. The multilayer metal layers may have a 3-layer structure of titanium/aluminum/titanium. The conductive layer having the multilayer structure may include at least one metal layer and at least one transparent conductive layer.

Each of the second and third conductive layers ISU-CL2 and ISU-CL3 may include a plurality of patterns. Hereinafter, an example in which the second conductive layer ISU-CL2 includes first conductive patterns, and the third conducive layer ISU-CL3 includes second conductive patterns will be described. Each of the first and second conductive patterns may include electrodes and signal lines. The first conductive layer ISU-CL1 includes an electrode having a surface area relatively larger than that of each of the first and second conductive patterns. Detailed descriptions of the first to third conductive layers ISU-CL1 to ISU-CL3 will be described below.

Each of the first to third insulation layers ISU-IL1 to ISU-IL3 may include an inorganic or organic material. At least one of the first insulation layer ISU-IL1 to third insulation layer ISU-IL3 may include an inorganic film. The inorganic film may include at least one of oxide, titanium oxide, silicon oxide, silicon oxide nitride, zirconium oxide, or hafnium oxide.

At least one of the first to third insulation layers ISU-IL1 to ISU-IL3 may include an organic film. The organic film may include at least one of an acrylic-based resin, a methacrylic-based resin, a polyisoprene-based resin, a vinyl-based resin, an epoxy-based resin, a urethane-based resin, a cellulose-based resin, a siloxane-based resin, a polyimide-based resin, a polyamide-based resin, or a perylene-based resin.

As illustrated in FIG. 13C, the input sensing unit ISU may include a noise shield electrode ISU-SE, first electrodes TE-1 to TE1-5, first signal lines SL1-1 to SL1-5 connected to the first electrodes TE-1 to TE1-5, second electrode TE2-1 to TE2-4, second signal lines SL2-1 to SL2-4 connected to the second electrode TE2-1 to TE2-4, and sensing signal pads ISU-PD connected to the first signal lines SL1-1 to SL1-5 and the second signal lines SL2-1 to SL2-4.

The first electrode TE1-1 to TE1-5 and the second electrode TE2-1 and TE2-4 cross each other. The first electrodes TE1-1 to TE1-5 are arranged in the first direction DR1 and extend in the second direction DR2. The external input may be sensed in a mutual capacitance manner or a self-capacitance manner.

Each of the first electrodes TE1-1 to TE1-5 includes first sensor parts SP1 and first connection parts CP1. Each of the second electrodes TE2-1 to TE2-4 includes second sensor parts SP2 and second connection parts CP2. Each of two first sensor parts, which are disposed on both ends, of the first sensor parts may have a size less by about ½ than that of the first senor part disposed at a center. Each of two second sensor parts, which are disposed on both ends, of the six second sensor parts SP2 may have a size less by about ½ than that of the second sensor part disposed at a center.

Although the first electrodes TE1-1 to TE1-5 and the second electrodes TE2-1 to TE2-4 according to an embodiment are illustrated in FIG. 13C, the embodiment of the inventive concept is not limited to the shape of each of the electrodes. In an embodiment of the inventive concept, a connection part of each of the first electrodes TE1-1 to TE1-5 and the second electrodes TE2-1 to TE2-4 may have the same shape as that of the sensor part.

The first sensor parts SP1 are arranged in the second direction DR2, and the second sensor parts SP2 are arranged in the first direction DR1. Each of the first connection parts CP1 connects the first sensor parts SP1, which are adjacent to each other, to each other, and each of the second connection parts CP2 connects the second sensor parts SP2, which are adjacent to each other, to each other.

The first signal lines SL1-1 to SL1-5 are connected to ends of the first electrodes TE1-1 to TE1-5, respectively. The second signal lines SL2-1 to SL2-4 are connected to both ends of the second electrodes TE2-1 to TE2-4, respectively. In an embodiment of the inventive concept, the first signal lines SL1-1 to SL1-5 may also be connected to both ends of the first electrodes TE1-1 to TE1-5, respectively. In an embodiment of the inventive concept, each of the second signal lines SL2-1 to SL2-4 may be connected to only one end of each of the second electrodes TE2-1 to TE2-4.

In an embodiment of the inventive concept, the first signal lines SL1-1 to SL1-5, the second signal lines SL2-1 to SL2-4, and the sensing signal pads ISU-PD may be replaced with a circuit board that is separately manufactured and then coupled. In an embodiment of the inventive concept, the sensing signal pads ISU-PD may be connected to the dummy pads ISU-DPD of FIG. 3. In an embodiment of the inventive concept, the sensing signal pads ISU-PD may be omitted, and the first signal lines SL1-1 to SL1-5 and the second signal lines SL2-1 to SL2-4 may be directly connected to the dummy pads ISU-DPD of FIG. 3.

Figure 14A:
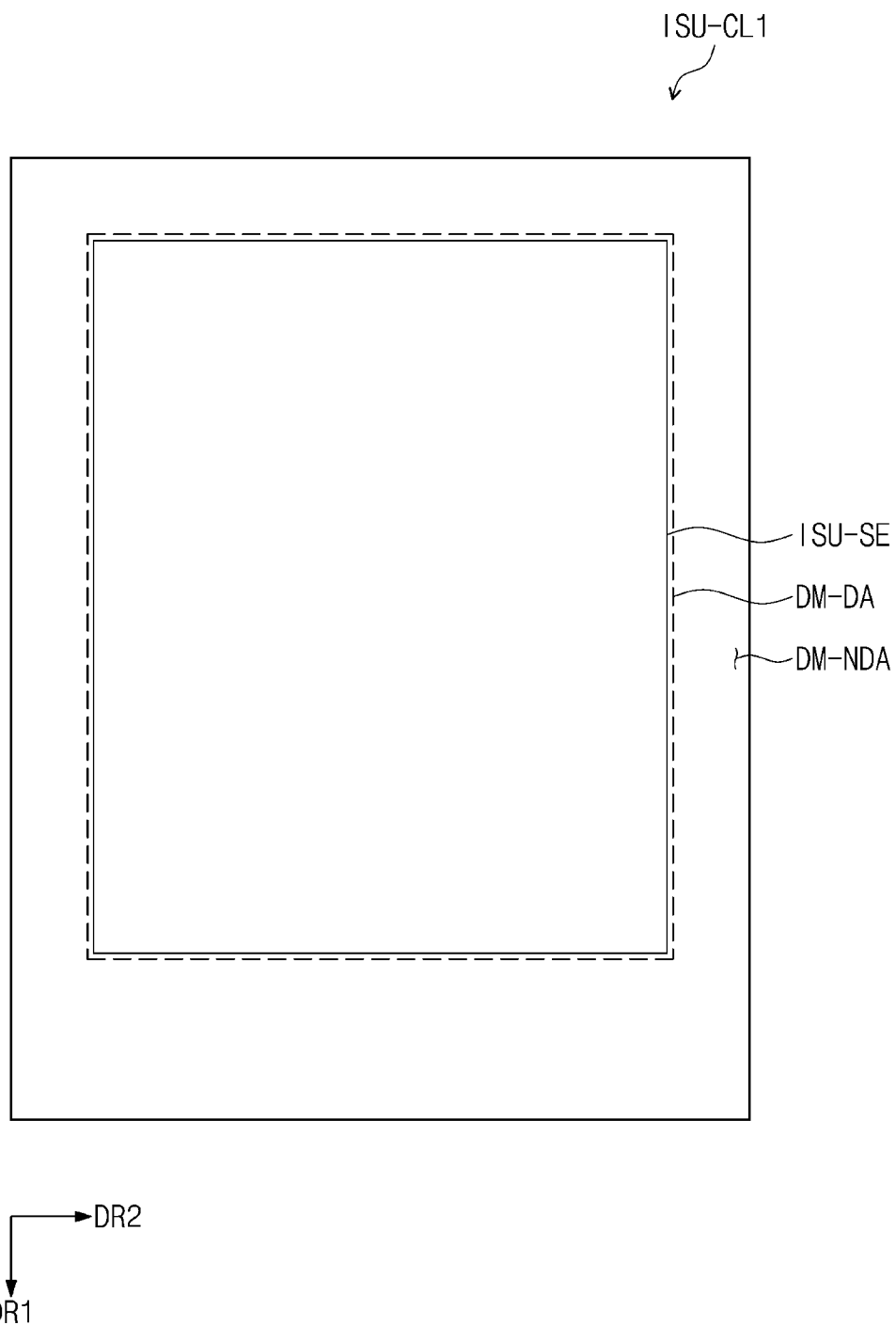
FIG. 14A is a plan view illustrating a first conductive layer of the input sensing unit according to an embodiment of the inventive concept.
Figure 14B:
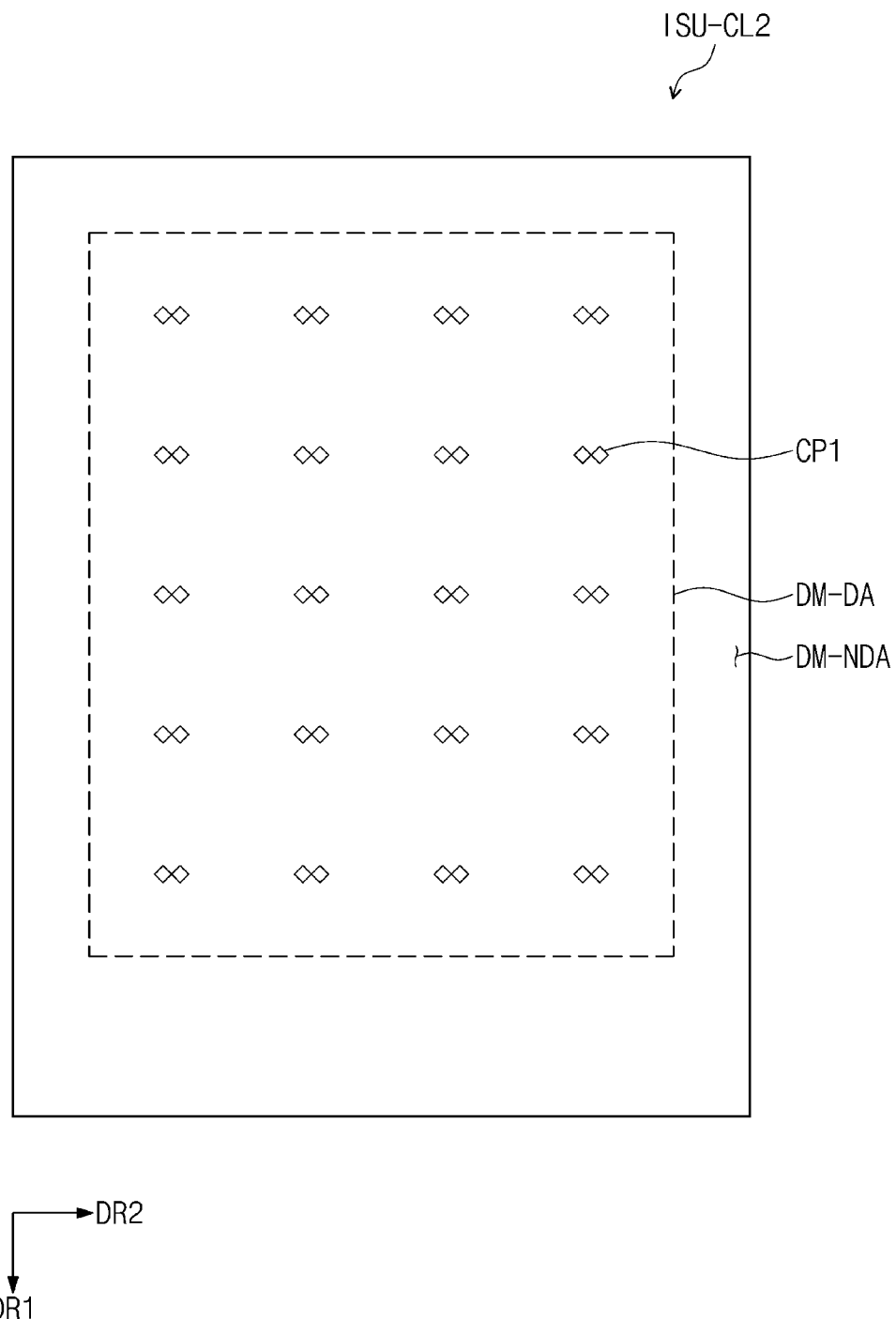
FIG. 14B is a plan view illustrating a second conductive layer of the input sensing unit according to an embodiment of the inventive concept.
Figure 14C:
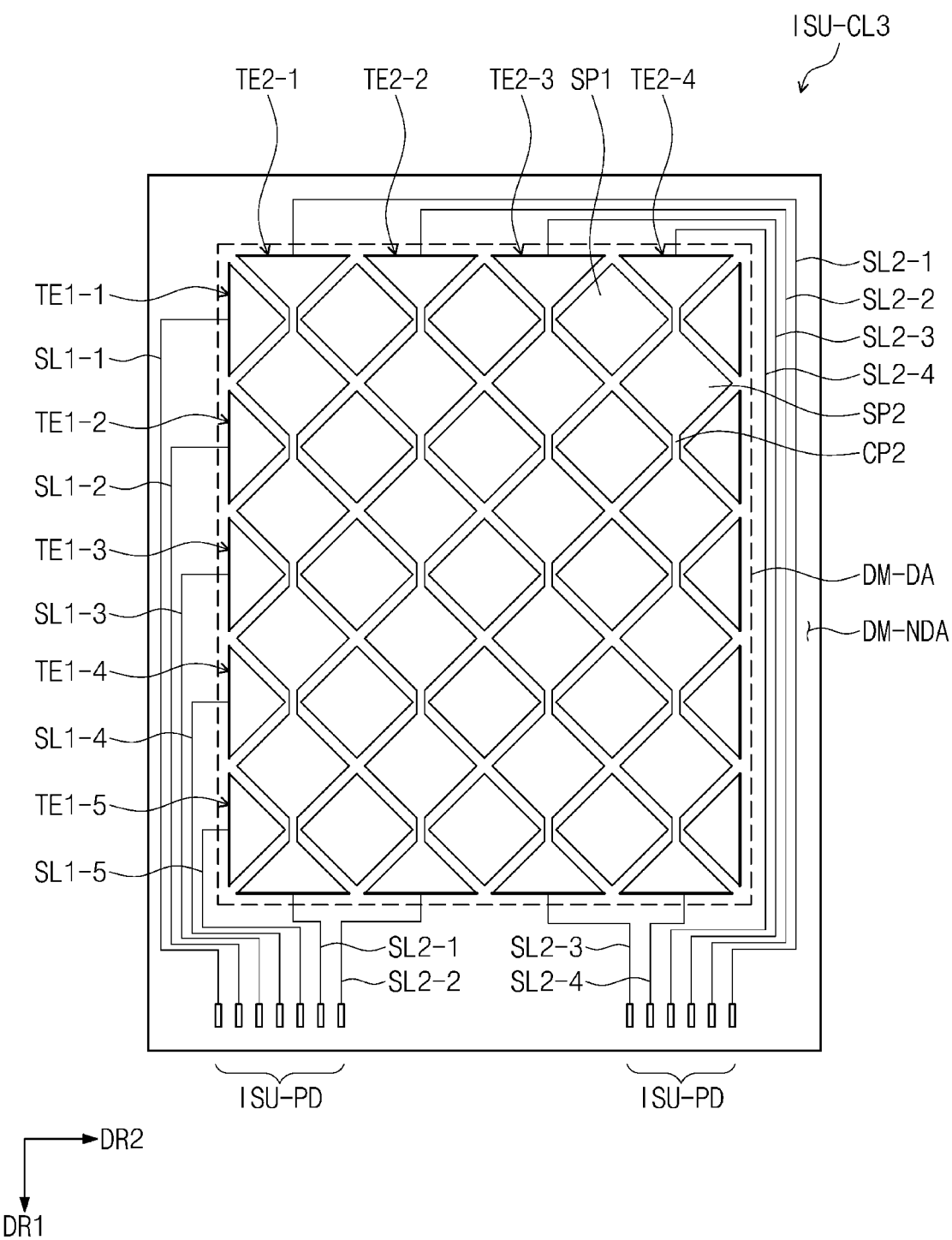
FIG. 14C is a plan view illustrating a third conductive layer of the input sensing unit according to an embodiment of the inventive concept.

FIG. 14A is a plan view illustrating the first conductive layer ISU-CL1 of the input sensing unit ISU according to an embodiment of the inventive concept. FIG. 14B is a plan view illustrating the second conductive layer ISU-CL2 of the input sensing unit ISU according to an embodiment of the inventive concept. FIG. 14C is a plan view illustrating the third conductive layer ISU-CL3 of the input sensing unit ISU according to an embodiment of the inventive concept.

As illustrated in FIG. 14A, the first conductive layer ISU-CL1 may include a noise shield electrode ISU-SE. The noise shield electrode ISU-SE is directly disposed on the thin film encapsulation layer TFE (see FIG. 13A). The noise shield electrode ISU-SE may have a surface area corresponding to the display area DM-DA. The noise shield electrode ISU-SE may overlap the plurality of pixels PX of FIG. 3 and also overlap the emission area PXA and the non-emission area NPXA of FIG. 5. In an embodiment of the inventive concept, the noise shield electrode ISU-SE may completely cover the display area DM-DA and overlap a portion of the non-display area DM-NDA.

To prevent noises generated in the display panel from interfering with the first electrodes TE1-1 to TE1-5 and the second electrodes TE2-1 to TE2-4, the first electrodes TE1-1 to TE1-5 and the second electrodes TE2-1 to TE2-4 may be disposed inside the noise shield electrode ISU-SE on the base surface. The noise shield electrode ISU-SE may completely overlap the first electrodes TE1-1 to TE1-5 and the second electrodes TE2-1 to TE2-4 on the base surface. When considering noise shield efficiency, the noise shield electrode ISU-SE may overlap about 90% or more of an area of at least the first electrodes TE1-1 to TE1-5 and the second electrodes TE2-1 to TE2-4. In an embodiment of the inventive concept, the noise shield electrode ISU-SE may include a plurality of electrodes spaced a distance of several mm from each other.

The noise shield electrode ISU-SE may receive a predetermined voltage. For example, the noise shield electrode ISU-SE may receive a ground voltage. In an embodiment, the noise shield electrode ISU-SE may receive a voltage that is equal to that applied to the second electrodes TE2-1 to TE2-4. Although not separately shown, a signal line providing a predetermined voltage to the noise shield electrode ISU-SE and a pad part may be disposed on the non-display area DM-NDA.

The noise shield electrode ISU-SE may include transparent conductive oxide. The transparent conductive oxide may include indium tin oxide (ITO), indium zinc oxide (IZO), zinc oxide (ZnO), and indium tin zinc oxide (ITZO).

As illustrated in FIG. 14B, the second conductive layer ISU-CL2 includes first connection parts CP1. Although not shown in FIG. 14B, the first connection parts CP1 are disposed on the first insulation layer ISU-IL1 (see FIG. 13A). The first insulation layer ISU-IL1 may directly cover the noise shield electrode ISU-SE, completely cover at least the display area DM-DA, and further overlap a portion of the non-display area DM-NDA.

Each of the first connection parts CP1 may include a single-layered or multilayered metal layer and have a mesh shape. The first connection parts CP1 may overlap the non-emission area NPXA described with reference to FIG. 5 and may not overlap the emission area PXA described with reference to FIG. 5.

As illustrated in FIG. 14C, the third conductive layer ISU-CL3 includes first sensor parts SP1, second sensor parts SP2, and second connection parts CP2. Also, the third conductive layer ISU-CL3 includes first signal lines SL1-1 to SL1-5, second signal lines SL2-1 to SL2-4, and sensing signal pads ISU-PD. Although not shown in FIG. 14C, the third conductive layer ISU-CL3 is disposed on the second insulation layer ISU-IL2 (see FIG. 13A). The first sensor parts SP1 is connected to the first connection parts CP1 through contact holes passing through the second insulation layer ISU-IL2.

Each of the first sensor parts SP1, the second sensor parts SP2, and the second connection parts CP2 may include indium tin oxide (ITO), indium zinc oxide (IZO), zinc oxide (ZnO), and indium tin zinc oxide (ITZO). Each of the first signal lines SL1-1 to SL1-5, the second signal lines SL2-1 to SL2-4, and the sensing signal pads ISU-PD may include the transparent conductive oxide or the single-layered or multilayered metal layer. In an embodiment of the inventive concept, each of the first sensor parts SP1, the second sensor parts SP2, and the second connection parts CP2 may also include a single-layered or multilayered metal layer.

Figure 15A:
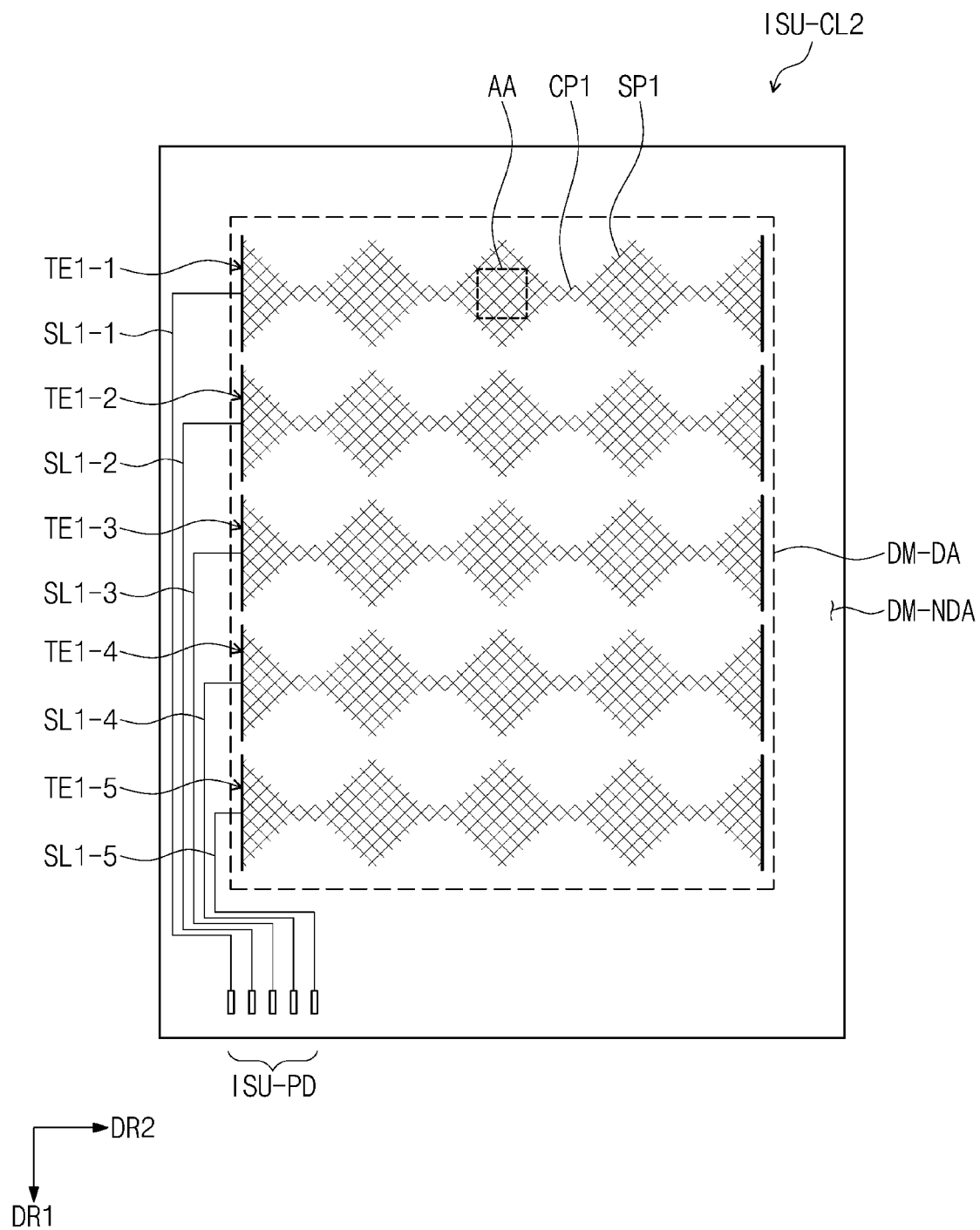
FIG. 15A is a plan view illustrating a second conductive layer of the input sensing unit according to an embodiment of the inventive concept.
Figure 15B:
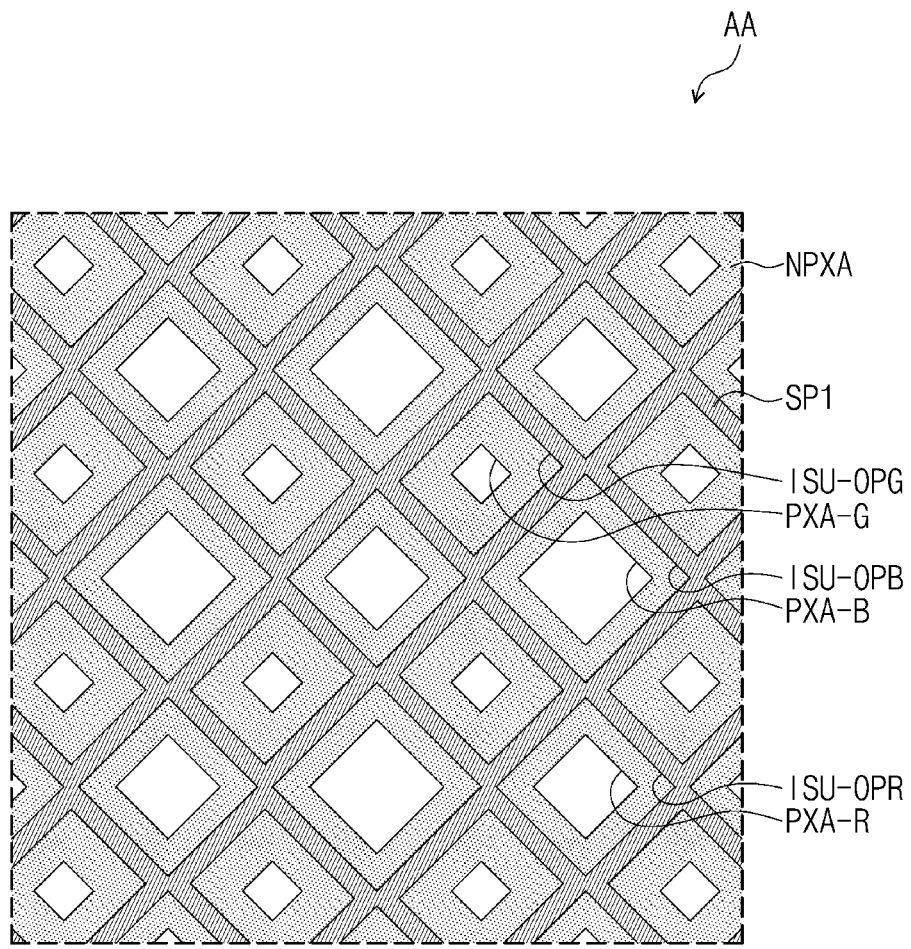
FIG. 15B is an enlarged view of an area AA of FIG. 15A.
Figure 15C:
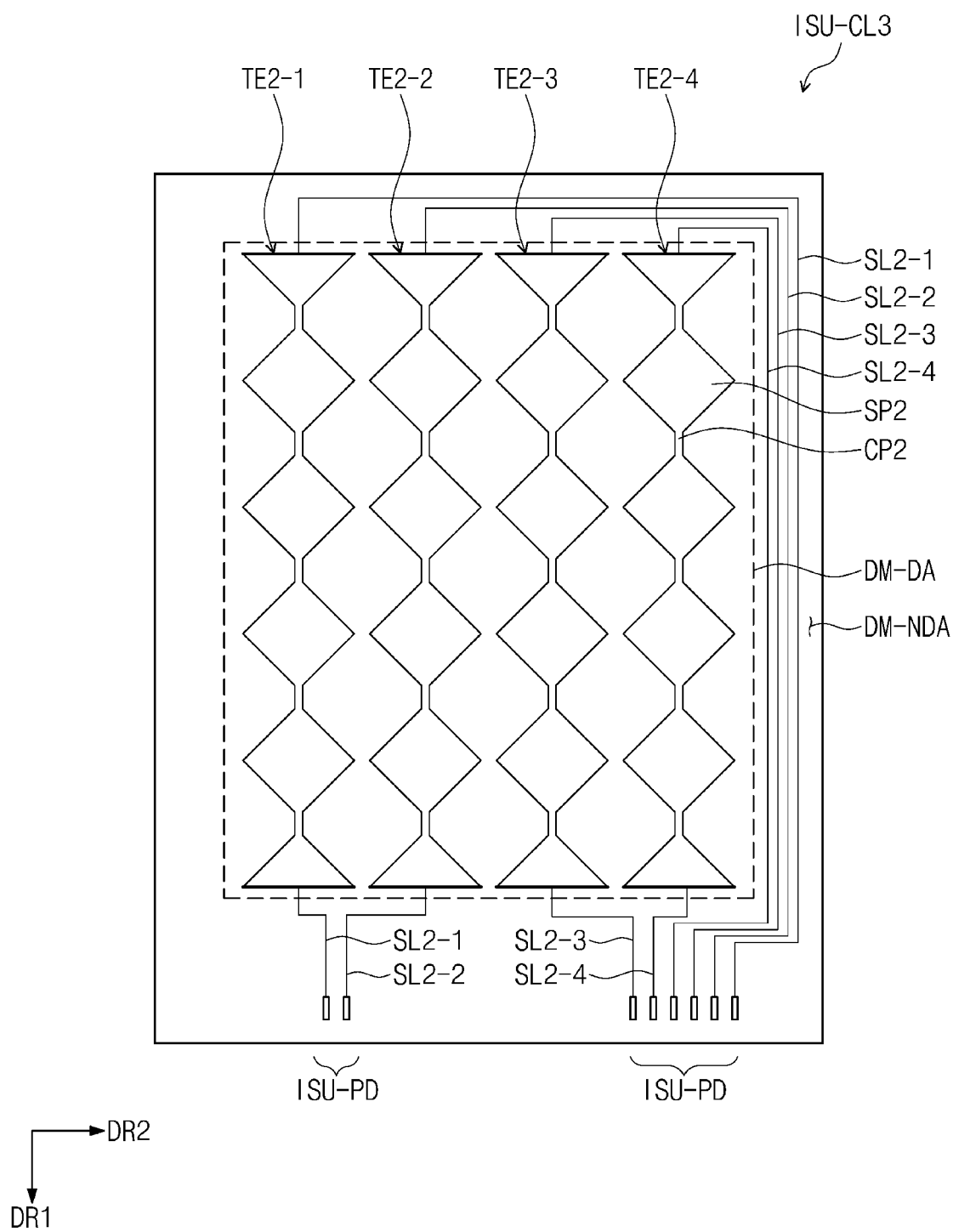
FIG. 15C is a plan view illustrating a third conductive layer of the input sensing unit according to an embodiment of the inventive concept.

FIG. 15A is a plan view illustrating the second conductive layer ISU-CL2 of the input sensing unit ISU according to an embodiment of the inventive concept. FIG. 15B is an enlarged view of an area AA of FIG. 15A. FIG. 15C is a plan view illustrating the third conductive layer ISU-CL3 of the input sensing unit ISU according to an embodiment of the inventive concept.

Hereinafter, differences with respect to the input sensing unit ISU will be mainly described with reference to FIGS. 14A and 14B. Although not separately shown, the input sensing unit ISU according to this embodiment includes a noise shield electrode ISU-SE corresponding to that of FIG. 14A.

As illustrated in FIG. 15A, the second conductive layer ISU-CL2 includes first electrodes TE1-1 to TE1-5, first signal lines SL1-1 to SL1-5, and sensing signal pads ISU-PD. Each of the first electrodes TE1-1 to TE1-5 may have a mesh shape. Each of the first sensor parts SP1 and the first connection parts CP1 may include metal and be formed through the same process. Since each of the first electrodes TE1-1 to TE1-5 has the mesh shape, parasitic capacitance with respect to the first conductive layer ISU-CL1 (see FIGS. 13A and 14A) or the electrodes of the display panel DP (see FIG. 13A) may be reduced.

As illustrated in FIG. 15B, the first sensing parts SP1 do not overlap the emission area PXA-R, PXA-G, PXA-B and overlap the non-light emitting area NPXA. The emission areas PXA-R, PXA-G, and PXA-B may be defined to be equal to the emission area PXA of FIG. 5. Mesh lines of the first sensor part SP1 define a plurality of mesh holes ISU-OPR, ISU-OPG, and ISU-OPB. That is to say, a plurality of mesh holes ISU-OPR, ISU-OPG, and ISU-OPB are defined in the first sensor part SP1. A line width of each of the mesh lines may range from several micrometers to several nanometers. The plurality of mesh holes ISU-OPR, ISU-OPG, and ISU-OPB may one-to-one correspond to the emission areas PXA-R, PXA-G, and PXA-B.

The emission areas PXA-R, PXA-G, and PXA-B are spaced apart from each other, and the non-emission area NPXA is disposed between the emission areas PXA-R, PXA-G, and PXA-B. Organic light emitting diodes OLED are disposed on each of the emission areas PXA-R, PXA-G, and PXA-B. The emission areas PXA-R, PXA-G, and PXA-B may be classified into several groups according to colors of light emitted from the organic light emitting diodes OLED. FIG. 15B illustrates an example in which the emission areas PXA-R, PXA-G, and PXA-B are classified into three groups according to the colors of light.

The emission areas PXA-R, PXA-G, and PXA-B may have different surface areas according to the colors of light emitted from a light emitting layer EML of the organic light emitting diode OLED (see FIG. 5). The surface area of each of the emission areas PXA-R, PXA-G, and PXA-B may be determined according to kinds of organic light emitting diodes.

The plurality of mesh holes ISU-OPR, ISU-OPG, and ISU-OPB may be classified into several groups having surface areas different from each other. The plurality of mesh holes ISU-OPR, ISU-OPG, and ISU-OPB may be classified into three groups according to the corresponding emission areas PXA-R, PXA-G, and PXA-B.

Although the mesh holes ISU-OPR, ISU-OPG, and ISU-OPB one-to-one correspond to the emission areas PXA-R, PXA-G, and PXA-B as described above, the embodiment of the inventive concept is not limited thereto. The plurality of mesh holes ISU-OPR, ISU-OPG, and ISU-OPB may one-to-one correspond to the emission areas PXA-R, PXA-G, and PXA-B.

Although the emission areas PXA-R, PXA-G, and PXA-B have various surface areas, the embodiment of the inventive concept is not limited thereto. The emission areas PXA-R, PXA-G, and PXA-B may have the same size, and also, the mesh holes ISU-OPR, ISU-OPG, and ISU-OPB may have the same size. Each of the mesh holes ISU-OPR, ISU-OPG, and ISU-OPB is not limited to the planar shape, and thus, may have diamond shape and other polygonal shapes.

Although not separately shown, the second conductive patterns of the third conductive layer ISU-CL3, which are described with reference to FIG. 14C, and the second conductive patterns of the third conductive layer ISU-CL3, which will be described below, may overlap the emission areas PXA-R, PXA-G, and PXA-B and the non-emission area NPXA, which are respectively disposed therebelow.

As illustrated in FIG. 15C, the third conductive layer ISU-CL3 includes second electrodes TE2-1 to TE2-4, second signal lines SL2-1 to SL2-4, and sensing signal pads ISU-PD. Unlike the input sensing unit ISU illustrated in FIGS. 14A to 14C, the contact holes may not be defined in the second insulation layer ISU-IL2. This is done because the first electrodes TE1-1 to TE1-5 and the second electrodes TE2-1 to TE2-4 are disposed with the second insulation layer ISU-IL2 therebetween.

The second electrodes TE2-1 to TE2-4 overlap the emission areas PXA-R, PXA-G, and PXA-B and the non-emission area NPXA, which are illustrated in FIG. 15B. At least the second electrodes TE2-1 to TE2-4 may include the transparent conductive oxide such as indium tin oxide (ITO), indium zinc oxide (IZO), zinc oxide (ZnO), and indium tin zinc oxide (ITZO). The display surface IS (see FIG. 1A) may provide a moiré phenomenon, in which the second electrodes TE2-1 to TE2-4 having the mesh shape and the first electrodes TE1-1 to TE1-5 having the mesh shape are shown to overlap each other, to a user staring at an oblique angle. On the other hand, although the mesh-shaped second electrodes TE2-1 to TE2-4 including the transparent conductive oxide overlap the mesh-shaped first electrodes TE1-1 to TE1-5, the moiré phenomenon does not occur.

One of the second signal lines SL2-1 to SL2-4 and the sensing signal pads ISU-PD may be formed through the same process as the second electrodes TE2-1 to TE2-4 or through a process different from that of forming the second electrodes TE2-1 to TE2-4. One of the second signal lines SL2-1 to SL2-4 and the sensing signal pads ISU-PD may include transparent conductive oxide or metal.

In an embodiment of the inventive concept, one of the second signal lines SL2-1 to SL2-4 and the signal pads ISU-PD of the input sensing unit ISU may be formed on the first insulation layer ISU-IL1 through the same process as the first signal lines SL1-1 to SL1-5 of FIG. 15A. Here, the second electrode TE2-1 to TE2-4 and the second signal lines SL2-1 to SL2-4 may be connected to each other through the contact hole passing through the second insulation layer ISU-IL2.

Figure 16A:
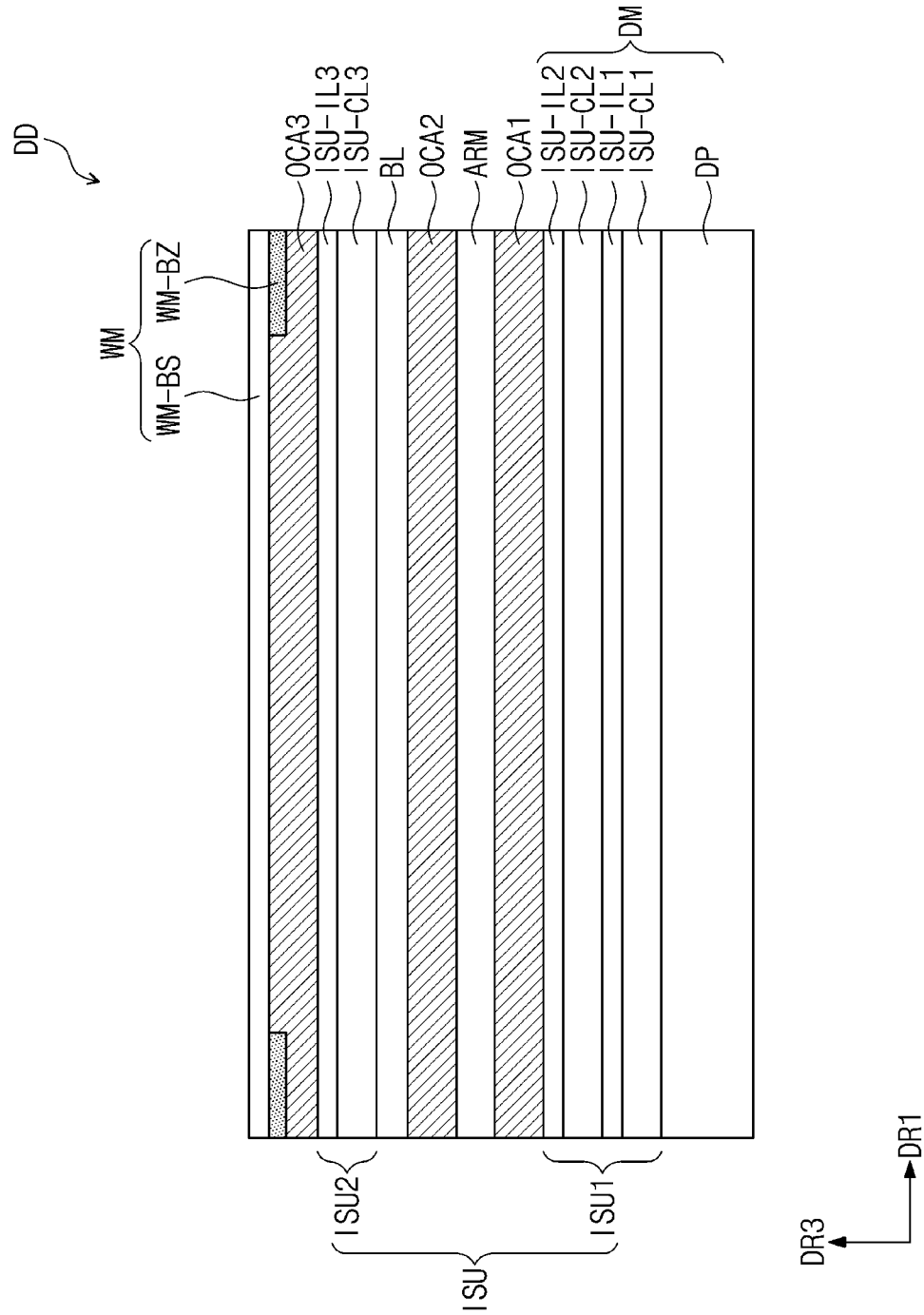
FIGS. 16A, 16B, and 16C are cross-sectional views of a display device according to an embodiment of the inventive concept.
Figure 16B:
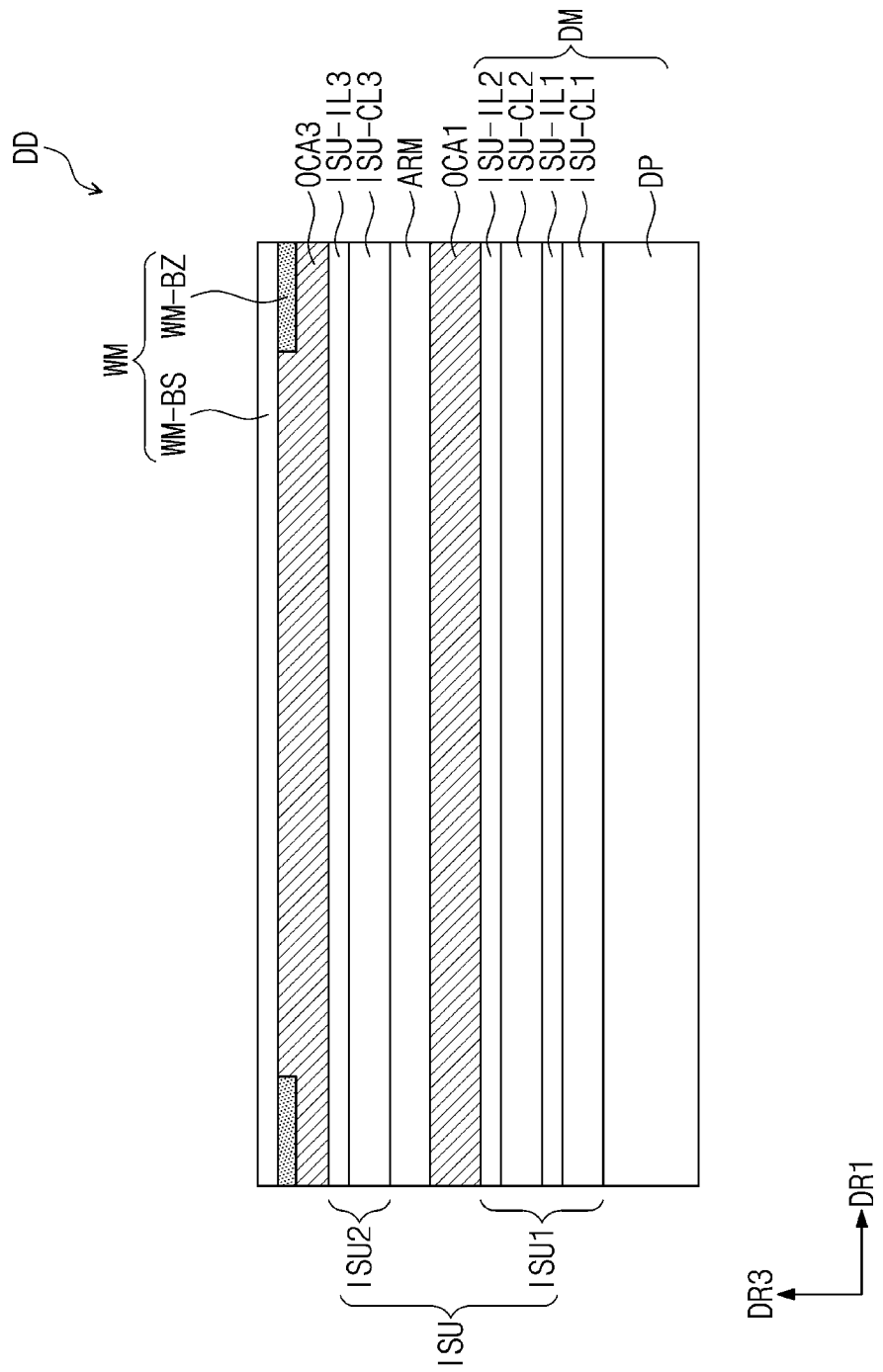
Figure 16C:
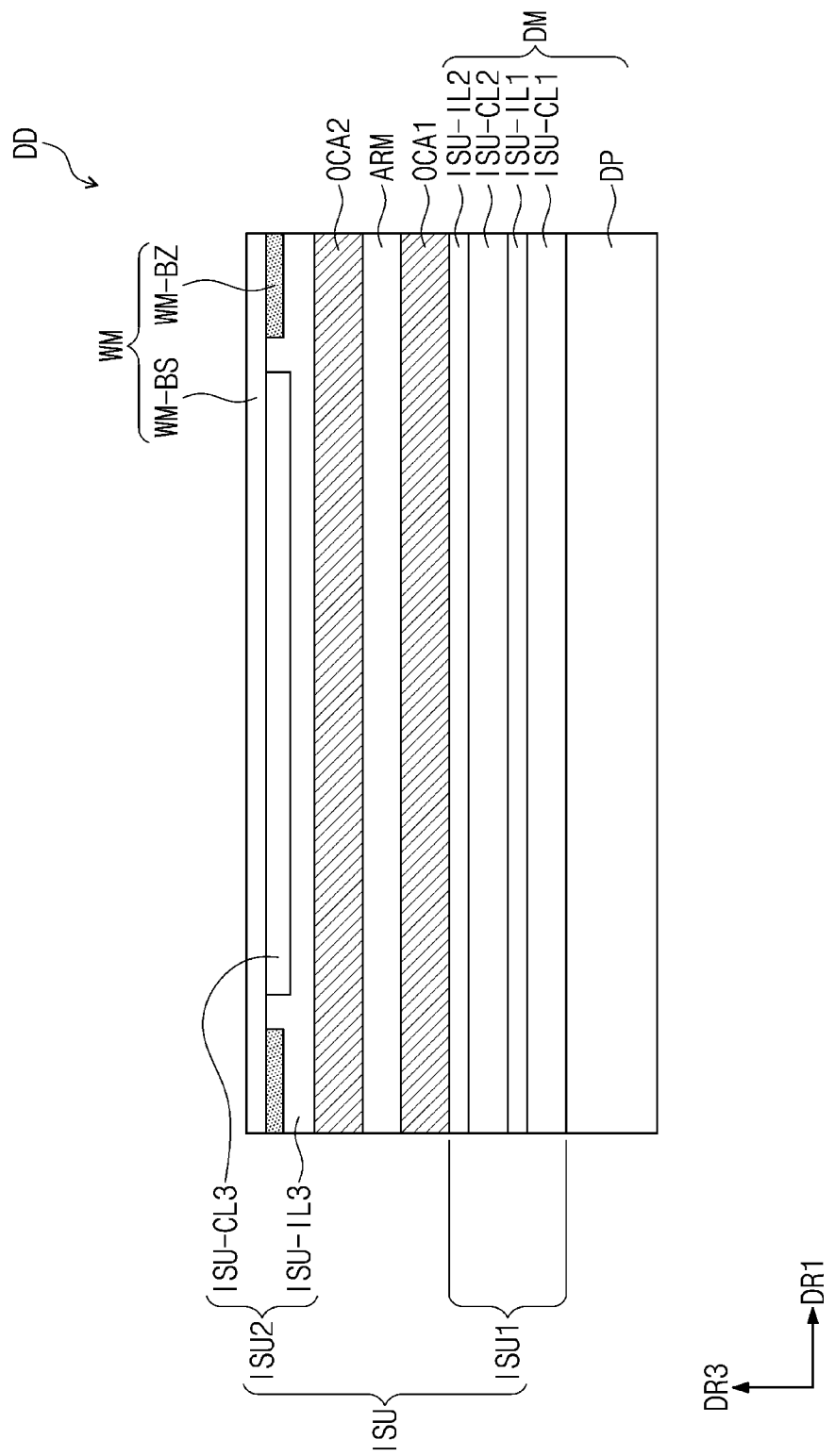

FIGS. 16A to 16C are cross-sectional views of the display device DD according to an embodiment of the inventive concept. Hereinafter, detailed descriptions with respect to the constituent duplicated with that of the input sensing unit ISU described with reference to FIGS. 1 to 15C will be omitted.

As illustrated in FIG. 16A, the display device DD include a window unit WM, an antireflection unit ARM, an input sensing unit ISU, and a display panel DP. Portion of the above-described constituents may be formed through a continuous process, and portions of the above-described constituents may be coupled to each other through an optical transparent adhesion member.

The input sensing unit ISU includes a first portion unit ISU1 and a second portion unit ISU2. The first portion unit ISU1 may include a first conductive layer ISU-CL1, a first insulation layer ISU-IL1, a second conductive layer ISU-CL2, and a second insulation layer ISU-IL2, which are described with reference to FIGS. 13A to 15C. The first conductive layer ISU-CL1 may be directly disposed on the display panel DP. The first conductive layer ISU-CL1, the second conductive layer ISU-CL2, and the second insulation layer ISU-IL2 may also be directly disposed on the display panel DP through the continuous process. In this embodiment, the display panel DP and the first portion unit ISU1, which are coupled to each other, may be defined as the display module DM.

The first insulation layer ISU-IL1 may include an inorganic material, and the second insulation layer ISU-IL2 may include an organic material. The insulation layer made of the inorganic material may improve coupling force between the first insulation layer ISU-IL1 and the first conductive layer ISU-CL1 and have a uniform thickness. The insulation layer made of the organic material may improve coupling force between the second insulation layer ISU-IL2 and a first optical transparent adhesion member OCA1 and also improve flexibility of the first portion unit ISU1.

The display module DM and the antireflection unit ARM may be coupled to each other through the first optical transparent adhesion member OCA1. The antireflection unit ARM may be a member for reducing reflexibility of external light and include a phase retardation member and a polarization member. The phase retardation member may include a $\lambda/2$ phase retardation member and/or a $\lambda/4$ phase retardation member. Each of the phase retardation member and the polarization member may include a flexible plastic film or liquid crystals arranged with a predetermined arrangement. Each of the phase retardation member and the polarization member may further include a protection film.

The antireflection unit ARM may include color filters having the same color as that of light emitted from the organic light emitting diode disposed on the emission area PXA. Also, the antireflection unit ARM may include a destructive interference structure that destructs first reflection light and second reflection light, which are reflected by layers different from each other. The color filters and the destructive interference structure may be disposed on the base film.

The antireflection unit ARM and the second portion unit ISU2 may be coupled to each other through a second optical transparent adhesion member OCA2. The second portion unit ISU2 and the window unit WM may be coupled to each other through a third optical transparent adhesion member OCA3. The second portion unit ISU2 may include a base film BL and the third conductive layer ISU-CL3 and the third insulation layer ISU-IL3, which are described with reference to FIGS. 13A to 15C.

In this embodiment, each of the antireflection unit ARM and the first and second optical transparent adhesion members OCA1 and OCA2 may have an insulative function for insulating the second conductive layer ISU-CL2 from the third conductive layer ISU-CL3. In the input sensing unit ISU illustrated in FIGS. 16A to 16C, since it is difficult to form a contact hole passing through the antireflection unit ARM and the optical transparent adhesion members OCA1, OCA2, and OCA3, the second conductive layer ISU-CL2 may include the first conductive patterns of FIG. 15A, and the third conductive layer ISU-CL3 may include the second conductive patterns of FIG. 15C. The third conductive layer ISU-CL3 may include the sensing signal pads ISU-PD of FIG. 15C, and the sensing signal pads ISU-PD may be connected to the second circuit board pads PCB-P2 of FIG. 13A through a flexible circuit board.

As illustrated in FIG. 16B, the base film BL of the second portion unit ISU2 of FIG. 16A may be omitted. The third conductive layer ISU-CL3 of the second portion unit ISU2 may be directly disposed on the antireflection unit ARM. The third insulation layer ISU-IL3 may be directly disposed on the antireflection unit ARM to cover the second conductive patterns of the third conductive layer ISU-CL3. Thus, the second optical transparent adhesion member OCA2 may be omitted, unlike the input sensing unit ISU of FIG. 16A.

As illustrated in FIG. 16C, the base film BL of the second portion unit ISU2 of FIG. 16A may be omitted. The third conductive layer ISU-CL3 of the second portion unit ISU2 may be directly disposed on a bottom surface of a base film WM-BS of the window unit WM. The third insulation layer ISU-IL3 may be directly disposed on the bottom surface of the base film WM-BS to directly cover the second conductive patterns and a light blocking pattern WM-BZ of the third conductive layer ISU-CL3.

The second optical transparent adhesion member OCA2 may couple the third insulation layer ISU-IL3 to the antireflection unit ARM. Thus, the third optical transparent adhesion member OCA3 may be omitted, unlike the input sensing unit ISU of FIG. 16A.

Figure 17A:
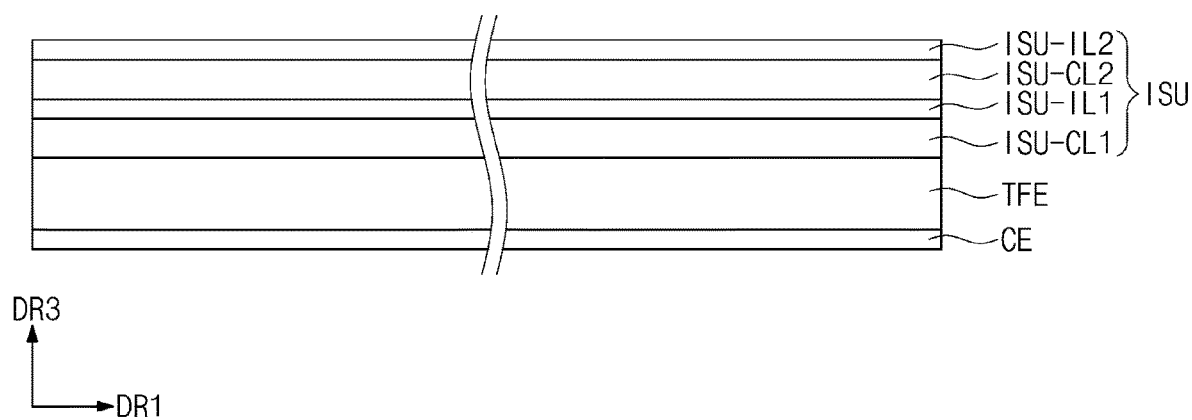
FIG. 17A is a cross-sectional view of the input sensing unit according to an embodiment of the inventive concept.
Figure 17B:
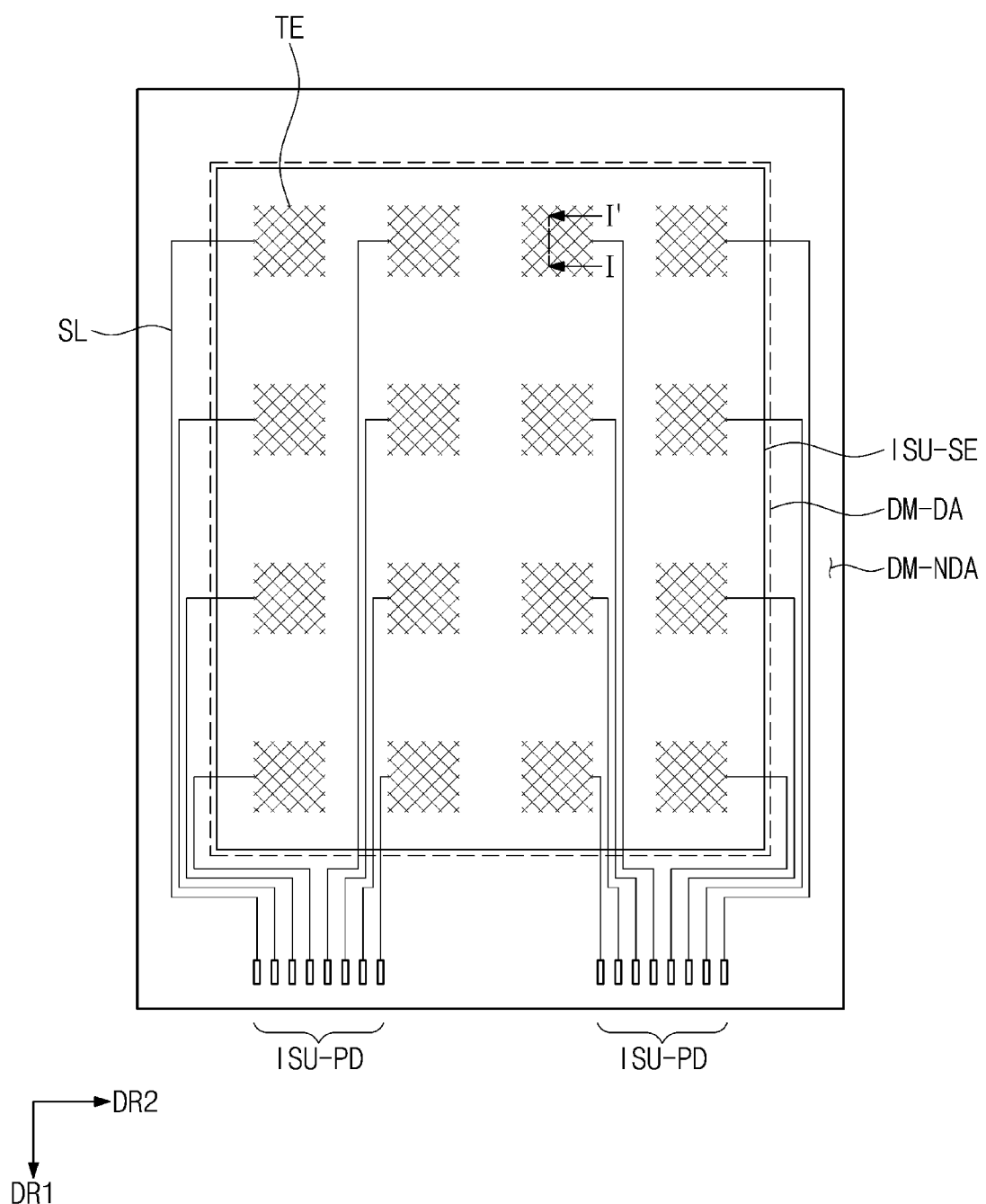
FIG. 17B is a plan view of the input sensing unit according to an embodiment of the inventive concept.
Figure 17C:
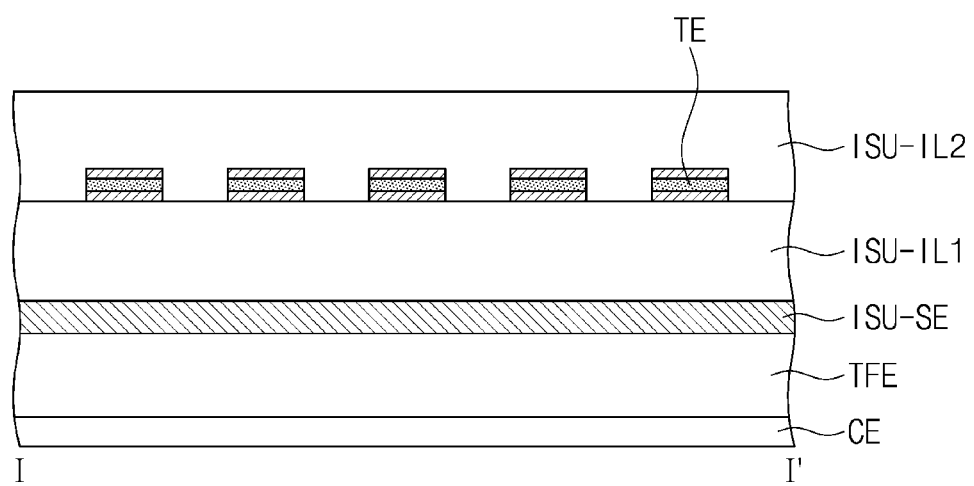
FIG. 17C is a cross-sectional view taken along line I-I' of FIG. 17B.

FIG. 17A is a cross-sectional view of the input sensing unit ISU according to an embodiment of the inventive concept. FIG. 17B is a plan view of the input sensing unit ISU according to an embodiment of the inventive concept. FIG. 17C is a cross-sectional view taken along line I-I' of FIG. 17A. Hereinafter, detailed descriptions with respect to the same constituent as that described with reference to FIGS. 1 to 16C will be omitted.

According to this embodiment, the third conductive layer ISU-CL3 and the third insulation layer ISU-IL3 of FIGS. 13A to 16C may be omitted, and the input sensing unit ISU may include a first conductive layer ISU-CL1, a first insulation layer ISU-IL1, a second conductive layer ISU-CL2, and a second insulation layer ISU-IL2.

The first conductive layer ISU-CL1 may include a noise shield electrode ISU-SE. The second conductive layer ISU-CL2 may include a plurality of electrodes TE, a plurality of signal lines SL, and sensing signal pads ISU-PD. The first insulation layer ISU-IL1 covering the noise shield electrode ISU-SE is not illustrated in FIG. 17B.

Each of the plurality of electrodes TE has proper coordinate information. For example, the electrodes TE may be arranged in the form of a matrix and respectively connected to the sensing signal lines SL. The embodiment of the inventive concept is not particularly limited to the shape and arrangement of the electrodes TE. A portion of the sensing signal lines SL may be disposed on the display area DM-DA, and a portion of the sensing signal lines SL may be disposed on the non-display area DM-NDA. The input sensing unit ISU may acquire coordinate information in a self-capacitance manner.

As illustrated in FIGS. 17B and 17C, the electrodes TE, sometimes called the sensing electrodes TE, may have a mesh shape. Although not particularly shown, the sensing electrodes TE may overlap the non-emission area NPXA, similar to the first sensing part SP1 of FIG. 15B. The noise shield electrode ISU-SE may block noises generated from the electrodes of the display panel DP with respect to the sensing electrodes TE.

Although not particularly shown, unlike the structure of FIG. 17A, the second conductive layer ISU-CL2 may not be continuously formed from the first insulation layer ISU-IL1. The antireflection unit ARM and the optical transparent adhesion member OCA may be further disposed between the second conductive layer ISU-CL2 and the first insulation layer ISU-ILL Similar to the third conductive layer ISU-CL3 of FIG. 16B, the second conductive layer ISU-CL2 may be directly disposed on the antireflection unit ARM. Similar to the third conductive layer ISU-CL3 of FIG. 16C, the second conductive layer ISU-CL2 may be directly disposed on the window unit WM.

Figure 18A:
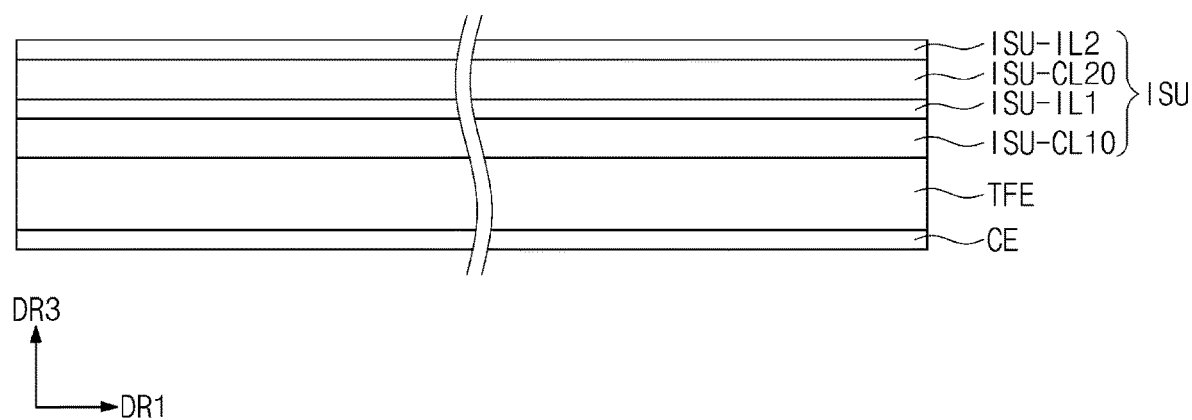
FIG. 18A is a cross-sectional view of the input sensing unit according to an embodiment of the inventive concept.
Figure 18B:
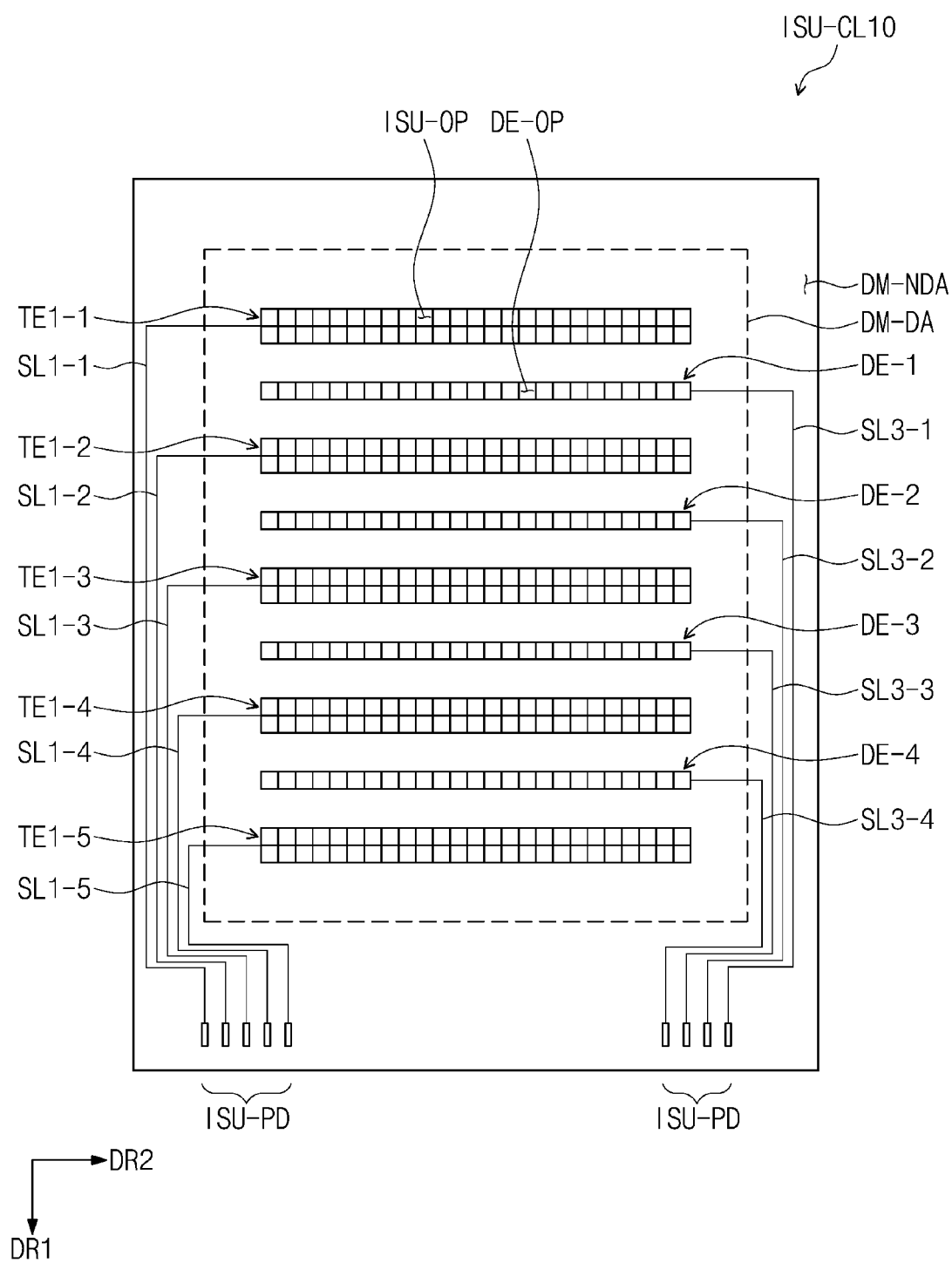
FIG. 18B is a plan view illustrating a first conductive layer of the input sensing unit according to an embodiment of the inventive concept.
Figure 18C:
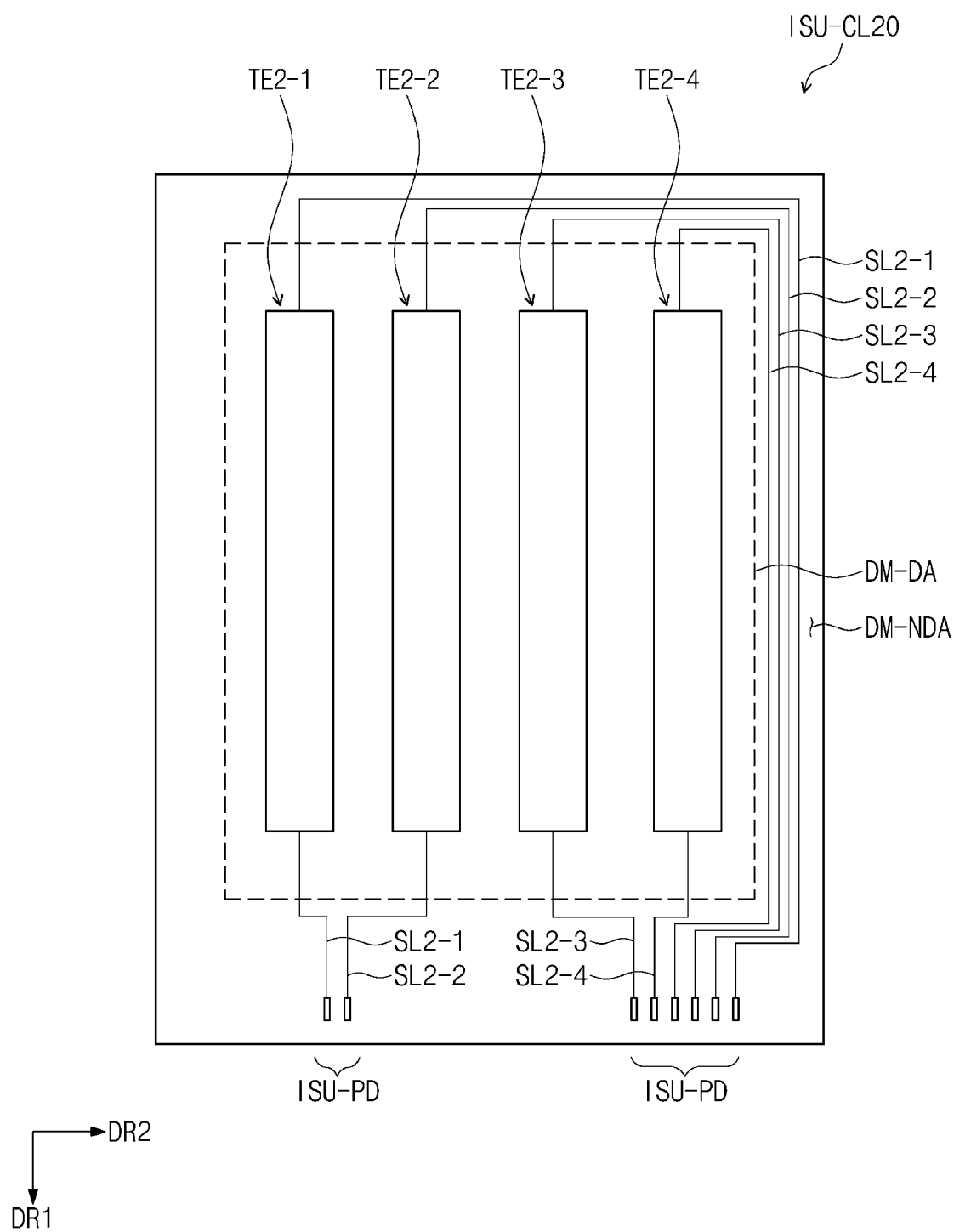
FIG. 18C is a plan view illustrating a second conductive layer of the input sensing unit according to an embodiment of the inventive concept.

FIG. 18A is a cross-sectional view of the input sensing unit ISU according to an embodiment of the inventive concept. FIG. 18B is a plan view illustrating a first conductive layer ISU-CL10 of the input sensing unit ISU according to an embodiment of the inventive concept. FIG. 18C is a plan view illustrating a second conductive layer ISU-CL20 of the input sensing unit ISU according to an embodiment of the inventive concept. Hereinafter, detailed descriptions with respect to the same constituent as that described with reference to FIGS. 1 to 17C will be omitted.

The input sensing unit ISU according to this embodiment does not include the first conductive layer ISU-CL1 and the first input insulation layer ISU-IL1, which are illustrated in FIGS. 13A to 16C. As illustrated in FIG. 18A, the input sensing unit ISU according to this embodiment may include the first conductive layer ISU-CL10 and the second conductive layer ISU-CL20. The first conductive layer ISU-CL10 and the second conductive layer ISU-CL20 may correspond to the second conductive layer ISU-CL2 and third conductive layer ISU-CL3, which are illustrated in FIGS. 13A to 16C, respectively.

As illustrated in FIG. 18B, the first conductive layer ISU-CL10 may include first electrodes TE1-1 to TE1-5, first signal lines SL1-1 to SL1-5, dummy electrodes DE-1 to DE-4, dummy signal lines SL3-1 to SL3-4, and sensing signal pads ISU-PD. The first electrode TE1-1 to TE1-5 and the dummy electrodes DE-1 to DE-4 may be formed through the same process, and thus may be made of the same material and have the same layer structure.

The dummy electrodes DE-1 to DE-4 may be a mesh shape like the first electrodes TE1-1 to TE-5. Each of the first electrodes TE-1 to TE-5 may include a mesh hole ISU-OP, and each of the dummy electrodes DE-1 to DE-4 may include a dummy mesh hole DE-OP. The dummy electrodes DE-1 to DE-4 formed through a process different from that of forming the first electrodes TE1-1 to TE1-5 may not have the mesh structure. Here, the dummy electrodes DE-1 to DE-4 may include transparent conductive oxide.

The dummy electrode DE-1 to DE-4 may extend in the second direction DR2 and arranged in the first direction DR1. The dummy electrodes DE-1 to DE-4 may be respectively disposed between the first electrodes TE-1 to TE-5.

Although each of the dummy electrodes DE-1 to DE-4 has a bar shape with a width in the first direction DR1 in this embodiment, the embodiment of the inventive concept is not limited thereto. For example, each of the dummy electrodes DE-1 to DE-4 may be formed into the shape of each of the first electrodes TE-1 to TE-5 of FIG. 13B. The number of dummy electrodes DE-1 to DE-4 is not limited. That is, the input sensing unit ISU may include dummy electrodes having various numbers as long as one dummy electrode overlaps one of the second electrodes TE2-1 to TE2-4 on the plane.

As illustrated in FIG. 18C, the second conductive layer ISU-CL20 includes second electrodes TE2-1 to TE2-4, second signal lines SL2-1 to SL2-4, and sensing signal pads ISU-PD. To prevent the moiré phenomenon from occurring, the second electrodes TE2-1 to TE2-4 may include transparent conductive oxide. Although each of the second electrodes TE2-1 to TE2-4 has a bar shape with a width in the second direction DR2, the embodiment of the inventive concept is not limited thereto.

Figure 19:
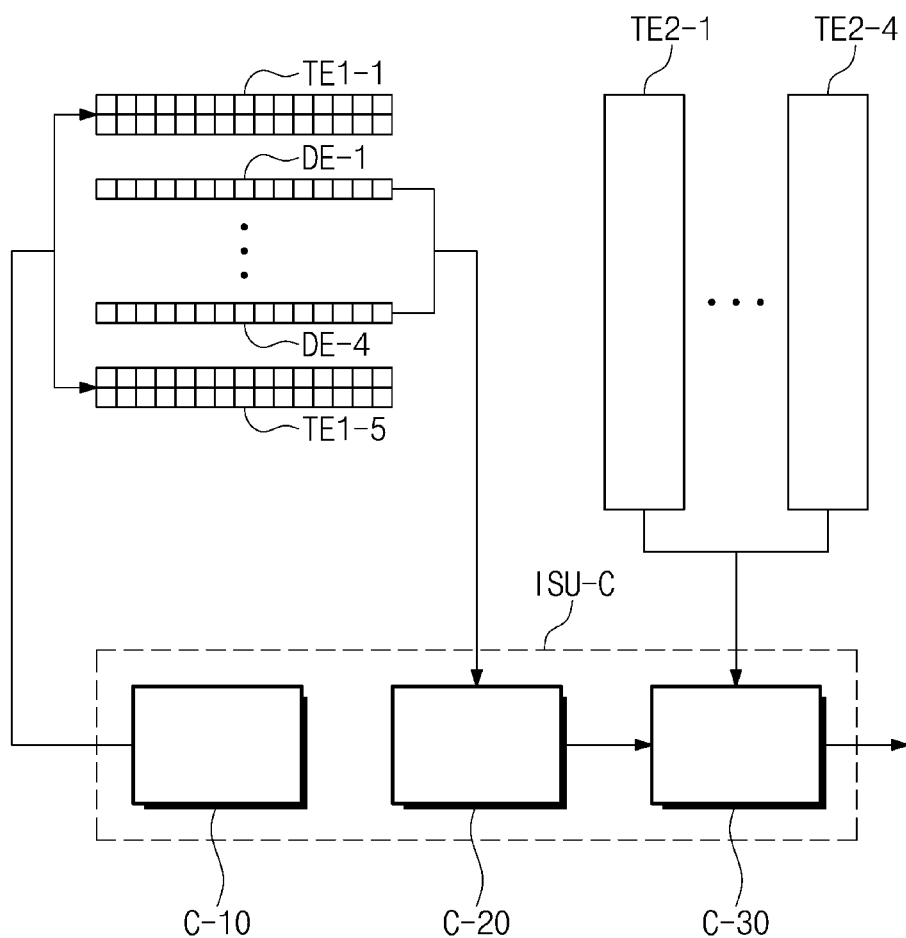
FIG. 19 is a block diagram of an input sensing circuit according to an embodiment of the inventive concept.

As illustrated in FIG. 19, the display device DD (see FIG. 1B) includes an input sensing circuit ISU-C which is electrically connected to the first electrodes TE-1 to TE1-5, the dummy electrodes DE-1 to DE-4, and the second electrodes TE2-1 to TE2-4. The input sensing circuit ISU-C detects noises generated in the dummy electrode DE-1 to DE-4 by the display panel DP (see FIG. 1B) and detects an external input (e.g., user's touch) generated from the outside of the window unit WM (see FIG. 1B). As illustrated in FIG. 3, the input sensing circuit ISU-C may be mounted on the circuit board PCB in the form of an integrated chip.

The input sensing circuit ISU-C includes a signal providing circuit C-10, a noise detecting circuit C-20, and a coordinate information calculating circuit C-30. The signal providing circuit C-10 provides detecting signals to the first electrodes TE1-1 to TE1-5. The detecting signals may be an AC signals having different pieces of information. Here, the sentence "the detecting signals have the different pieces of information" represents that the detecting signals have different pieces of time information, frequency information, and code information. The detecting signals modulated by time division multiple access may be activated in different sections. The detecting signals modulated by frequency division multiple access may have frequencies different from each other. The detecting signals modulated by code division multiple access may have different pieces of code information.

The noise detecting circuit C-20 detects noises from the dummy electrodes DE-1 to DE-4. The noises interfering with the dummy electrodes DE-1 to DE-4 in the display panel DP may be treated as noises interfering with the second electrodes TE2-1 to TE2-4 or noises corresponding thereto in the display panel DP. The noise detecting circuit C-20 may include low-pass filter that removes low-frequency components of the detected noise signal.

The coordinate information calculating circuit C-30 receives the noise signal from the noise detecting circuit C-20. The coordinate information calculating circuit C-30 receives sensing signals from the second electrode TE2-1 to TE2-4. The coordinate information calculating circuit C-30 compensates the sensing signal on the basis of the noise signal.

For example, the noise signal may be subtracted from the sensing signal to generate correction signals, and coordinate information of an input point may be calculated based on the correction signals.

Although not particularly shown, unlike the structure of FIG. 18A, the second conductive layer ISU-CL20 of the input sensing unit ISU according to an embodiment of the inventive concept may not be continuously formed from the first insulation layer ISU-IL1. The antireflection unit ARM and the optical transparent adhesion member OCA may be further disposed between the second conductive layer ISU-CL20 and the first insulation layer ISU-IL1. Similar to the third conductive layer ISU-CL3 of FIG. 16B, the second conductive layer ISU-CL2 may be directly disposed on the antireflection unit ARM. Similar to the third conductive layer ISU-CL3 of FIG. 16C, the second conductive layer ISU-CL2 may be directly disposed on the window unit WM.

Although not particularly shown, the input sensing circuit ISU-C of the input sensing unit ISU, which is described with reference to FIGS. 13A to 16C, may not include the noise detecting circuit C-20 when compared to the input sensing circuit ISU-C of FIG. 19. The input sensing circuit ISU-C of the input sensing unit ISU, which is described with reference to FIGS. 13C to 16C, includes a signal providing circuit C-10 connected to one of the first electrodes TE1-1 to TE-5 and the second electrodes TE2-1 to TE2-4 and a coordinate information calculating circuit C-30 connected to the other of the first electrodes TE1-1 to TE-5 and the second electrodes TE2-1 to TE2-4. Particularly, the coordinate information calculating circuit C-30 may be connected to the second electrodes TE2-1 to TE2-4 that is spaced far from the display panel DP to reduce noises interfering with the sensing signals.

The input sensing circuit ISU-C of the input sensing unit ISU, which is described with reference to FIGS. 17A to 17C, includes a signal providing circuit C-10 and a coordinate information calculating circuit C-30. The signal providing circuit C-10 and the coordinate information calculating circuit C-30 are connected to the sensing electrodes TE in different sections. The input sensing circuit ISU-C of the input sensing unit ISU, which is described with reference to FIGS. 17A to 17C, may further include a switching circuit for selectively connecting the signal providing circuit C-10 and the coordinate information calculating circuit C-30 to the plurality of sensing electrodes TE.

Figure 20A:
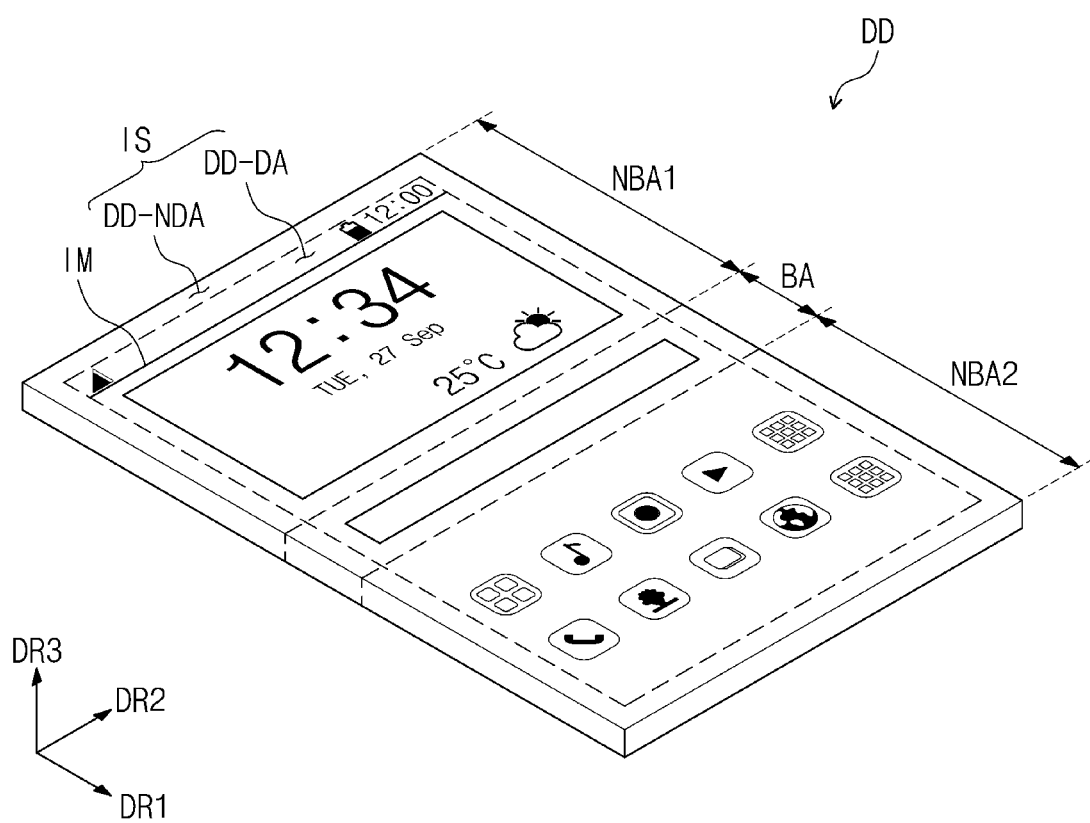
FIGS. 20A, 20B, and 20C are perspective views of a display device according to an embodiment of the inventive concept.
Figure 20B:
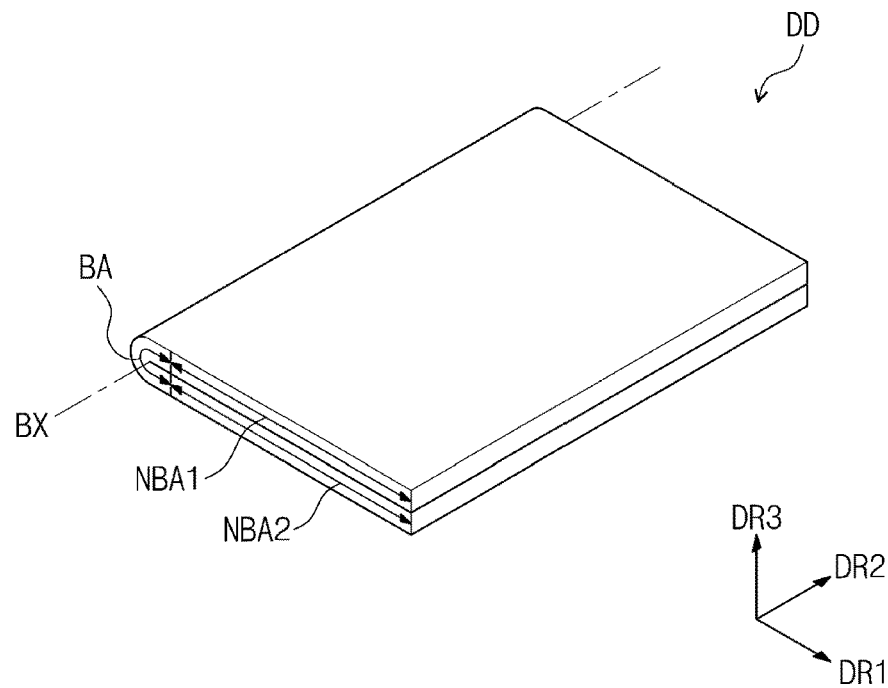
Figure 20C:
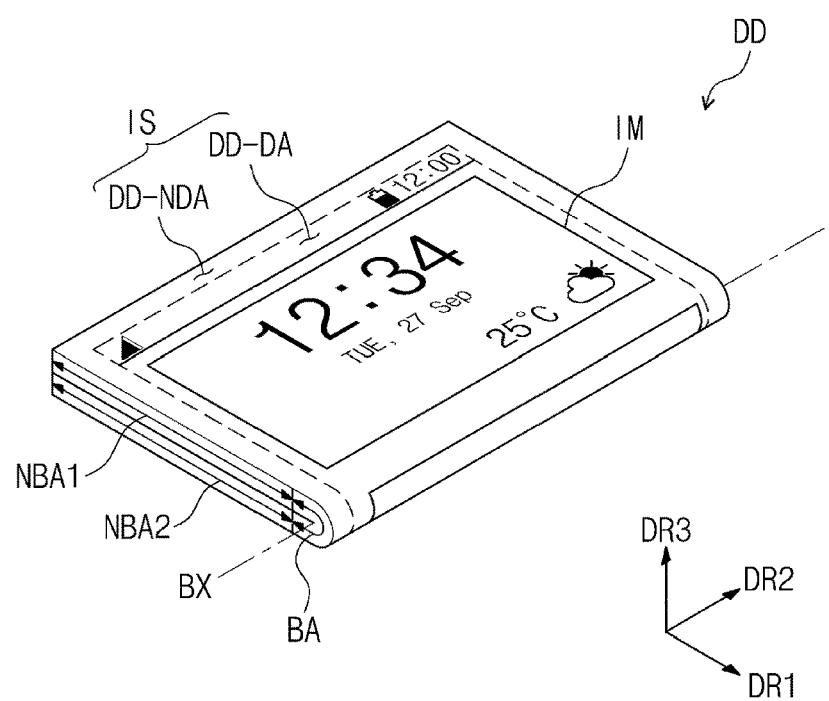
Figure 21A:
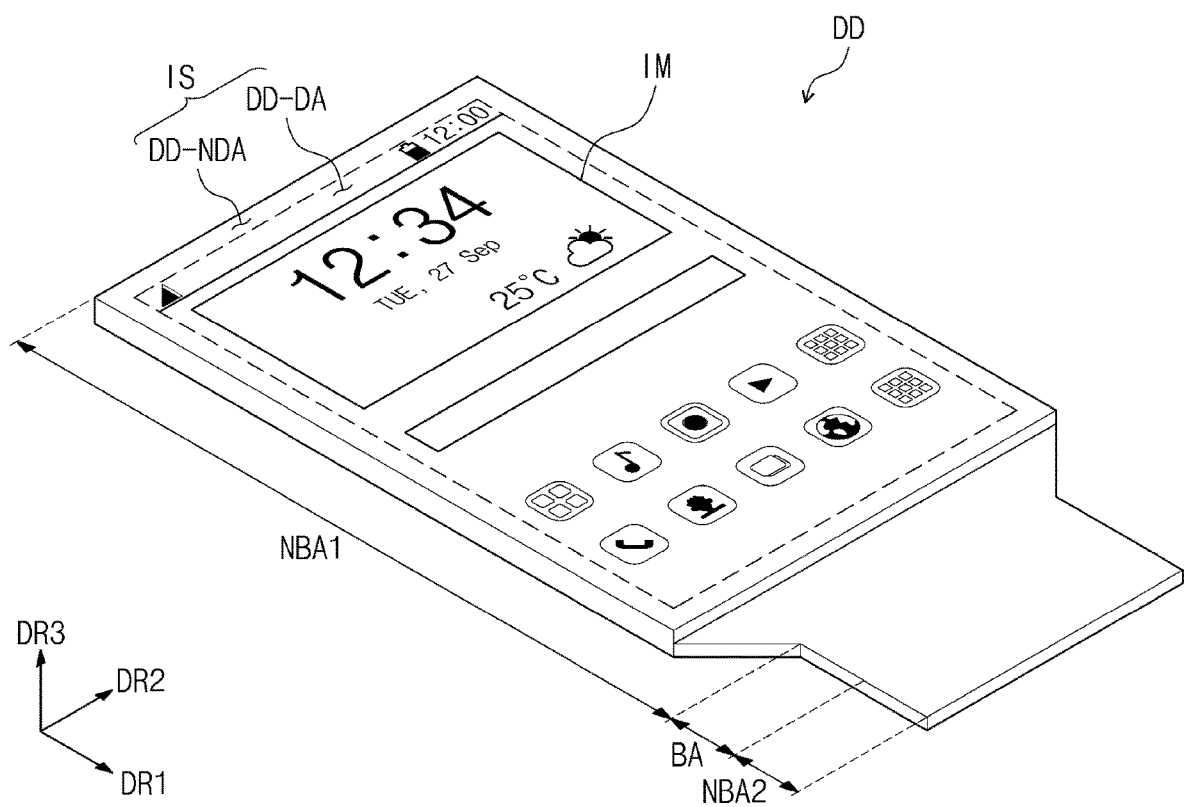
FIGS. 21A and 21B are perspective views of a display device according to an embodiment of the inventive concept.
Figure 21B:
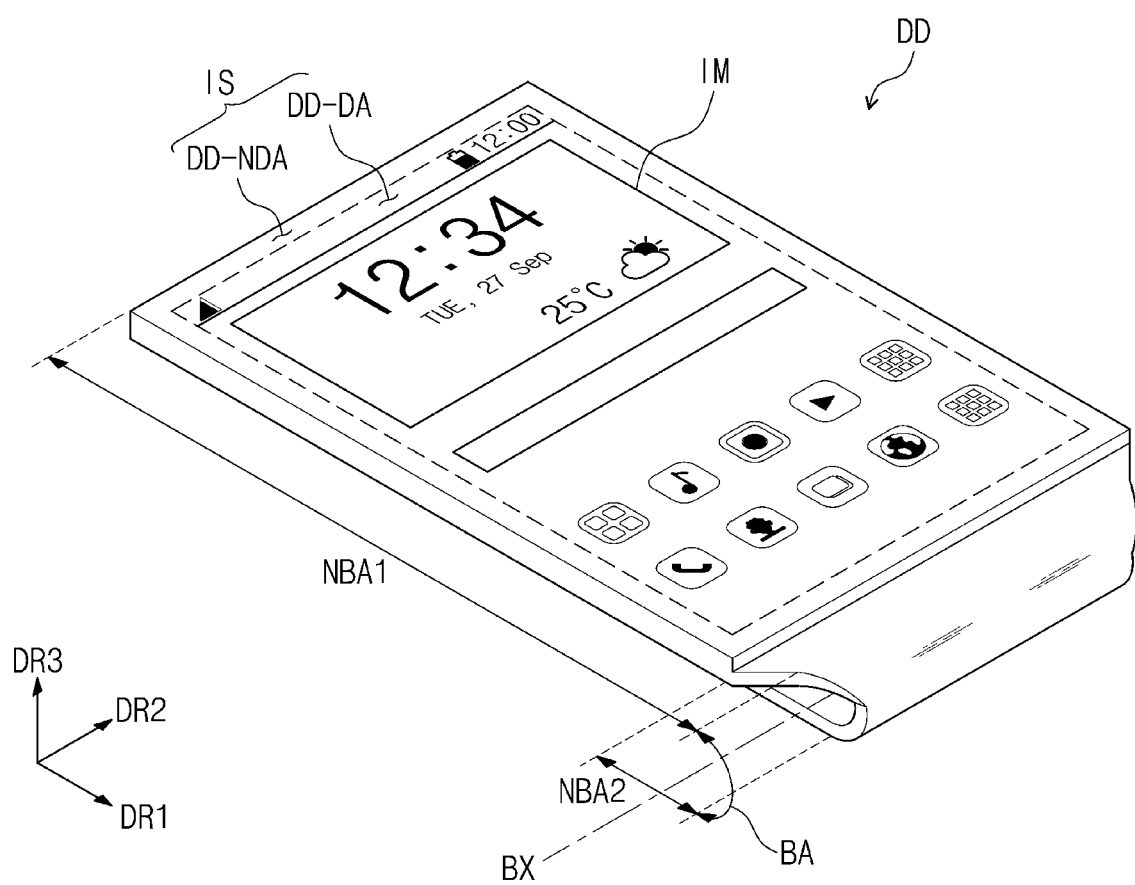
Figure 22:
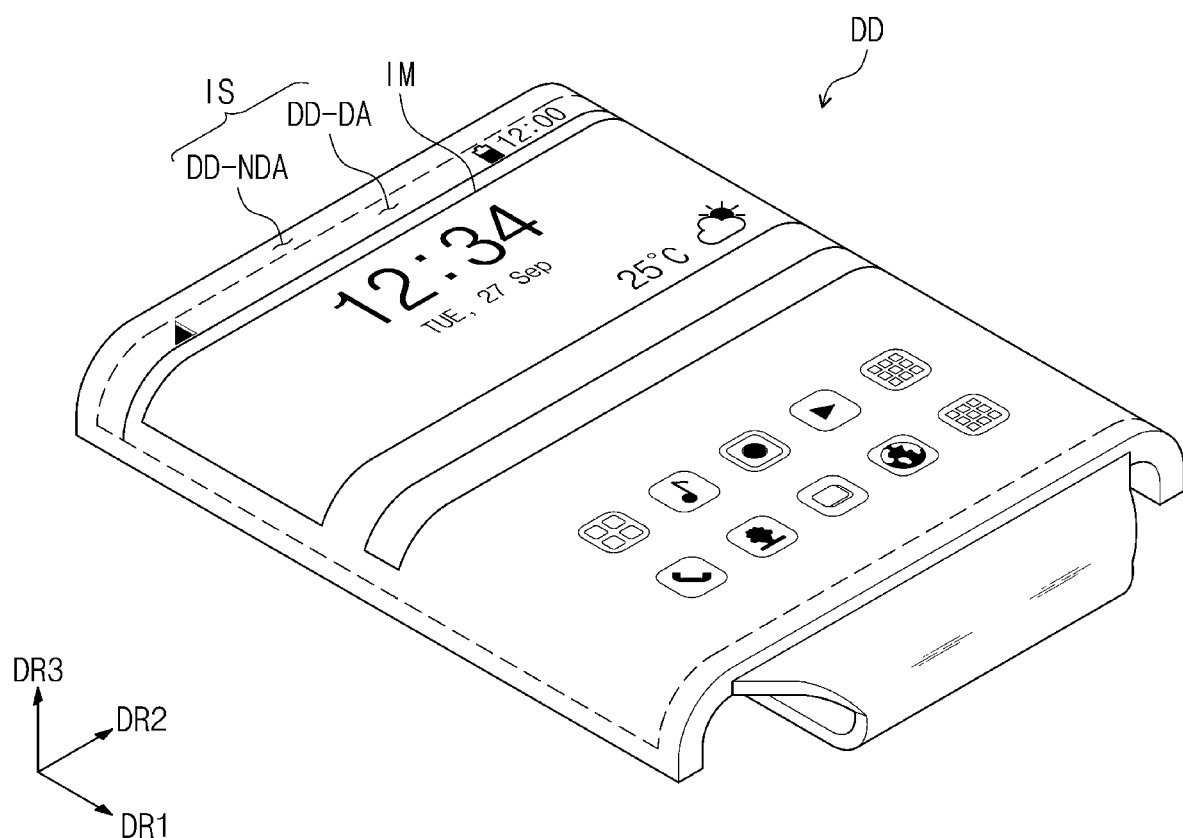
FIG. 22 is a perspective view of a display device according to an embodiment of the inventive concept.

FIGS. 20A to 20C are perspective views of a display device DD according to an embodiment of the inventive concept. FIGS. 21A and 21B are perspective views of a display device DD according to an embodiment of the inventive concept. FIG. 22 is a perspective view of a display device DD according to an embodiment of the inventive concept. Hereinafter, detailed descriptions with respect to the same constituent as that described with reference to FIGS. 1 to 19 will be omitted.

One of the input sensing units ISU described with reference to FIGS. 1 to 19 may be applied to a flexible display device DD that will be described below.

As illustrated in FIGS. 20A to 20C, the display device DD may include a plurality of areas defined according to the forms of operations. The display device DD may include a bending area BA that is bent on the basis of a bending axis BX, a first non-bending area NBA1 that is not bent, and a second non-bending area NBA2 that is not bent. As illustrated in FIG. 20B, the display device DD may be bent inward to allow the display surface IS of the first non-bending area NBA1 and the display surface IS of the second non-bending area NBA2 to face each other. As illustrated in FIG. 20C, the display device DD may be bent outward to allow the display surface IS to be exposed to the outside.

In an embodiment of the inventive concept, the display device DD may include a plurality of bending areas BA. In addition, the bending areas BA may be defined to corresponding to user's operation for manipulating the display device DD. For example, the bending areas BA may be defined in parallel to the first directional axis DR1 or defined in a diagonal direction, unlike FIGS. 20B and 20C. The bending area BA may have a variable surface area that is determined according to a curvature radius thereof. In an embodiment of the inventive concept, the display device DD may have a shape in which only an operation mode of FIGS. 20A and 20B is repeated.

As illustrated in FIGS. 21A and 21B, the display device DD includes a first non-bending area NBA1, a second non-bending area NBA2 spaced apart from the first non-bending area NBA1 in the first direction DR1, and a bending area BA defined between the first non-bending area NBA1 and the second non-bending area NBA2. A display area DD-DA may be included in the first non-bending area NBA1. Portions of a non-display area DD-NDA respectively correspond the second non-bending area NBA2 and the bending area BA, and a portion of the non-display area DD-NDA, which is adjacent to the display area DD-DA, is included in the first non-bending area NBA1.

The bending area BA may be bent so that a bending axis BX is defined along the second direction DR2 perpendicular to the first direction DR1. The second non-bending area NBA2 faces the first bending area NBA1. Each of the bending area BA and the second non-bending area NBA2 may have a width in the second direction DR2, which is less than that of the first bending area NBA1. Although not separately shown, the display device DD of FIG. 1A may also include a bending area corresponding to the bending area BA.

As illustrated in FIG. 22, the display device DD may include three bending areas. When compared to the display device DD of FIG. 21B, two edge areas of the first non-bending area NBA1, which face each other in the second direction DR2, may be bent from a central area of the first non-bending area NBA1.

As described above, since the auxiliary sensor parts are connected to the sensor parts, the variation in capacitance may increase. The variation in capacitance may be a difference in capacitance before and after the touch event occurs. Since the variation in capacitance increases, the input sensing unit may even sense the fine touch event.

The noise shield electrode including the transparent conductive oxide may shield the noises between the display panel and the electrodes of the input sensing unit. Therefore, the input sensing unit may be improved in sensitivity.

The second electrode providing the sensing signal to the input sensing circuit may be disposed far away from the display panel than the first electrode receiving the detecting signal to improve the sensitivity. This is done because the second electrode has relatively low noise interference with the display panel rather than the first electrode. The intensity of the noise affecting the second electrode may be calculated to compensate the sensing signal. Therefore, the sensitivity may be improved.

It will be apparent to those skilled in the art that various modifications and variations can be made in the inventive concept. Thus, it is intended that the present disclosure covers the modifications and variations of the inventive concept provided they come within the scope of the appended claims and their equivalents.

Hence, the real protective scope of the inventive concept shall be determined by the technical scope of the accompanying claims.

What is claimed is:
1. A display device comprising:
a display panel comprising a plurality of emission areas spaced apart from each other and a non-emission area disposed between the plurality of emission areas; and
an input sensing unit disposed on the display panel, wherein the display panel comprises:

a plurality of organic light emitting diodes overlapped with the plurality of emission areas; and a thin film encapsulation layer including at least one encapsulation inorganic film and at least one encapsulation organic film, wherein the input sensing unit comprises:

at least one insulation layer directly disposed on the thin film encapsulation layer;

a first electrode comprising first sensor parts having a metal, first connection parts connecting first sensor parts, which are adjacent to each other, of the first sensor parts, and first auxiliary sensor parts connected to the first sensor parts and overlapping the plurality of emission areas and the non-emission area; and a second electrode comprising second sensor parts having a metal, second connection parts connecting second sensor parts, which are adjacent to each other, of the second sensor parts, and second auxiliary sensor parts connected to the second sensor parts and overlapping the plurality of emission areas and the non-emission area, wherein the first electrode and the second electrode are insulated from each other, the first sensor parts and the second sensor parts have a mesh shape, the first auxiliary sensor parts and the second auxiliary sensor parts have a transparent conductive oxide, the first connection parts are disposed on the thin film encapsulation layer and disposed under the insulation layer, and the first sensor parts, the second sensor parts, and the second connection parts are disposed on the insulation layer.

2. The display device of claim 1, wherein a first sensor part of the first sensor parts and a first auxiliary sensor part of the first auxiliary sensor parts, which correspond to each other, overlap each other with the insulation layer therebetween, and the first sensor part of the first sensor parts and the first auxiliary sensor part of the first auxiliary sensor parts, which correspond to each other, are connected to each other through a first contact hole passing through the insulation layer.

3. The display device of claim 1, wherein a first sensor part of the first sensor parts and a first connection part of the first connection parts, which correspond to each other, are connected to each other through a second contact hole passing through the insulation layer.

4. The display device of claim 3, wherein the second sensor parts and the second connection parts have an integrated shape.

5. The display device of claim 1, wherein the first auxiliary sensor parts are disposed on a same layer as the first connection parts.

6. The display device of claim 5, wherein the first connection parts contact the first auxiliary sensor parts.

7. The display device of claim 6, wherein the first electrode further comprises auxiliary connection parts configured to connect first auxiliary sensor parts, which are adjacent to each other, of the first auxiliary sensor parts, and the first connection parts overlap the auxiliary connection parts.

8. The display device of claim 1, further comprising a signal line connected to the first electrode, wherein the signal line comprises at least one of a first line part connected to a first auxiliary sensor part of the first auxiliary sensor parts and a second line part connected to a first sensor part of the first sensor parts.

9. The display device of claim 8, wherein the first line part and the second line part are disposed with the insulation layer therebetween, and the first line part and the second line part are connected to each other through contact hole passing through the insulation layer.

10. The display device of claim 1, wherein the first auxiliary sensor parts and the second auxiliary sensor parts are disposed on the insulation layer.

11. The display device of claim 10, wherein the first sensor parts contact the first auxiliary sensor parts, and the second sensor parts contact the second auxiliary sensor parts.

12. The display device of claim 11, wherein the first auxiliary sensor parts contact the insulation layer and are disposed between the insulation layer and the first sensor parts.

13. The display device of claim 11, wherein the first sensor parts contact the insulation layer and are disposed between the insulation layer and the first auxiliary sensor parts.

14. The display device of claim 10, wherein the second electrode further comprises second auxiliary connection parts configured to connect second auxiliary sensor parts, which are adjacent to each other, of the second auxiliary sensor parts.

15. The display device of claim 14, wherein the second connection parts are disposed inside the second auxiliary connection parts, in a plan view.

16. A display device comprising:

a display panel comprising a plurality of emission areas spaced apart from each other and a non-emission area disposed between the plurality of emission areas; and an input sensing unit disposed on the display panel, wherein the display panel comprises:

a plurality of organic light emitting diodes overlapped with the plurality of emission areas; and a thin film encapsulation layer including at least one encapsulation inorganic film and at least one encapsulation organic film, wherein the input sensing unit comprises:

at least one insulation layer directly disposed on the thin film encapsulation layer; and an electrode comprising sensor parts having a metal, connection parts connecting sensor parts, which are adjacent to each other, of the sensor parts, and auxiliary sensor parts connected to the sensor parts and overlapping the plurality of emission areas and the non-emission area;

wherein the sensor parts have a mesh shape and mesh holes corresponding to the plurality of emission areas are defined in the sensor parts, the auxiliary sensor parts have a transparent conductive oxide, the connection parts are disposed on the thin film encapsulation layer and disposed under the insulation layer, and the sensor parts are disposed on the insulation layer.

* * * * *